United States Patent
Jo et al.

(10) Patent No.: US 9,570,683 B1
(45) Date of Patent: Feb. 14, 2017

(54) THREE-DIMENSIONAL TWO-TERMINAL MEMORY WITH ENHANCED ELECTRIC FIELD AND SEGMENTED INTERCONNECTS

(71) Applicant: Crossbar, Inc., Santa Clara, CA (US)

(72) Inventors: Sung Hyun Jo, Sunnyvale, CA (US); Kuk-Hwan Kim, San Jose, CA (US); Joanna Bettinger, Oakland, CA (US)

(73) Assignee: CROSSBAR, INC., Santa Clara, CA (US)

( * ) Notice: Subject to any disclaimer, the term of this patent is extended or adjusted under 35 U.S.C. 154(b) by 0 days.

(21) Appl. No.: 15/046,172

(22) Filed: Feb. 17, 2016

Related U.S. Application Data

(63) Continuation of application No. 14/588,202, filed on Dec. 31, 2014, and a continuation-in-part of application No. 14/194,499, filed on Feb. 28, 2014, said application No. 14/588,202 is a continuation-in-part of application No. 14/027,045, filed on Sep. 13, 2013, now Pat. No. 9,166,163, and a (Continued)

(51) Int. Cl.
*G11C 13/00* (2006.01)
*H01L 45/00* (2006.01)

(52) U.S. Cl.
CPC ....... *H01L 45/1608* (2013.01); *G11C 13/0002* (2013.01); *G11C 13/0004* (2013.01); *G11C 13/0007* (2013.01)

(58) Field of Classification Search
CPC ............. G11C 13/0002; G11C 13/0004; G11C 13/0007; G11C 11/063; H01L 45/1608
USPC .................................. 365/148, 158, 163, 130
See application file for complete search history.

(56) References Cited

U.S. PATENT DOCUMENTS

| | | |
|---|---|---|
| 680,652 A | 8/1901 | Leonard |
| 4,433,468 A | 2/1984 | Kawamata |

(Continued)

FOREIGN PATENT DOCUMENTS

| | | |
|---|---|---|
| CN | 101131872 A | 2/2008 |
| CN | 101170132 A | 4/2008 |

(Continued)

OTHER PUBLICATIONS

Notice of Allowance dated Dec. 19, 2014 for U.S. Appl. No. 13/529,985, 9 pgs.

(Continued)

*Primary Examiner* — Tan T. Nguyen
(74) *Attorney, Agent, or Firm* — Amin, Turocy & Watson, LLP

(57) ABSTRACT

Providing for three-dimensional memory cells having enhanced electric field characteristics and/or memory cells located at broken interconnects is described herein. By way of example, a two-terminal memory cell can be constructed from a layered stack of materials, where respective layers are arranged along a direction that forms a non-zero angle to a normal direction of a substrate surface upon which the layered stack of materials is constructed. In some aspects, the direction can be orthogonal to or substantially orthogonal to the normal direction. In other aspects, the direction can be less than orthogonal to the normal direction. Where an internal angle of the memory cell forms a non-orthogonal angle, an enhanced electric field or current density can result, providing improved switching times and memory performance.

20 Claims, 18 Drawing Sheets

Related U.S. Application Data continuation-in-part of application No. 13/525,096, filed on Jun. 15, 2012, now Pat. No. 9,058,865, said application No. 14/027,045 is a continuation-in-part of application No. 13/586,815, filed on Aug. 15, 2012, now Pat. No. 8,946,669, said application No. 14/027,045 is a continuation-in-part of application No. 13/585,759, filed on Aug. 14, 2012, now Pat. No. 8,569,172, and a continuation-in-part of application No. 13/912,136, filed on Jun. 6, 2013, now Pat. No. 9,209,396.

(60) Provisional application No. 61/937,417, filed on Feb. 7, 2014, provisional application No. 61/859,090, filed on Jul. 26, 2013, provisional application No. 61/786,100, filed on Mar. 14, 2013, provisional application No. 61/712,171, filed on Oct. 10, 2012, provisional application No. 61/503,477, filed on Jun. 30, 2011, provisional application No. 61/620,561, filed on Apr. 5, 2012, provisional application No. 61/786,058, filed on May 8, 2013.

(56) References Cited

U.S. PATENT DOCUMENTS

| | | |
|---|---|---|
| 4,684,972 A | 8/1987 | Owen et al. |
| 4,741,601 A | 5/1988 | Saito |
| 4,994,866 A | 2/1991 | Awano |
| 5,139,911 A | 8/1992 | Yagi et al. |
| 5,242,855 A | 9/1993 | Oguro |
| 5,278,085 A | 1/1994 | Maddox, III et al. |
| 5,315,131 A | 5/1994 | Kishimoto et al. |
| 5,335,219 A | 8/1994 | Ovshinsky et al. |
| 5,360,981 A | 11/1994 | Owen et al. |
| 5,457,649 A | 10/1995 | Eichman et al. |
| 5,499,208 A | 3/1996 | Shoji |
| 5,538,564 A | 7/1996 | Kaschmitter |
| 5,541,869 A | 7/1996 | Rose et al. |
| 5,594,363 A | 1/1997 | Freeman et al. |
| 5,596,214 A | 1/1997 | Endo |
| 5,614,756 A | 3/1997 | Forouhi et al. |
| 5,627,451 A | 5/1997 | Takeda |
| 5,645,628 A | 7/1997 | Endo et al. |
| 5,673,223 A | 9/1997 | Park |
| 5,707,487 A | 1/1998 | Hori et al. |
| 5,714,416 A | 2/1998 | Eichman et al. |
| 5,751,012 A | 5/1998 | Wolstenholme et al. |
| 5,763,898 A | 6/1998 | Forouhi et al. |
| 5,840,608 A | 11/1998 | Chang |
| 5,923,587 A | 7/1999 | Choi |
| 5,970,332 A | 10/1999 | Pruijmboom et al. |
| 5,973,335 A | 10/1999 | Shannon |
| 5,998,244 A | 12/1999 | Wolstenholme et al. |
| 6,002,268 A | 12/1999 | Sasaki et al. |
| 6,037,204 A | 3/2000 | Chang et al. |
| 6,122,318 A | 9/2000 | Yamaguchi et al. |
| 6,128,214 A | 10/2000 | Kuekes et al. |
| 6,143,642 A | 11/2000 | Sur, Jr. et al. |
| 6,180,998 B1 | 1/2001 | Crafts |
| 6,181,587 B1 | 1/2001 | Kuramoto et al. |
| 6,181,597 B1 | 1/2001 | Nachumovsky |
| 6,259,116 B1 | 7/2001 | Shannon |
| 6,288,435 B1 | 9/2001 | Mei et al. |
| 6,291,836 B1 | 9/2001 | Kramer et al. |
| 6,436,765 B1 | 8/2002 | Liou et al. |
| 6,436,818 B1 | 8/2002 | Hu et al. |
| 6,492,694 B2 | 12/2002 | Noble et al. |
| 6,552,932 B1 | 4/2003 | Cernea |
| 6,627,530 B2 | 9/2003 | Li et al. |
| 6,724,186 B2 | 4/2004 | Jordil |
| 6,731,535 B1 | 5/2004 | Ooishi et al. |
| 6,740,921 B2 | 5/2004 | Matsuoka et al. |
| 6,762,474 B1 | 7/2004 | Mills, Jr. |
| 6,768,157 B2 | 7/2004 | Krieger et al. |
| 6,815,286 B2 | 11/2004 | Krieger et al. |
| 6,816,405 B1 | 11/2004 | Lu et al. |
| 6,821,879 B2 | 11/2004 | Wong |
| 6,838,720 B2 | 1/2005 | Krieger et al. |
| 6,848,012 B2 | 1/2005 | LeBlanc et al. |
| 6,849,891 B1 | 2/2005 | Hsu et al. |
| 6,858,481 B2 | 2/2005 | Krieger et al. |
| 6,858,482 B2 | 2/2005 | Gilton |
| 6,864,127 B2 | 3/2005 | Yamazaki et al. |
| 6,864,522 B2 | 3/2005 | Krieger et al. |
| 6,867,618 B2 | 3/2005 | Li et al. |
| 6,881,994 B2 | 4/2005 | Lee et al. |
| 6,897,519 B1 | 5/2005 | Dosluoglu |
| 6,927,430 B2 | 8/2005 | Hsu |
| 6,939,787 B2 | 9/2005 | Ohtake et al. |
| 6,946,719 B2 | 9/2005 | Petti et al. |
| 7,020,006 B2 | 3/2006 | Chevallier et al. |
| 7,023,093 B2 | 4/2006 | Canaperi et al. |
| 7,026,702 B2 | 4/2006 | Krieger et al. |
| 7,087,454 B2 | 8/2006 | Campbell et al. |
| 7,102,150 B2 | 9/2006 | Harshfield et al. |
| 7,122,853 B1 | 10/2006 | Gaun et al. |
| 7,167,387 B2 | 1/2007 | Sugita et al. |
| 7,187,577 B1 | 3/2007 | Wang et al. |
| 7,221,599 B1 | 5/2007 | Gaun et al. |
| 7,238,607 B2 | 7/2007 | Dunton et al. |
| 7,238,994 B2 * | 7/2007 | Chen ............ H01L 45/06 257/379 |
| 7,251,152 B2 | 7/2007 | Roehr |
| 7,254,053 B2 | 8/2007 | Krieger et al. |
| 7,274,587 B2 | 9/2007 | Yasuda |
| 7,289,353 B2 | 10/2007 | Spitzer et al. |
| 7,324,363 B2 | 1/2008 | Kerns et al. |
| 7,345,907 B2 | 3/2008 | Scheuerlein |
| 7,365,411 B2 | 4/2008 | Campbell |
| 7,405,418 B2 | 7/2008 | Happ et al. |
| 7,426,128 B2 | 9/2008 | Scheuerlein |
| 7,433,253 B2 | 10/2008 | Gogl et al. |
| 7,474,000 B2 | 1/2009 | Scheuerlein et al. |
| 7,479,650 B2 | 1/2009 | Gilton |
| 7,499,355 B2 | 3/2009 | Scheuerlein et al. |
| 7,515,454 B2 | 4/2009 | Symanczyk |
| 7,521,705 B2 | 4/2009 | Liu |
| 7,534,625 B2 | 5/2009 | Karpov et al. |
| 7,541,252 B2 | 6/2009 | Eun et al. |
| 7,550,380 B2 | 6/2009 | Elkins et al. |
| 7,561,461 B2 | 7/2009 | Nagai et al. |
| 7,566,643 B2 | 7/2009 | Czubatyi et al. |
| 7,606,059 B2 | 10/2009 | Toda |
| 7,615,439 B1 | 11/2009 | Schricker et al. |
| 7,629,198 B2 | 12/2009 | Kumar et al. |
| 7,667,442 B2 | 2/2010 | Itoh |
| 7,692,959 B2 | 4/2010 | Krusin-Elbaum et al. |
| 7,704,788 B2 | 4/2010 | Youn et al. |
| 7,719,001 B2 | 5/2010 | Nomura et al. |
| 7,728,318 B2 | 6/2010 | Raghuram et al. |
| 7,729,158 B2 | 6/2010 | Toda et al. |
| 7,746,601 B2 * | 6/2010 | Sugiyama ............ G11C 11/161 360/322 |
| 7,746,696 B1 | 6/2010 | Paak |
| 7,749,805 B2 | 7/2010 | Pinnow et al. |
| 7,764,536 B2 | 7/2010 | Luo et al. |
| 7,772,581 B2 | 8/2010 | Lung |
| 7,776,682 B1 | 8/2010 | Nickel et al. |
| 7,778,063 B2 | 8/2010 | Brubaker et al. |
| 7,786,464 B2 | 8/2010 | Nirschl et al. |
| 7,786,589 B2 | 8/2010 | Matsunaga et al. |
| 7,791,060 B2 | 9/2010 | Aochi et al. |
| 7,824,956 B2 | 11/2010 | Schricker et al. |
| 7,829,875 B2 | 11/2010 | Scheuerlein |
| 7,830,698 B2 | 11/2010 | Chen et al. |
| 7,835,170 B2 | 11/2010 | Bertin et al. |
| 7,858,468 B2 | 12/2010 | Liu et al. |
| 7,859,884 B2 | 12/2010 | Scheuerlein |
| 7,869,253 B2 | 1/2011 | Liaw et al. |
| 7,875,871 B2 | 1/2011 | Kumar et al. |
| 7,881,097 B2 | 2/2011 | Hosomi et al. |
| 7,883,964 B2 | 2/2011 | Goda et al. |

(56) References Cited

U.S. PATENT DOCUMENTS

| | | |
|---|---|---|
| 7,897,953 B2 | 3/2011 | Liu |
| 7,898,838 B2 | 3/2011 | Chen et al. |
| 7,920,412 B2 | 4/2011 | Hosotani et al. |
| 7,924,138 B2 | 4/2011 | Kinoshita et al. |
| 7,927,472 B2 | 4/2011 | Takahashi et al. |
| 7,968,419 B2 | 6/2011 | Li et al. |
| 7,972,897 B2 | 7/2011 | Kumar et al. |
| 7,984,776 B2 | 7/2011 | Sastry et al. |
| 8,004,882 B2 | 8/2011 | Katti et al. |
| 8,018,760 B2 | 9/2011 | Muraoka et al. |
| 8,021,897 B2 | 9/2011 | Sills et al. |
| 8,045,364 B2 | 10/2011 | Schloss et al. |
| 8,054,674 B2 | 11/2011 | Tamai et al. |
| 8,054,679 B2 | 11/2011 | Nakai et al. |
| 8,067,815 B2 | 11/2011 | Chien et al. |
| 8,071,972 B2 | 12/2011 | Lu et al. |
| 8,084,830 B2 | 12/2011 | Kanno et al. |
| 8,088,688 B1 | 1/2012 | Herner |
| 8,097,874 B2 | 1/2012 | Venkatasamy et al. |
| 8,102,018 B2 | 1/2012 | Bertin et al. |
| 8,102,698 B2 | 1/2012 | Scheuerlein |
| 8,143,092 B2 | 3/2012 | Kumar et al. |
| 8,144,498 B2 | 3/2012 | Kumar et al. |
| 8,164,948 B2 | 4/2012 | Katti et al. |
| 8,168,506 B2 | 5/2012 | Herner |
| 8,183,553 B2 | 5/2012 | Phatak et al. |
| 8,187,945 B2 | 5/2012 | Herner |
| 8,198,144 B2 | 6/2012 | Herner |
| 8,207,064 B2 | 6/2012 | Bandyopadhyay et al. |
| 8,227,787 B2 | 7/2012 | Kumar et al. |
| 8,231,998 B2 | 7/2012 | Sastry et al. |
| 8,233,308 B2 | 7/2012 | Schricker et al. |
| 8,237,146 B2 | 8/2012 | Kreupl et al. |
| 8,243,542 B2 | 8/2012 | Bae et al. |
| 8,258,020 B2 | 9/2012 | Herner |
| 8,265,136 B2 | 9/2012 | Hong et al. |
| 8,274,130 B2 | 9/2012 | Mihnea et al. |
| 8,274,812 B2 | 9/2012 | Nazarian et al. |
| 8,305,793 B2 | 11/2012 | Majewski et al. |
| 8,315,079 B2 | 11/2012 | Kuo et al. |
| 8,320,160 B2 | 11/2012 | Nazarian |
| 8,351,241 B2 | 1/2013 | Lu et al. |
| 8,369,129 B2 | 2/2013 | Fujita et al. |
| 8,369,139 B2 | 2/2013 | Liu et al. |
| 8,374,018 B2 | 2/2013 | Lu |
| 8,385,100 B2 | 2/2013 | Kau et al. |
| 8,389,971 B2 | 3/2013 | Chen et al. |
| 8,394,670 B2 | 3/2013 | Herner |
| 8,399,307 B2 | 3/2013 | Herner |
| 8,441,835 B2 | 5/2013 | Jo et al. |
| 8,456,892 B2 | 6/2013 | Yasuda |
| 8,466,005 B2 | 6/2013 | Pramanik et al. |
| 8,467,226 B2 | 6/2013 | Bedeschi et al. |
| 8,467,227 B1 | 6/2013 | Jo |
| 8,502,185 B2 | 8/2013 | Lu et al. |
| 8,569,104 B2 | 10/2013 | Pham et al. |
| 8,587,989 B2 | 11/2013 | Manning et al. |
| 8,619,459 B1 | 12/2013 | Nguyen et al. |
| 8,658,476 B1 | 2/2014 | Sun et al. |
| 8,659,003 B2 | 2/2014 | Herner et al. |
| 8,675,384 B2 | 3/2014 | Kuo et al. |
| 8,693,241 B2 | 4/2014 | Kim et al. |
| 8,853,759 B2 | 10/2014 | Lee et al. |
| 8,854,859 B2 | 10/2014 | Chung |
| 8,934,294 B2 | 1/2015 | Kim et al. |
| 8,946,667 B1 | 2/2015 | Clark et al. |
| 8,946,673 B1 | 2/2015 | Kumar |
| 8,947,908 B2 | 2/2015 | Jo |
| 8,999,811 B2 | 4/2015 | Endo et al. |
| 9,093,635 B2 | 7/2015 | Kim et al. |
| 9,166,163 B2 | 10/2015 | Gee et al. |
| 2002/0048940 A1 | 4/2002 | Derderian et al. |
| 2003/0006440 A1 | 1/2003 | Uchiyama |
| 2003/0036238 A1 | 2/2003 | Toet et al. |
| 2003/0052330 A1 | 3/2003 | Klein |
| 2003/0141565 A1 | 7/2003 | Hirose et al. |
| 2003/0174574 A1 | 9/2003 | Perner et al. |
| 2003/0194865 A1 | 10/2003 | Gilton |
| 2003/0206659 A1 | 11/2003 | Hamanaka |
| 2004/0026682 A1 | 2/2004 | Jiang |
| 2004/0036124 A1 | 2/2004 | Vyvoda et al. |
| 2004/0159835 A1 | 8/2004 | Krieger et al. |
| 2004/0170040 A1 | 9/2004 | Rinerson et al. |
| 2004/0192006 A1 | 9/2004 | Campbell et al. |
| 2004/0194340 A1 | 10/2004 | Kobayashi |
| 2004/0202041 A1 | 10/2004 | Hidenori |
| 2005/0019699 A1 | 1/2005 | Moore |
| 2005/0020510 A1 | 1/2005 | Benedict |
| 2005/0029587 A1 | 2/2005 | Harshfield |
| 2005/0041498 A1 | 2/2005 | Resta et al. |
| 2005/0052915 A1 | 3/2005 | Herner et al. |
| 2005/0062045 A1 | 3/2005 | Bhattacharyya |
| 2005/0073881 A1 | 4/2005 | Tran et al. |
| 2005/0101081 A1 | 5/2005 | Goda et al. |
| 2005/0175099 A1 | 8/2005 | Sarkijarvi et al. |
| 2006/0017488 A1 | 1/2006 | Hsu |
| 2006/0028895 A1 | 2/2006 | Taussig et al. |
| 2006/0054950 A1 | 3/2006 | Baek et al. |
| 2006/0134837 A1 | 6/2006 | Subramanian et al. |
| 2006/0154417 A1 | 7/2006 | Shinmura et al. |
| 2006/0215445 A1 | 9/2006 | Baek et al. |
| 2006/0231910 A1 | 10/2006 | Hsieh et al. |
| 2006/0246606 A1 | 11/2006 | Hsu et al. |
| 2006/0268594 A1 | 11/2006 | Toda |
| 2006/0279979 A1 | 12/2006 | Lowrey et al. |
| 2006/0281244 A1 | 12/2006 | Ichige et al. |
| 2006/0286762 A1 | 12/2006 | Tseng et al. |
| 2007/0008773 A1 | 1/2007 | Scheuerlein |
| 2007/0015348 A1 | 1/2007 | Hsu et al. |
| 2007/0025144 A1 | 2/2007 | Hsu et al. |
| 2007/0035990 A1 | 2/2007 | Hush |
| 2007/0042612 A1 | 2/2007 | Nishino et al. |
| 2007/0045615 A1 | 3/2007 | Cho et al. |
| 2007/0069119 A1 | 3/2007 | Appleyard et al. |
| 2007/0087508 A1 | 4/2007 | Herner et al. |
| 2007/0090425 A1 | 4/2007 | Kumar et al. |
| 2007/0091685 A1 | 4/2007 | Guterman et al. |
| 2007/0105284 A1 | 5/2007 | Herner et al. |
| 2007/0105390 A1 | 5/2007 | Oh |
| 2007/0133250 A1 | 6/2007 | Kim |
| 2007/0133270 A1 | 6/2007 | Jeong et al. |
| 2007/0159869 A1 | 7/2007 | Baek et al. |
| 2007/0159876 A1 | 7/2007 | Sugibayashi et al. |
| 2007/0171698 A1 | 7/2007 | Hoenigschmid et al. |
| 2007/0205510 A1 | 9/2007 | Lavoie et al. |
| 2007/0228414 A1 | 10/2007 | Kumar et al. |
| 2007/0284575 A1 | 12/2007 | Li et al. |
| 2007/0290186 A1 | 12/2007 | Bourim et al. |
| 2007/0291527 A1 | 12/2007 | Tsushima et al. |
| 2007/0295950 A1 | 12/2007 | Cho et al. |
| 2007/0297501 A1 | 12/2007 | Hussain et al. |
| 2008/0002481 A1 | 1/2008 | Gogl et al. |
| 2008/0006907 A1 | 1/2008 | Lee et al. |
| 2008/0007987 A1 | 1/2008 | Takashima |
| 2008/0019163 A1 | 1/2008 | Hoenigschmid et al. |
| 2008/0043521 A1 | 2/2008 | Liaw et al. |
| 2008/0048164 A1 | 2/2008 | Odagawa |
| 2008/0083918 A1 | 4/2008 | Aratani et al. |
| 2008/0089110 A1 | 4/2008 | Robinett et al. |
| 2008/0090337 A1 | 4/2008 | Williams |
| 2008/0106925 A1 | 5/2008 | Paz de Araujo et al. |
| 2008/0106926 A1 | 5/2008 | Brubaker et al. |
| 2008/0165571 A1 | 7/2008 | Lung |
| 2008/0185567 A1 | 8/2008 | Kumar et al. |
| 2008/0192531 A1 | 8/2008 | Tamura et al. |
| 2008/0198934 A1 | 8/2008 | Hong et al. |
| 2008/0205179 A1 | 8/2008 | Markert et al. |
| 2008/0206931 A1 | 8/2008 | Breuil et al. |
| 2008/0220601 A1 | 9/2008 | Kumar et al. |
| 2008/0232160 A1 | 9/2008 | Gopalakrishnan |
| 2008/0278988 A1 | 11/2008 | Ufert |
| 2008/0278990 A1 | 11/2008 | Kumar et al. |
| 2008/0301497 A1 | 12/2008 | Chung et al. |
| 2008/0304312 A1 | 12/2008 | Ho et al. |

(56) References Cited

U.S. PATENT DOCUMENTS

| | | |
|---|---|---|
| 2008/0311722 A1 | 12/2008 | Petti et al. |
| 2009/0001343 A1 | 1/2009 | Schricker et al. |
| 2009/0001345 A1 | 1/2009 | Schricker et al. |
| 2009/0003717 A1 | 1/2009 | Sekiguchi et al. |
| 2009/0014703 A1 | 1/2009 | Inaba |
| 2009/0014707 A1 | 1/2009 | Lu et al. |
| 2009/0052226 A1 | 2/2009 | Lee et al. |
| 2009/0091981 A1 | 4/2009 | Park et al. |
| 2009/0095951 A1 | 4/2009 | Kostylev et al. |
| 2009/0109728 A1 | 4/2009 | Maejima et al. |
| 2009/0122591 A1 | 5/2009 | Ryu |
| 2009/0134432 A1 | 5/2009 | Tabata et al. |
| 2009/0141567 A1 | 6/2009 | Lee et al. |
| 2009/0152737 A1 | 6/2009 | Harshfield |
| 2009/0168486 A1 | 7/2009 | Kumar |
| 2009/0227067 A1 | 9/2009 | Kumar et al. |
| 2009/0231905 A1 | 9/2009 | Sato |
| 2009/0231910 A1 | 9/2009 | Liu et al. |
| 2009/0250787 A1 | 10/2009 | Kutsunai |
| 2009/0251941 A1 | 10/2009 | Saito |
| 2009/0256130 A1 | 10/2009 | Schricker |
| 2009/0257265 A1 | 10/2009 | Chen et al. |
| 2009/0267047 A1 | 10/2009 | Sasago et al. |
| 2009/0268513 A1 | 10/2009 | De Ambroggi et al. |
| 2009/0272962 A1 | 11/2009 | Kumar et al. |
| 2009/0283737 A1 | 11/2009 | Kiyotoshi |
| 2009/0298224 A1 | 12/2009 | Lowrey |
| 2009/0309087 A1 | 12/2009 | Lung |
| 2009/0321706 A1 | 12/2009 | Happ et al. |
| 2009/0321789 A1 | 12/2009 | Wang et al. |
| 2010/0007937 A1 | 1/2010 | Widjaja et al. |
| 2010/0012914 A1 | 1/2010 | Xu et al. |
| 2010/0019221 A1 | 1/2010 | Lung et al. |
| 2010/0019310 A1 | 1/2010 | Sakamoto |
| 2010/0025675 A1 | 2/2010 | Yamazaki et al. |
| 2010/0032637 A1 | 2/2010 | Kinoshita et al. |
| 2010/0032638 A1 | 2/2010 | Xu |
| 2010/0032640 A1 | 2/2010 | Xu |
| 2010/0034518 A1 | 2/2010 | Iwamoto et al. |
| 2010/0038791 A1 | 2/2010 | Lee et al. |
| 2010/0039136 A1 | 2/2010 | Chua-Eoan et al. |
| 2010/0044708 A1 | 2/2010 | Lin et al. |
| 2010/0044798 A1 | 2/2010 | Hooker et al. |
| 2010/0046622 A1 | 2/2010 | Doser et al. |
| 2010/0067279 A1 | 3/2010 | Choi |
| 2010/0067282 A1 | 3/2010 | Liu et al. |
| 2010/0084625 A1 | 4/2010 | Wicker et al. |
| 2010/0085798 A1 | 4/2010 | Lu et al. |
| 2010/0085822 A1 | 4/2010 | Yan et al. |
| 2010/0090192 A1 | 4/2010 | Goux et al. |
| 2010/0101290 A1 | 4/2010 | Bertolotto |
| 2010/0102290 A1 | 4/2010 | Lu et al. |
| 2010/0110767 A1 | 5/2010 | Katoh et al. |
| 2010/0118587 A1 | 5/2010 | Chen et al. |
| 2010/0140614 A1 | 6/2010 | Uchiyama et al. |
| 2010/0157651 A1 | 6/2010 | Kumar et al. |
| 2010/0157656 A1 | 6/2010 | Tsuchida |
| 2010/0157659 A1 | 6/2010 | Norman |
| 2010/0157710 A1 | 6/2010 | Lambertson et al. |
| 2010/0163828 A1 | 7/2010 | Tu |
| 2010/0171086 A1 | 7/2010 | Lung et al. |
| 2010/0176367 A1 | 7/2010 | Liu |
| 2010/0176368 A1 | 7/2010 | Ko et al. |
| 2010/0182821 A1 | 7/2010 | Muraoka et al. |
| 2010/0203731 A1 | 8/2010 | Kong et al. |
| 2010/0219510 A1 | 9/2010 | Scheuerlein et al. |
| 2010/0221868 A1 | 9/2010 | Sandoval |
| 2010/0237314 A1 | 9/2010 | Tsukamoto et al. |
| 2010/0243983 A1 | 9/2010 | Chiang et al. |
| 2010/0258781 A1 | 10/2010 | Phatak et al. |
| 2010/0271885 A1 | 10/2010 | Scheuerlein et al. |
| 2010/0277969 A1 | 11/2010 | Li et al. |
| 2010/0321095 A1 | 12/2010 | Mikawa et al. |
| 2011/0006275 A1 | 1/2011 | Roelofs et al. |
| 2011/0007551 A1 | 1/2011 | Tian et al. |
| 2011/0033967 A1 | 2/2011 | Lutz et al. |
| 2011/0063888 A1 | 3/2011 | Chi et al. |
| 2011/0066878 A1 | 3/2011 | Hosono et al. |
| 2011/0068373 A1 | 3/2011 | Minemura et al. |
| 2011/0069533 A1 | 3/2011 | Kurosawa et al. |
| 2011/0089391 A1 | 4/2011 | Mihnea et al. |
| 2011/0122679 A1 | 5/2011 | Chen et al. |
| 2011/0128779 A1 | 6/2011 | Redaelli et al. |
| 2011/0133149 A1 | 6/2011 | Sonehara |
| 2011/0136327 A1 | 6/2011 | Han et al. |
| 2011/0151277 A1 | 6/2011 | Nishihara et al. |
| 2011/0155991 A1 | 6/2011 | Chen |
| 2011/0183525 A1 | 7/2011 | Purushothaman et al. |
| 2011/0193051 A1 | 8/2011 | Nam et al. |
| 2011/0194329 A1 | 8/2011 | Ohba et al. |
| 2011/0198557 A1 | 8/2011 | Rajendran et al. |
| 2011/0204312 A1 | 8/2011 | Phatak |
| 2011/0204314 A1 | 8/2011 | Baek et al. |
| 2011/0205780 A1 | 8/2011 | Yasuda et al. |
| 2011/0205782 A1 | 8/2011 | Costa et al. |
| 2011/0212616 A1 | 9/2011 | Seidel et al. |
| 2011/0227028 A1 | 9/2011 | Sekar et al. |
| 2011/0284814 A1 | 11/2011 | Zhang |
| 2011/0299324 A1 | 12/2011 | Li et al. |
| 2011/0305064 A1 | 12/2011 | Jo et al. |
| 2011/0310656 A1 | 12/2011 | Kreupl et al. |
| 2011/0312151 A1 | 12/2011 | Herner |
| 2011/0317470 A1 | 12/2011 | Lu et al. |
| 2012/0001145 A1 | 1/2012 | Magistretti et al. |
| 2012/0001146 A1 | 1/2012 | Lu et al. |
| 2012/0007035 A1 | 1/2012 | Jo et al. |
| 2012/0008366 A1 | 1/2012 | Lu |
| 2012/0012806 A1 | 1/2012 | Herner |
| 2012/0012808 A1 | 1/2012 | Herner |
| 2012/0015506 A1 | 1/2012 | Jo et al. |
| 2012/0025161 A1 | 2/2012 | Rathor et al. |
| 2012/0033479 A1 | 2/2012 | DeLucca et al. |
| 2012/0043519 A1 | 2/2012 | Jo et al. |
| 2012/0043520 A1 | 2/2012 | Herner et al. |
| 2012/0043621 A1 | 2/2012 | Herner |
| 2012/0043654 A1 | 2/2012 | Lu et al. |
| 2012/0044751 A1 | 2/2012 | Wang et al. |
| 2012/0074374 A1 | 3/2012 | Jo |
| 2012/0074507 A1 | 3/2012 | Jo et al. |
| 2012/0076203 A1 | 3/2012 | Sugimoto et al. |
| 2012/0080798 A1 | 4/2012 | Harshfield |
| 2012/0087169 A1 | 4/2012 | Kuo et al. |
| 2012/0087172 A1 | 4/2012 | Aoki |
| 2012/0091420 A1 | 4/2012 | Kusai et al. |
| 2012/0104351 A1 | 5/2012 | Wei et al. |
| 2012/0108030 A1 | 5/2012 | Herner |
| 2012/0120712 A1 | 5/2012 | Kawai et al. |
| 2012/0122290 A1 | 5/2012 | Nagashima |
| 2012/0140816 A1 | 6/2012 | Franche et al. |
| 2012/0142163 A1 | 6/2012 | Herner |
| 2012/0145984 A1 | 6/2012 | Rabkin et al. |
| 2012/0147657 A1 | 6/2012 | Sekar et al. |
| 2012/0155146 A1 | 6/2012 | Ueda et al. |
| 2012/0176831 A1 | 7/2012 | Xiao et al. |
| 2012/0205606 A1 | 8/2012 | Lee et al. |
| 2012/0205793 A1 | 8/2012 | Schieffer et al. |
| 2012/0218807 A1 | 8/2012 | Johnson |
| 2012/0220100 A1 | 8/2012 | Herner |
| 2012/0224413 A1 | 9/2012 | Zhang et al. |
| 2012/0235112 A1 | 9/2012 | Huo et al. |
| 2012/0236625 A1 | 9/2012 | Ohba et al. |
| 2012/0241710 A1 | 9/2012 | Liu et al. |
| 2012/0243292 A1 | 9/2012 | Takashima et al. |
| 2012/0250183 A1 | 10/2012 | Tamaoka et al. |
| 2012/0252183 A1 | 10/2012 | Herner |
| 2012/0269275 A1 | 10/2012 | Hannuksela |
| 2012/0305874 A1 | 12/2012 | Herner |
| 2012/0305879 A1 | 12/2012 | Lu et al. |
| 2012/0320660 A1 | 12/2012 | Nazarian et al. |
| 2012/0326265 A1 | 12/2012 | Lai et al. |
| 2012/0327701 A1 | 12/2012 | Nazarian |
| 2013/0020548 A1 | 1/2013 | Clark et al. |
| 2013/0023085 A1 | 1/2013 | Pramanik et al. |
| 2013/0026440 A1 | 1/2013 | Yang et al. |

(56) References Cited

U.S. PATENT DOCUMENTS

| | | |
|---|---|---|
| 2013/0065066 A1 | 3/2013 | Sambasivan et al. |
| 2013/0075685 A1 | 3/2013 | Li et al. |
| 2013/0075688 A1 | 3/2013 | Xu et al. |
| 2013/0119341 A1 | 5/2013 | Liu et al. |
| 2013/0128653 A1 | 5/2013 | Kang et al. |
| 2013/0134379 A1 | 5/2013 | Lu |
| 2013/0166825 A1 | 6/2013 | Kim et al. |
| 2013/0207065 A1 | 8/2013 | Chiang |
| 2013/0214234 A1 | 8/2013 | Gopalan et al. |
| 2013/0235648 A1 | 9/2013 | Kim et al. |
| 2013/0264535 A1 | 10/2013 | Sonehara |
| 2013/0279240 A1 | 10/2013 | Jo |
| 2013/0308369 A1 | 11/2013 | Lu et al. |
| 2014/0015018 A1 | 1/2014 | Kim |
| 2014/0029327 A1 | 1/2014 | Strachan et al. |
| 2014/0070160 A1 | 3/2014 | Ishikawa et al. |
| 2014/0103284 A1 | 4/2014 | Hsueh et al. |
| 2014/0145135 A1 | 5/2014 | Gee et al. |
| 2014/0166961 A1 | 6/2014 | Liao et al. |
| 2014/0175360 A1 | 6/2014 | Tendulkar et al. |
| 2014/0177315 A1 | 6/2014 | Pramanik et al. |
| 2014/0192589 A1 | 7/2014 | Maxwell et al. |
| 2014/0197369 A1 | 7/2014 | Sheng et al. |
| 2014/0233294 A1 | 8/2014 | Ting et al. |
| 2014/0264236 A1 | 9/2014 | Kim et al. |
| 2014/0264250 A1 | 9/2014 | Maxwell et al. |
| 2014/0268997 A1 | 9/2014 | Nazarian et al. |
| 2014/0268998 A1 | 9/2014 | Jo |
| 2014/0269002 A1 | 9/2014 | Jo |
| 2014/0312296 A1 | 10/2014 | Jo et al. |
| 2014/0335675 A1 | 11/2014 | Narayanan |
| 2015/0070961 A1 | 3/2015 | Katayama et al. |
| 2015/0228334 A1 | 8/2015 | Nazarian et al. |
| 2016/0111640 A1 | 4/2016 | Chang et al. |

FOREIGN PATENT DOCUMENTS

| | | | |
|---|---|---|---|
| CN | 101501850 | A | 8/2009 |
| CN | 101636792 | A | 1/2010 |
| CN | 102024494 | A | 4/2011 |
| CN | 12077296 | A | 5/2011 |
| EP | 1096465 | A2 | 5/2001 |
| EP | 2405441 | A1 | 1/2012 |
| EP | 2408035 | A2 | 1/2012 |
| JP | 2005506703 | A | 3/2005 |
| JP | 2006032951 | A | 2/2006 |
| JP | 2007067408 | A | 3/2007 |
| JP | 2007281208 | A | 10/2007 |
| JP | 2007328857 | A | 12/2007 |
| JP | 2008503085 | A | 1/2008 |
| JP | 2008147343 | A | 6/2008 |
| JP | 2009043873 | A | 2/2009 |
| JP | 2011023645 | A | 2/2011 |
| JP | 2011065737 | A | 3/2011 |
| JP | 2012504840 | A | 2/2012 |
| JP | 2012505551 | A | 3/2012 |
| JP | 2012089567 | A | 5/2012 |
| JP | 2012533195 | A | 12/2012 |
| KR | 20090051206 | A | 5/2009 |
| KR | 20110014248 | A | 2/2011 |
| WO | 03034498 | A1 | 4/2003 |
| WO | 2005124787 | A2 | 12/2005 |
| WO | 2009005699 | A1 | 1/2009 |
| WO | 2010026654 | A1 | 3/2010 |
| WO | 2010042354 | A1 | 4/2010 |
| WO | 2010042732 | A2 | 4/2010 |
| WO | 2011005266 | A1 | 1/2011 |
| WO | 2011008654 | A1 | 1/2011 |
| WO | 2011133138 | A1 | 10/2011 |

OTHER PUBLICATIONS

Notice of Allowance dated Jul. 1, 2016 for U.S. Appl. No. 14/213,953, 96 pages.
Notice of Allowance dated Jul. 17, 2014 for U.S. Appl. No. 12/861,432, 25 pages.
Notice of Allowance dated Aug. 28, 2015 for U.S. Appl. No. 14/573,770, 23 pages.
Notice of Allowance for U.S. Appl. No. 14/509,967 dated Feb. 17, 2016, 18 pages.
Notice of Allowance for U.S. Appl. No. 14/509,967 dated Jun. 6, 2016, 96 pages.
Notice of Allowance for U.S. Appl. No. 14/213,953 dated Feb. 16, 2016, 21 pages.
Notice of Allowance for U.S. Appl. No. 14/611,022 dated Feb. 12, 2016, 13 pages.
Notice of Allowance for U.S. Appl. No. 14/611,022 dated Jun. 8, 2016, 57 pages.
Notice of Allowance for U.S. Appl. No. 14/611,022 dated Sep. 10, 2015, 13 pages.
Notice of Allowance for U.S. Appl. No. 14/612,025 dated Jul. 22, 2015, 25 pages.
Notice of Allowance for U.S. Appl. No. 13/912,136 dated Aug. 3, 2015, 15 pages.
Notice of Allowance for U.S. Appl. No. 13/952,467 dated May 20, 2016, 19 pages.
Notice of Allowance for U.S. Appl. No. 14/027,045 dated Jun. 9, 2015, 14 pages.
Notice of Allowance for U.S. Appl. No. 14/383,079 dated Jan. 4, 2016, 27 pages.
Notice of Allowance for U.S. Appl. No. 14/588,202 dated Jan. 20, 2016, 15 pages.
Notice of Allowance for U.S. Appl. No. 14/887,050 dated Jun. 22, 2016, 13 pages.
Notice of Allowance for U.S. Appl. No. 14/946,367 dated Jul. 13, 2016, 23 pages.
Notice of Allowance mailed Sep. 4, 2014 for U.S. Appl. No. 13/761,132, filed Feb. 6, 2013.
Notice of Allowance mailed Oct. 5, 2011 for U.S. Appl. No. 12/940,920, filed Nov. 5, 2010.
Notice of Allowance mailed Feb. 6, 2012 for U.S. Appl. No. 12/835,699, filed Jul. 30, 2010.
Notice of Allowance mailed Feb. 6, 2013 for U.S. Appl. No. 13/118,258, filed May 27, 2011.
Notice of Allowance mailed Aug. 8, 2013 for U.S. Appl. No. 13/733,828, filed Jan. 3, 2013.
Notice of Allowance mailed Jan. 8, 2013 for U.S. Appl. No. 12/814,410, filed Jun. 11, 2010.
Notice of Allowance mailed Oct. 8, 2013 for U.S. Appl. No. 13/769,152, filed Feb. 15, 2013.
Notice of Allowance mailed Oct. 8, 2013 for U.S. Appl. No. 13/905,074, filed May 29, 2013.
Notice of Allowance mailed Apr. 9, 2013 for U.S. Appl. No. 13/748,490, filed Jan. 23, 2013.
Notice of Allowance mailed Sep. 9, 2014 for U.S. Appl. No. 13/620,012, filed Sep. 14, 2012.
Notice of Allowance mailed Sep. 9, 2014 for U.S. Appl. No. 13/870,919, filed Apr. 25, 2013.
Notice of Allowance mailed Jan. 11, 2016 for U.S. Appl. No. 14/613,299.
Notice of Allowance mailed Jan. 20, 2016 for U.S. Appl. No. 14/034,390.
Notice of Allowance mailed Oct. 10, 2013 for U.S. Appl. No. 13/452,657, filed Apr. 20, 2012.
Notice of Allowance mailed Jan. 11, 2013 for U.S. Appl. No. 12/894,087, filed Sep. 29, 2010.
Notice of Allowance mailed May 11, 2012 for U.S. Appl. No. 12/939,824, filed Nov. 4, 2010.
Notice of Allowance mailed Mar. 12, 2012 for U.S. Appl. No. 12/913,719, filed Oct. 27, 2010.
Notice of Allowance mailed Nov. 13, 2013 for U.S. Appl. No. 13/461,725, filed May 1, 2012.
Notice of Allowance mailed Nov. 14, 2012 for U.S. Appl. No. 12/861,666, filed Aug. 23, 2010.
Notice of Allowance mailed Nov. 14, 2012 for U.S. Appl. No. 13/532,019, filed Jun. 25, 2012.

(56) References Cited

OTHER PUBLICATIONS

Notice of Allowance mailed Mar. 15, 2013 for U.S. Appl. No. 12/894,098, filed Sep. 29, 2010.
Notice of Allowance mailed Jan. 16, 2014 for U.S. Appl. No. 13/921,157, filed Jun. 18, 2013.
Notice of Allowance mailed Oct. 16, 2013 for U.S. Appl. No. 13/174,264, filed Jun. 30, 2011.
Notice of Allowance mailed Apr. 17, 2012 for U.S. Appl. No. 13/158,231, filed Jun. 10, 2011.
Notice of Allowance mailed Jan. 17, 2014 for U.S. Appl. No. 13/725,331, filed Dec. 21, 2012.
Notice of Allowance mailed Mar. 17, 2014 for U.S. Appl. No. 13/592,224, filed Aug. 22, 2012.
Notice of Allowance mailed May 17, 2013 for U.S. Appl. No. 13/290,024.
Notice of Allowance mailed Sep. 17, 2013 for U.S. Appl. No. 13/679,976, filed Nov. 16, 2012.
Notice of Allowance mailed Sep. 17, 2014 for U.S. Appl. No. 13/960,735, filed Aug. 6, 2013.
Notice of Allowance mailed Sep. 17, 2014 for U.S. Appl. No. 13/462,653, filed May 2, 2012.
Notice of Allowance mailed Sep. 18, 2012 for U.S. Appl. No. 12/900,232, filed Oct. 7, 2010.
Notice of Allowance mailed Sep. 18, 2014 for U.S. Appl. No. 13/920,021, filed Jun. 17, 2013.
Office Action for U.S. Appl. No. 14/887,050 dated Mar. 11, 2016, 12 pages.
Notice of Allowance dated Sep. 14, 2016 for U.S. Appl. No. 14/588,202, 119 pages.
Office Action mailed Apr. 1, 2013 for U.S. Appl. No. 13/174,077, filed Jun. 30, 2011.
Office Action mailed Aug. 1, 2012 for U.S. Appl. No. 12/894,098, filed Sep. 29, 2010.
Office Action mailed Mar. 1, 2012 for U.S. Appl. No. 12/835,704, filed Jul. 13, 2010.
Office Action mailed Aug. 2, 2013 for U.S. Appl. No. 13/594,665, filed Aug. 24, 2012.
Office Action mailed Sep. 2, 2014 for U.S. Appl. No. 13/705,082, 41 pages.
Office Action mailed Apr. 3, 2014 for U.S. Appl. No. 13/870,919, filed Apr. 25, 2013.
Office Action mailed Oct. 3, 2013 for U.S. Appl. No. 13/921,157, filed Jun. 18, 2013.
Office Action mailed Apr. 5, 2012 for U.S. Appl. No. 12/833,898, filed Jul. 9, 2010.
Office Action mailed Oct. 5, 2011 for U.S. Appl. No. 11/875,541, filed Oct. 19, 2007.
Office Action mailed Apr. 6, 2015 for U.S. Appl. No. 14/034,390, filed Sep. 23, 2013.
Office Action mailed Dec. 6, 2013 for U.S. Appl. No. 13/564,639, filed Aug. 1, 2012.
Office Action mailed Dec. 6, 2013 for U.S. Appl. No. 13/960,735, filed Aug. 6, 2013.
Office Action mailed Feb. 6, 2014 for U.S. Appl. No. 13/434,567, filed Mar. 29, 2012.
Office Action mailed Mar. 6, 2013 for U.S. Appl. No. 13/174,264, filed Jun. 30, 2011.
Office Action mailed Mar. 6, 2013 for U.S. Appl. No. 13/679,976, filed Nov. 16, 2012.
Office Action mailed Sep. 6, 2011 for U.S. Appl. No. 12/582,086, filed Oct. 20, 2009.
Office Action mailed Dec. 7, 2012 for U.S Appl. No. 13/436,714, filed Mar. 30, 2012.
Office Action mailed Mar. 7, 2013 for U.S. Appl. No. 13/651,169, filed Oct. 12, 2012.
Office Action mailed May 7, 2013 for U.S. Appl. No. 13/585,759, filed Aug. 14, 2012.
Office Action mailed Jan. 8, 2014 for U.S. Appl. No. 12/861,432, filed Aug. 23, 2010.
Office Action mailed Jun. 8, 2012 for U.S. Appl. No. 11/875,541, filed Oct. 19, 2007.
Office Action mailed Aug. 9, 2013 for U.S. Appl. No. 13/764,710, filed Feb. 11, 2013.
Office Action mailed Jul. 9, 2013 for U.S. Appl. No. 13/447,036, filed Apr. 13, 2012.
Office Action mailed Jul. 9, 2014 for U.S. Appl. No. 14/166,691, filed Jan. 28, 2014.
Office Action mailed Oct. 9, 2012 for U.S. Appl. No. 13/417,135, filed Mar. 9, 2012.
Office Action mailed Jan. 10, 2014 for U.S. Appl. No. 13/920,021, filed Jun. 17, 2013.
Office Action mailed Apr. 11, 2014 for U.S. Appl. No. 13/143,047, filed Jun. 30, 2011.
Office Action mailed Feb. 11, 2014 for U.S. Appl. No. 13/620,012, filed Sep. 14, 2012.
Office Action mailed Jul. 11, 2013 for U.S. Appl. No. 13/764,698, filed Feb. 11, 2013.
Office Action mailed Sep. 11, 2014 for U.S. Appl. No. 13/739,283, filed Jan. 11, 2013.
Office Action mailed Aug. 12, 2013 for U.S. Appl. No. 13/077,941, filed Mar. 31, 2011.
Office Action dated Aug. 12, 2016 for U.S. Appl. No. 14/667,346, 27 pages.
Office Action mailed Mar. 12, 2014 for U.S. Appl. No. 13/167,920, filed Jun. 24, 2011.
Office Action mailed Sep. 12, 2014 for U.S. Appl. No. 13/426,869, filed Mar. 22, 2012.
Office Action mailed Sep. 12, 2014 for U.S. Appl. No. 13/756,498.
Office Action mailed Dec. 3, 2015 for U.S. Appl. No. 14/253,796.
Office Action mailed Feb. 13, 2014 for U.S. Appl. No. 13/174,077, filed Jun. 30, 2011.
Office Action dated Aug. 12, 2016 for U.S. Appl. No. 14/613,301, 43 pages.
Office Action mailed Mar. 14, 2012 for U.S. Appl. No. 12/815,369, filed Jun. 14, 2010.
Office Action mailed Mar. 14, 2014 for U.S. Appl. No. 12/835,704, filed Jul. 13, 2010.
Office Action mailed Apr. 15, 2016 for U.S. Appl. No. 14/597,151.
Office Action mailed Apr. 16, 2012 for U.S. Appl. No. 12/834,610, filed Jul. 12, 2010.
Office Action mailed Jan. 16, 2014 for U.S. Appl. No. 13/739,283, filed Jan. 11, 2013.
Office Action mailed May 16, 2012 for U.S. Appl. No. 12/815,318, filed Jun. 14, 2010.
Office Action mailed Oct. 16, 2012 for U.S. Appl. No. 12/861,650, filed Aug. 23, 2010.
Office Action mailed Apr. 17, 2012 for U.S. Appl. No. 12/814,410, filed Jun. 11, 2010.
Office Action mailed Feb. 17, 2011 for U.S. Appl. No. 12/913,719, filed Oct. 27, 2010.
Office Action mailed Jun. 17, 2014 for U.S. Appl. No. 14/072,657, filed Nov. 5, 2013.
Office Action mailed Mar. 17, 2015 for U.S. Appl. No. 14/573,770.
Office Action mailed Apr. 19, 2011 for U.S. Appl. No. 12/582,086, filed Oct. 20, 2009.
Office Action mailed Aug. 19, 2013 for U.S. Appl. No. 13/585,759, filed Aug. 14, 2012.
Office Action mailed Jun. 19, 2012 for U.S. Appl. No. 13/149,757, filed May 31, 2011.
Office Action mailed Mar. 19, 2013 for U.S. Appl. No. 13/465,188, filed May 7, 2012.
Office Action mailed Mar. 19, 2013 for U.S. Appl. No. 13/564,639, filed Aug. 1, 2012.
Office Action mailed May 20, 2013 for U.S. Appl. No. 13/725,331, filed Dec. 21, 2012.
Office Action mailed Nov. 20, 2012 for U.S Appl. No. 13/149,653, filed May 31, 2011.
Office Action mailed Sep. 20, 2013 for U.S. Appl. No. 13/481,600, filed May 25, 2012.
Office Action mailed Mar. 21, 2014 for U.S. Appl. No. 13/447,036, filed Apr. 13, 2012.

(56) References Cited

OTHER PUBLICATIONS

Office Action mailed May 21, 2014 for U.S. Appl. No. 13/764,698, filed Feb. 11, 2013.
Office Action mailed Sep. 21, 2011 for U.S. Appl. No. 12/835,704, filed Jul. 13, 2010.
Office Action mailed Jul. 22, 2010 for U.S. Appl. No. 11/875,541, filed Oct. 19, 2007.
Office Action mailed Jul. 22, 2011 for U.S. Appl. No. 12/913,719, filed Oct. 27, 2010.
Office Action mailed Sep. 22, 2013 for U.S. Appl. No. 13/189,401, filed Jul. 22, 2011.
Office Action mailed May 23, 2013 for U.S. Appl. No. 13/592,224, filed Aug. 22, 2012.
Office Action mailed Aug. 24, 2011 for U.S. Appl. No. 12/835,699, filed Jul. 13, 2010.
Office Action mailed Apr. 25, 2012 for U.S. Appl. No. 13/149,653, filed May 31, 2011.
Office Action mailed Apr. 25, 2014 for U.S. Appl. No. 13/761,132, filed Feb. 6, 2013.
Office Action mailed Jan. 25, 2012 for U.S. Appl. No. 12/861,650, filed Aug. 23, 2010.
Office Action mailed Oct. 25, 2012 for U.S. Appl. No. 13/461,725, filed May 1, 2012.
Office Action mailed Sep. 25, 2013 for U.S. Appl. No. 13/194,479, filed Jul. 29, 2011.
Office Action mailed Nov. 26, 2012 for U.S. Appl. No. 13/156,232.
Office Action mailed Aug. 27, 2013 for U.S. Appl. No. 13/436,714, filed Mar. 30, 2012.
Office Action mailed Dec. 27, 2013 for U.S Appl. No. 13/525,096, filed Jun. 15, 2012.
Office Action mailed Mar. 27, 2012 for U.S. Appl. No. 13/314,513, filed Dec. 8, 2011.
Office Action mailed Jan. 29, 2014 for U.S. Appl. No. 13/586,815, filed Aug. 15, 2012.
Office Action mailed Jul. 29, 2013 for U.S. Appl. No. 13/466,008, filed May 7, 2012.
Office Action mailed Mar. 29, 2013 for U.S. Appl. No. 12/861,432, filed Aug. 23, 2010.
Office Action mailed Jul. 30, 2012 for U.S. Appl. No. 12/900,232, filed Oct. 7, 2010.
Office Action mailed Jun. 30, 2014 for U.S. Appl. No. 13/531,449, filed Jun. 22, 2012.
Office Action mailed Mar. 30, 2011 for U.S. Appl. No. 11/875,541, filed Oct. 19, 2007.
Office Action mailed Sep. 30, 2013 for U.S. Appl. No. 13/189,401, filed Jul. 22, 2011.
Office Action mailed Sep. 30, 2013 for U.S. Appl. No. 13/462,653, filed May 2, 2012.
Office Action mailed Apr. 8, 2016 for U.S. Appl. No. 14/573,770.
Office Action mailed May 20, 2016 for U.S. Appl. No. 14/613,299.
Office Action mailed Jul. 9, 2015 for U.S. Appl. No. 14/573,817.
Owen A.E., et al., "Electronic Switching in Amorphous Silicon Devices: Properties of the Conducting Filament", Proceedings of 5th International Conference on Solid-State and Integrated Circuit Technology, IEEE, 1998, pp. 830-833.
Owen A.E., et al., "Memory Switching in Amorphous Silicon Devices," Journal of Non- Crystalline Solids, 1983, vol. 50-60 (Pt.2), pp. 1273-1280.
Owen A.E., et al., "New Amorphous-Silicon Electrically Programmable Nonvolatile Switching Device," Solid-State and Electron Devices, IEEE Proceedings, 1982, vol. 129 (Pt. 1), pp. 51-54.
Owen A.E., et al., "Switching in Amorphous Devices," International Journal of Electronics, 1992, vol. 73 (5), pp. 897-906.
Rose M.J., et al., "Amorphous Silicon Analogue Memory Devices," Journal of Non-Crystalline Solids, 1989, vol. 115, pp. 168-170.
Russo U., et al., "Self-Accelerated Thermal Dissolution Model for Reset Programming in Unipolar Resistive-Switching Memory (RRAM) Devices," IEEE Transactions on Electron Devices, 2009, vol. 56 (2), pp. 193-200.

Scott J.C., "Is There an Immortal Memory?," American Association for the Advancement of Science, 2004, vol. 304 (5667), pp. 62-63.
Shin W., et al., "Effect of Native Oxide on Polycrystalline Silicon CMP," Journal of the Korean Physical Society, 2009, vol. 54 (3), pp. 1077-1081.
Stikeman A., Polymer Memory—The Plastic Path to Better Data Storage, Technology Review, Sep. 2002, pp. 31. Retrieved from the Internet :.
Suehle J.S., et al., "Temperature Dependence of Soft Breakdown and Wear-out in Sub-3 Nm SiO2 Films", 38th Annual International Reliability Physics Symposium, San Jose, California, 2000, pp. 33-39.
Sune J., et al., "Nondestructive Multiple Breakdown Events in Very Thin SiO2 Films," Applied Physics Letters, 1989, vol. 55, pp. 128-130.
Terabe K., et al., "Quantized Conductance Atomic Switch," Nature, 2005, vol. 433, pp. 47-50.
Naser R., et al., "Nanoionics-based Resistive Switching Memories," Nature Materials, 2007, vol. 6, pp. 833-835.
International Search Report and Written Opinion for Application No. PCT/US2011/040362, mailed on Jan. 19, 2012, 7 pages.
International Search Report and Written Opinion for Application No. PCT/US2011/046035, mailed on Mar. 27, 2012, 6 pages.
International Search Report and Written Opinion for Application No. PCT/US2012/040232, mailed on Feb. 26, 2013, 7 pages.
International Search Report and Written Opinion for Application No. PCT/US2012/040242, mailed on Jan. 31, 2013, 9 pages.
International Search Report and Written Opinion for Application No. PCT/US2012/044077, mailed on Jan. 25, 2013, 9 pages.
International Search Report and Written Opinion for Application No. PCT/US2012/045312, mailed on Mar. 29, 2013, 11 pages.
International Search Report and Written Opinion for Application No. PCT/US2013/042746, mailed on Sep. 6, 2013, 7 pages.
International Search Report and Written Opinion for Application No. PCT/US2013/054976, mailed on Dec. 16, 2013, 9 pages.
International Search Report and Written Opinion for Application No. PCT/US2013/061244, mailed on Jan. 28, 2014, 8 pages.
International Search Report and Written Opinion for Application No. PCT/US2013/077628, mailed on Apr. 29, 2014, 12 pages.
International Search Report for Application No. PCT/US2009/060023, mailed on May 18, 2010, 3 pages.
International Search Report for Application No. PCT/US2009/061249, mailed on May 19, 2010, 3 pages.
International Search Report for Application No. PCT/US2011/040090, mailed on Feb. 17, 2012, 5 pages.
International Search Report for Application No. PCT/US2011/045124, mailed on May 29, 2012, 3 pages.
International Search Report for Application No. PCT/US2011/046036, mailed on Feb. 23, 2012, 3 pages.
Jafar M., et al., "Switching in Amorphous-silicon Devices," Physical Review, 1994, vol. 49 (19), pp. 611-615.
Japanese Office Action (English Translation) for Japanese Application No. 2011-153349 mailed Feb. 24, 2015, 3 pages.
Japanese Office Action (English Translation) for Japanese Application No. 2013-525926 mailed Mar. 3, 2015, 4 pages.
Japanese Office Action (English Translation) for Japanese Application No. 2014-513700 mailed Jan. 12, 2016, 4 pages.
Japanese Search Report (English Translation) for Japanese Application No. 2013-525926 dated Feburary 9, 2015, 15 pages.
Japanese Search Report (English Translation) for Japanese Application No. 2011-153349 dated Feburary 9, 2015, 11 pages.
Japanese Search Report (English Translation) for Japanese Application No. 2014-513700 dated Jan. 14, 2016, 25 pages.
Jo S.H. et al., "High-Density Crossbar Arrays Based on a Si Memristive System", Supporting Information, 2009, pp. 1-4.
Jo S.H., et al., "A Silicon-Based Crossbar Ultra-High-Density Non-Volatile Memory", SSEL Annual Report, 2007.
Jo S.H., et al., "Ag/a-Si:Fug-Si Resistive Switching Nonvolatile Memory Devices," Nanotechnology Materials and Devices Conference, 2006, vol. 1, pp. 116-117.
Jo S.H., et al., "CMOS Compatible Nanoscale Nonvolatile Resistance Switching Memory," Nano Letters, 2008, vol. 8 (2), pp. 392-397.

(56) References Cited

OTHER PUBLICATIONS

Jo S.H., et al., "Experimental, Modeling and Simulation Studies of Nanoscale Resistance Switching Devices", 9.sup.th conference on Nanotechnology, IEEE, 2009, pp. 493-495.
Jo S.H., et al., "High-Density Crossbar Arrays Based on a Si Memristive System," Nano Letters, 2009, vol. 9 (2), pp. 870-874.
Jo S.H. et al., "Nanoscale Memristive Devices for Memory and Logic Applications", Ph. D Dissertation, University of Michigan, 2010.
Jo S.H., et al., "Nanoscale Memristor Device as Synapse in Neuromorphic Systems," Nano Letters, 2010, vol. 10, pp. 1297-1301.
Jo S.H. et al., "Nonvolatile Resistive Switching Devices Based on Nanoscale Metal/Amorphous Silicon/Crystalline Silicon Junctions," Materials Research Society Symposium Proceedings, 2007, vol. 997.
Jo S.H., et al., "Programmable Resistance Switching in Nanoscale Two-Terminal Devices," Nano Letters, 2009, vol. 9 (1), pp. 496-500.
Jo S.H., et al., "Programmable Resistance Switching in Nanoscale Two-Terminal Devices," Supporting Information, Dec. 29, 2008, pp. 1-4, vol. 9., No. 1, Department of Electrical Engineering and Computer Science, the University of Michigan, Ann Arbor, Michigan.
Jo S.H., et al., "Si Memristive Devices Applied to Memory and Neuromorphic Circuits", Proceedings of 2010 IEEE International Symposium on Circuits and Systems, 2010, pp. 13-16.
Jo S.H., et al., "Si-Based Two-Terminal Resistive Switching Nonvolatile Memory", IEEE, 2008.
Kuk-Hwan Kim et al., "Nanoscale Resistive Memory with Intrinsic Diode Characteristics and Long Endurance," Applied Physics Letters, 2010, vol. 96, pp. 053106-1-053106-3.
Kund M., et al., "Conductive Bridging Ram (cbram): An Emerging Non-volatile Memory Technology Scalable to Sub 20nm", IEEE, 2005.
Le Comber P.G., et al., "The Switching Mechanism in Amorphous Silicon Junctions," Journal of Non-Crystalline Solids, 1985, vol. 77 & 78, pp. 1373-1382.
Le Comber P.G., "Present and Future Applications of Amorphous Silicon and Its Alloys," Journal of Non-Crystalline Solids, 1989, vol. 115, pp. 1-13.
Lee S.H., et al., "Full Integration and Cell Characteristics for 64Mb Nonvolatile PRAM", 2004 Symposium on VLSI Technology Digest of Technical Papers, IEEE, 2004, pp. 20-21.
Liu M., et al., "rFGA: CMOS-Nano Hybrid FPGA Using RRAM Components", IEEE CB3 N17International Symposium on Nanoscale Architectures, Anaheim, USA, Jun. 12-13, 2008, pp. 93-98.
Lu W., et al., "Nanoelectronics from the Bottom Up," Nature Materials, 2007, vol. 6, pp. 841-850.
Lu W., et al., "Supporting Information", 2008.
Marand H., et al., MESc. 5025 lecture notes: Chapter 7. Diffusion, University of Vermont. Retrieved from the Internet on Sep. 9, 2016. https://www.yumpu.com/en/document/view/31750386/diffusion-1-color.
Moopenn A. et al., "Programmable Synaptic Devices for Electronic Neural Nets," Control and Computers, 1990, vol. 18 (2), pp. 37-41.
Muller D.A., et al., "The Electronic Structure at the Atomic Scale of Ultrathin Gate Oxides," Nature, 1999, vol. 399, pp. 758-761.
Muller G., et al., "Status and Outlook of Emerging Nonvolatile Memory Technologies", IEEE, 2004, pp. 567-570.
Newman R.C., "Defects in Silicon," Reports on Progress in Physics, 1982, vol. 45, pp. 1163-1210.
Notice of Allowance dated Nov. 26, 2013 for U.S. Appl. No. 13/481,696, 15 pages.
Notice of Allowance dated Dec. 16, 2014 for U.S. Appl. No. 12/835,704, 47 pages.
Advisory Action mailed Jun. 8, 2012 for U.S Appl. No. 12/835,704, filed Jul. 13, 2010.

Avila A., et al., "Switching in Coplanar Amorphous Hydrogenated Silicon Devices," Solid-State Electronics, 2000, vol. 44 (1), pp. 17-27.
Cagli C., et al., "Evidence for Threshold Switching in the Set Process of Nio-based Rram and Physical Modeling for Set, Reset, Retention and Disturb Prediction", 2008 IEEE International Electron Devices Meeting (IEDM), Dec. 15-17, 2008, pp. 1-4, San Francisco, CA, USA.
Chang P.H., at al., "Aluminum Spiking at Contact Windows in Al/Ti—W/Si," Applied Physics Letters, 1988, vol. 52 (4), pp. 272-274.
Chen Y., et al., "Nanoscale Molecular-switch Crossbar Circuits," Nanotechnology, 2003, vol. 14, pp. 462-468.
Chinese Office Action (English Translation) for Chinese Application No. 201180050941.0 dated Apr. 3, 2015, 8 pages.
Chinese Office Action (English Translation) for Chinese Application No. 201280027066.9 dated Nov. 23, 2015, 6 pages.
Chinese Office Action (English Translation) for Chinese Application No. 201110195933.7 dated Jul. 31, 2014, 4 pages.
Chinese Office Action (English Translation) for Chinese Application No. 201110195933.7 dated May 18, 2015, 4 pages.
Chinese Office Action (English Translation) for Chinese Application No. 201180050941.0 dated Dec. 9, 2015, 5 pages.
Chinese Office Action (with English Translation) for Chinese Application No. 201280027066.9 mailed on Jul. 4, 2016, 5 pages.
Chinese Office Action (with English Translation) for Chinese Application No. 201290000773.4 dated Jun. 9, 2014, 3 pages.
Chinese Seach Report (English Translation) for Chinese Application No. 201180050941.0 dated Mar. 25, 2015, 1 page.
Chinese Search Report (English Translation) for Chinese Application No. 201280027066.9 dated Nov. 13, 2015, 2 pages.
Choi J.W., "Bistable [2]Rotaxane Based Molecular Electronics: Fundamentals and Applications", Dissertation, chapter 3, California Institute of Technology, Pasadena, 2007, pp. 79-120. Retrieved from the Internet:.
Chou S.Y., et al., "Imprint Lithography With 25-Nanometer Resolution," Science, 1996, vol. 272, pp. 85-87.
Collier C.P., et al., "Electronically Configurable Molecular-based Logic Gates ," Science, 1999, vol. 285 (5426), pp. 391-395.
Corrected Notice of Allowability dated Nov. 20, 2014 for U.S. Appl. No. 13/594,665, 5 pages.
Corrected Notice of Allowability dated Jun. 15, 2016 for U.S. Appl. No. 13/952,467, 10 pages.
Corrected Notice of Allowability mailed Oct. 1, 2013 for U.S. Appl. No. 13/733,828, filed Jan. 3, 2013.
Corrected Notice of Allowance mailed Jan. 11, 2013 for U.S. Appl. No. 12/861,666 dated Aug. 23, 2010.
Dehon A., "Array-Based Architecture for FET-Based, Nanoscale Electronics," IEEE Transactions on Nanotechnology, 2003, vol. 2 (1), pp. 23-32.
Del Alamo J., et al., "Operating limits of Al-alloyed High-low Junction for BSF Solar Cells," Solid-State Electronics, 1981, vol. 24, pp. 415-420.
Den Boer W., "Threshold Switching in Hydrogenated Amorphous Silicon," Applied Physics Letters, 1982, vol. 40, pp. 312-813.
Dey S.K., "Electrothermal Model of Switching in Amorphous Silicon Films," Journal of Vacuum Science & Technology , 1980, vol. 17 (1), pp. 445-448.
Dong Y., et al., "Si/a-Si Core/Shell Nanowires as Nonvolatile Crossbar Switches," Nano Letters, 2008, vol. 8 (2), pp. 386-391.
European Office Action for Application No. 11005649.6 dated Dec. 1, 2014, 2 pages.
European Office Action for Application No. 11005649.6 dated Nov. 17, 2015, 5 pages.
European Office Action for Application No. EP11005207.3 dated Aug. 8, 2012, 4 pages.
European Search Report for Application No. EP09819890.6 mailed on Mar. 27, 2012.
European Search Report for Application No. EP11005207.3 mailed on Oct. 12, 2011.
European Search Report for Application No. EP14000949, mailed on Jun. 4, 2014, 7 pages.

(56) References Cited

OTHER PUBLICATIONS

European Search Report for European Application No. EP11005649 mailed Oct. 15, 2014, 2 pages.
Ex parte Quayle Action mailed May 8, 2012 for U.S. Appl. No. 12/826,653, filed Jun. 29, 2010.
Final Office Action dated Jun. 29, 2016 for U.S. Appl. No. 14/692,677, 21 pages.
Final Office Action for U.S. Appl. No. 14/612,025 dated Jun. 14, 2016, 7 pages.
Final Office Action mailed Feb. 1, 2016 for U.S. Appl. No. 14/573,817.
Final Office Action mailed May 20, 2016 for U.S. Appl. No. 14/253,796.
Final Office Action mailed Aug. 13, 2014 for U.S. Appl. No. 13/525,096, filed Jun. 15, 2012.
Gangopadhyay S., et al., "Memory Switching in Sputtered Hydrogenated Amorphous Silicon (a-Si:H)," Japanese Journal of Applied Physics, 1985, vol. 24 (10), pp. 1363-1364.
Goronkin H., et al., High-Performance Emerging Solid-State Memory Technologies, MRS Bulletin, Nov. 2004, pp. 805-813. Retrieved from the Internet:.
Hajto J., et al., "Electronic Switching in Amorphous-Semiconductor Thin Films," Amorphous & Microcrystalline Semiconductor Devices: Materials and Device Physics, Chapter 14, 1992, pp. 640-701, vol. 2, Artech House, Inc.
Hajto J., et al., "Analogue Memory and Ballistic Electron Effects in Metal-amorphous Silicon Structures," Philosophical Magazine, 1991, vol. 63 (1), pp. 349-369.
Hajto J., et al., "The Programmability of Amorphous Silicon Analogue Memory Elements," Materials Research Society Symposium Proceedings , 1990, vol. 192, pp. 405-410.
Holmes A.J., et al., "Design of Analogue Synapse Circuits using Non-Volatile a-Si:H Memory Devices", Proceedings of ISCAS, 1994, pp. 351-354.
Hu J., et al., "AC Characteristics of Cr/p. sup.+a-Si:H/V Analog Switching Devices," IEEE Transactions on Electron Devices, 2000, vol. 47 (9), pp. 1751-1757.
Hu X.Y., et al., "Write Amplification Analysis in Flash-based Solid State Drives", SYSTOR'09; 20090504-20090406, May 4, 2009, pp. 1-9.
Hu., et al., "Area-Dependent Switching in Thin Film-Silicon Devices," Materials Research Society Symposium Proceedings, 2003, vol. 762, pp. A 18.3.1-A 18.3.6.
Hu., et al. "Switching and Filament Formation in hot-wire CVD p-type a-Si:H devices," Thin Solid Films, Science . Direct, 2003, vol. 430, pp. 249-252.
Hudgens S., et al., "Overview of Phase-Change Chalcogenide Nonvolatile Memory Technology", MRS Bulletin, Nov. 2004, pp. 829-832. Retrieved from the Internet:.
Notice of Allowance mailed Sep. 18, 2014 for U.S. Appl. No. 13/586,815, filed Aug. 15, 2012.
Notice of Allowance mailed Jun. 19, 2012 for U.S. Appl. No. 12/861,650, filed Aug. 23, 2010.
Notice of Allowance mailed Sep. 19, 2013 for U.S. Appl. No. 13/585,759, filed Aug. 14, 2012.
Notice of Allowance mailed Apr. 2, 2013 for U.S. Appl. No. 13/149,757, filed May 31, 2011.
Notice of Allowance mailed Feb. 10, 2015 for U.S. Appl. No. 13/525,096, filed Jun. 15, 2012.
Notice of Allowance mailed Feb. 20, 2014 for U.S. Appl. No. 13/468,201, filed May 10, 2012.
Notice of Allowance mailed Mar. 20, 2014 for U.S. Appl. No. 13/598,550, filed Aug. 29, 2012.
Notice of Allowance mailed Mar. 20, 2014 for U.S. Appl. No. 13/461,725, filed May 1, 2012.
Notice of Allowance mailed Oct. 21, 2011 for U.S. Appl. No. 12/582,086, filed Oct. 20, 2009.
Notice of Allowance mailed Oct. 21, 2014 for U.S. Appl. No. 13/426,869, filed Mar. 22, 2012.
Notice of Allowance mailed May 22, 2012 for U.S. Appl. No. 12/815,369, filed Jun. 14, 2010.
Notice of Allowance mailed Dec. 23, 2015 for U.S. Appl. No. 14/573,770.
Notice of Allowance mailed Oct. 23, 2013 for U.S. Appl. No. 13/417,135, filed Mar. 9, 2012.
Notice of Allowance mailed Jan. 24, 2013 for U.S. Appl. No. 13/314,513, filed Dec. 8, 2011.
Notice of Allowance mailed Jul. 24, 2012 for U.S. Appl. No. 12/939,824, filed Nov. 4, 2010.
Notice of Allowance mailed Oct. 25, 2012 for U.S. Appl. No. 12/894,087, filed Sep. 29, 2010.
Notice of Allowance mailed Sep. 25, 2014 for U.S. Appl. No. 13/447,036, filed Apr. 13, 2012.
Notice of Allowance mailed Sep. 26, 2014 for U.S. Appl. No. 13/594,665, filed Aug. 24, 2012.
Notice of Allowance mailed Aug. 27, 2014 for U.S. Appl. No. 13/077,941, filed Mar. 31, 2011.
Notice of Allowance mailed Nov. 28, 2012 for U.S. Appl. No. 13/290,024, filed Nov. 4, 2011.
Notice of Allowance mailed Oct. 28, 2013 for U.S. Appl. No. 13/194,500, filed Jul. 29, 2011.
Notice of Allowance mailed Oct. 28, 2013 for U.S. Appl. No. 13/651,169, filed Oct. 12, 2012.
Notice of Allowance mailed Nov. 29, 2012 for U.S. Appl. No. 12/815,318, filed Jun. 14, 2010.
Notice of Allowance mailed Oct. 29, 2012 for U.S. Appl. No. 13/149,807, filed May 31, 2011.
Notice of Allowance mailed May 30, 2012 for U.S. Appl. No. 12/833,898, filed Jul. 9, 2010.
Notice of Allowance mailed Sep. 30, 2013 for U.S. Appl. No. 13/481,696, filed May 25, 2012.
Notice of Allowance mailed Aug. 31, 2012 for U.S. Appl. No. 13/051,296, filed Mar. 18, 2011.
Notice of Allowance mailed Apr. 20, 2016 for U.S. Appl. No. 14/573,817.
Notice of Allowance mailed Oct. 8, 2014 for U.S. Appl. No. 13/077,941, filed Mar. 31, 2011.
Notice of Allowance mailed Aug. 26, 2015 for U.S. Appl. No. 14/034,390.
Notice of Allowance mailed Sep. 8, 2015 for U.S. Appl. No. 14/613,299.
Office Action dated Dec. 31, 2015 for U.S. Appl. No. 14/692,677, 27 pages.
Office Action dated Feb. 5, 2015 for U.S. Appl. No. 14/027,045, 6 pages.
Office Action dated Apr. 11, 2014 for U.S. Appl. No. 13/594,665, 44 pages.
Office Action dated Apr. 6, 2015 for U.S. Appl. No. 13/912,136, 23 pages.
Office Action for U.S. Appl. No. 14/611,022 dated May 7, 2015, 13 pages.
Office Action for U.S. Appl. No. 14/612,025 dated Feb. 1, 2016, 12 pages.
Office Action for U.S. Appl. No. 13/952,467 dated Jan. 15, 2016, 22 pages.
Office Action for U.S. Appl. No. 14/194,499 dated May 18, 2016, 10 pages.
Office Action for U.S. Appl. No. 14/207,430 dated Oct. 15, 2015, 57 pages.
Office Action for U.S. Appl. No. 14/207,430 dated Mar. 10, 2016, 78 pages.
Office Action for U.S. Appl. No. 14/207,430 dated Jul. 25, 2016, 79 pages.
Office Action for U.S. Appl. No. 14/213,953 dated Nov. 9, 2015, 20 pages.
Office Action for U.S. Appl. No. 14/383,079 dated May 10, 2016, 7 pages.
Office Action for U.S. Appl. No. 14/383,079 dated Aug. 4, 2015, 11 pages.
Office Action for U.S. Appl. No. 14/588,202 dated May 10, 2016, 8 pages.

(56) References Cited

OTHER PUBLICATIONS

Office Action for U.S. Appl. No. 14/588,202 dated Sep. 11, 2015, 9 pages.
Office Action for U.S. Appl. No. 14/613,301 dated Feb. 4, 2016, 42 pages.
Office Action for U.S. Appl. No. 14/613,301 dated Mar. 31, 2015, 58 pages.
Office Action for U.S. Appl. No. 14/613,301 dated Jul. 31, 2015, 26 pages.
Written Opinion for Application No. PCT/US2009/060023, mailed on May 18, 2010, 3 pages.
Written Opinion for Application No. PCT/US2009/061249, mailed on May 19, 2010, 3 pages.
Written Opinion for Application No. PCT/US2011/040090, mailed on Feb. 17, 2012, 6 pages.
Written Opinion for Application No. PCT/US2011/045124, mailed on May 29, 2012, 5 pages.
Written Opinion for Application No. PCT/US2011/046036, mailed on Feb. 23, 2012, 4 pages.
Yin S., "Solution Processed Silver Sulfide Thin Films for Filament Memory Applications", Technical Report No. UCB/EECS-2010-166, Dec. 17, 2010, Electrical Engineering and Computer Sciences, University of California at Berkeley. Retrieved from the Internet:.
Yuan H.C., et al., "Silicon Solar Cells with Front Hetero-Contact and Aluminum Alloy Back Junction", NREL Conference Paper CP-520-42566, 33rd IEEE Photovoltaic Specialists Conference, May 11-16, 2008, National Renewable Energy Laboratory, San Diego, California.
Zankovych S., et al., "Nanoimprint Lithography: Challenges and Prospects," Nanotechnology, 2001, vol. 12, pp. 1-95.
Office Action dated Aug. 23, 2016 for U.S. Appl. No. 14/613,585, 9 pages.
Notice of Allowance for U.S. Appl. No. 14/612,025 dated Oct. 19, 2016, 108 pages.
Notice of Allowance for U.S. Appl. No. 14/509,967 dated Oct. 24, 2016, 42 pages.
Notice of Allowance for U.S. Appl. No. 13/952,467 dated Sep. 28, 2016, 128 pages.
Notice of Allowance for U.S. Appl. No. 14/611,022 dated Oct. 26, 2016, 41 pages.
Notice of Allowance dated Oct. 5, 2016 for U.S. Appl. No. 14/887,050, 113 pages.
Notice of Allowance dated Oct. 7, 2016 for U.S. Appl. No. 14/213,953, 43 pages.
Office Action for U.S Appl. No. 14/597,151 dated Oct. 20, 2016, 52 pages.
Notice of Allowance for U.S. Appl. No. 14/383,079 dated Aug. 17, 2016, 71 pages.
Japanese Office Action mailed on Aug. 9, 2016 for Japanese Application No. 2014-513700, 8 pages (including translation).
Chinese Office Action mailed on Sep. 1, 2016 for Chinese Application No. 201380027469.8, 8 pages (including translation).
Office Action for U.S Appl. No. 14/588,136 dated Nov. 2, 2016, 132 pages.
Notice of Allowance for U.S. Appl. No. 14/692,677 dated Nov. 21, 2016, 97 pages.
Corrected Notice of Allowability dated Dec. 6, 2016 for U.S. Appl. No. 14/383,079, 33 pages.
Notice of Allowance for U.S. Appl. No. 14/194,499 dated Dec. 12, 2016, 125 pages.

* cited by examiner

US 9,570,683 B1

THREE-DIMENSIONAL TWO-TERMINAL MEMORY WITH ENHANCED ELECTRIC FIELD AND SEGMENTED INTERCONNECTS

CROSS-REFERENCE TO RELATED APPLICATIONS

The present application for patent is a continuation of U.S. patent application Ser. No. 14/588,202 entitled THREE-DIMENSIONAL TWO-TERMINAL MEMORY WITH ENHANCED ELECTRIC FIELD AND SEGMENTED INTERCONNECTS, filed Dec. 31, 2014 and that claims the benefit of U.S. provisional patent application No. 61/937,417 entitled SCALABLE SILICON BASED RESISTIVE MEMORY DEVICE and filed Feb. 7, 2014. Furthermore, the Ser. No. 14/588,202 application is a continuation-in-part of U.S. patent application Ser. No. 14/194,499 entitled THREE-DIMENSIONAL TWO-TERMINAL MEMORY WITH ENHANCED ELECTRIC FIELD and filed on Feb. 28, 2014 that claims the benefit of U.S. provisional patent application No. 61/859,090 entitled 3D RRAM WITH ENHANCED E-FIELD and filed Jul. 26, 2013, and the Ser. No. 14/588,202 application is a continuation-in-part of U.S. patent application Ser. No. 14/027,045 entitled A SUB-OXIDE INTERFACE LAYER FOR TWO-TERMINAL MEMORY filed on Sep. 13, 2013 and that claims the benefit of U.S. provisional patent application No. 61/786,100 filed Mar. 14, 2013 and claims the benefit of U.S. provisional patent application No. 61/712,171 filed Oct. 10, 2012—which Ser. No. 14/027,045 application is a continuation-in-part of U.S. patent application Ser. No. 13/525,096 filed Jun. 15, 2012 that claims the benefit of U.S. provisional patent application No. 61/503,477 filed on Jun. 30, 2011, is a continuation-in-part of U.S. patent application Ser. No. 13/586,815 filed Aug. 15, 2012 that claims the benefit of U.S. provisional patent application No. 61/620,561 filed on Apr. 5, 2012, is a continuation-in-part of U.S. patent application Ser. No. 13/585,759 filed Aug. 14, 2012, now U.S. Pat. No. 8,569,172, and is a continuation-in-part of U.S. patent application Ser. No. 13/912,136 filed Jun. 6, 2013, now U.S. Pat. No. 9,209,396, that claims the benefit of U.S. provisional patent application No. 61/786,058 filed Mar. 14, 2013. The entireties of the foregoing applications are hereby incorporated by reference herein in their respective entireties, and for all purposes.

INCORPORATION BY REFERENCE

The present application for patent hereby incorporates by reference in their respective entireties and for all purposes, each of the following: U.S. patent application Ser. No. 14/613,585 entitled SCALABLE SILICON BASED RESISTIVE MEMORY DEVICE and filed on Feb. 4, 2015, which claims the benefit of U.S. provisional application No. 61/937,417 filed Feb. 7, 2014, and U.S. patent application Ser. No. 14/587,711 entitled MONOLITHICALLY INTEGRATED RESISTIVE MEMORY USING INTEGRATED-CIRCUIT FOUNDRY COMPATIBLE PROCESSES and filed on Dec. 31, 2014, which claims the benefit of U.S. provisional application No. 61/937,412 filed Feb. 7, 2014.

TECHNICAL FIELD

This disclosure relates generally to a two-terminal memory device; for example, the disclosure describes a three-dimensional two-terminal memory cell having characteristics to provide an enhanced electric field and segmented interconnects.

BACKGROUND

Two-terminal memory represents a recent innovation within the field of integrated circuit technology. While much of two-terminal memory technology is in the development stage, various technological concepts for proposed two-terminal memory devices have been demonstrated by the inventors and are in one or more stages of verification to prove or disprove associated theories or techniques. The inventors believe that various two-terminal memory technologies (e.g., resistive-switching memory, magneto-resistive memory, ferroelectric memory, organic memory, phase-change memory, conductive bridging memory, and others) show compelling evidence to hold substantial advantages over competing technologies in the semiconductor electronics industry.

In particular with respect to resistive-switching memory, the inventors believe that resistive-switching memory cells can be configured to have multiple states having respective distinct resistance values. For instance, for a single bit cell, the restive-switching memory cell can be configured to exist in a relatively low resistance state or, alternatively, in a relatively high resistance state. Multi-bit cells might have additional states with respective resistances that are distinct from one another and distinct from the relatively low resistance state and the relatively high resistance state. The distinct resistance states of the resistive-switching memory cell represent distinct logical information states, facilitating digital memory operations. Accordingly, the inventors believe that arrays of many such memory cells can provide many bits of digital memory storage.

The inventors have been successful in inducing resistive-switching memory to enter one or another resistive state in response to an external condition. Thus, in transistor parlance, applying or removing the external condition can serve to program or de-program (e.g., erase) the memory. Moreover, depending on physical makeup and electrical arrangement, a resistive-switching memory cell can generally maintain a programmed or de-programmed state. Maintaining a state might require other conditions be met (e.g., existence of a minimum operating voltage, existence of a minimum operating temperature, and so forth), or no conditions be met, depending on the characteristics of a memory cell device.

The inventors have put forth several proposals for practical utilization of resistive-switching technology to include transistor-based memory applications. For instance, resistive-switching elements are often theorized as viable alternatives, at least in part, to metal-oxide semiconductor (MOS) type memory transistors employed for electronic storage of digital information. Models of resistive-switching memory devices provide some potential technical advantages over non-volatile FLASH MOS type transistors.

In light of the above, the inventors desire to continue developing practical utilization of two-terminal memory technology.

SUMMARY

The following presents a simplified summary of the specification in order to provide a basic understanding of some aspects of the specification. This summary is not an extensive overview of the specification. It is intended to neither identify key or critical elements of the specification nor delineate the scope of any particular embodiments of the specification, or any scope of the claims. Its purpose is to present some concepts of the specification in a simplified form as a prelude to the more detailed description that is presented in this disclosure.

Aspects of the subject disclosure provide for three-dimensional memory cells having enhanced electric field characteristics and/or segmented interconnects such as one or more segmented bitlines or segmented wordlines. In some embodiments, a two-terminal memory cell can be constructed from a layered stack of materials, where layered stack of materials in a vicinity of the memory cell are oriented at an angle away from a substrate surface upon which the layered stack of materials is constructed. In some aspects, the memory cell can be orthogonal to or substantially orthogonal to the substrate surface. In other aspects, the stack of materials can be less than orthogonal to the substrate surface, where the stack of materials forms an angle to an orthogonal direction that enhances an electric field or current of a memory cell formed by the stack of materials. Vias can be etched in the stack of layers to expose "sidewalls" of various layers in the stack of materials that are then segmented.

In alternative or additional aspects of the subject disclosure, a memory device is provided. The memory device can comprise a stack of layers arranged substantially along a first dimension normal to a surface of a substrate or a semiconductor wafer. The stack of layers can comprise at least one insulator layer comprising an electrical insulating material. The at least one insulator layer can be in alternating sequence with at least one electrode layer comprising an electrical conducting metal. A via structure can be etched to form segmented portions of one or more layers. The via structure can be situated between a first segmented portion of the at least one electrode layer and a second segmented portion of the at least one electrode layer. The via structure can comprise a resistive switching layer and a second electrode layer that differs from the at least one electrode layer. A memory cell can be situated at an intersection of the at least one electrode layer and the via structure. The memory cell can comprise the resistive switching layer situated between a first electrode (e.g., bottom electrode) that corresponds to the at least one electrode layer and a second electrode (e.g., top electrode) that corresponds to the second electrode layer.

In disclosed embodiments, a memory device with a floating interconnect (e.g., floating bitline or wordline) can be provided. The memory device can comprise a stack of layers arranged substantially along a first dimension normal to a surface of a substrate or a semiconductor wafer. The stack of layers can comprise at least one insulator layer comprising an electrical insulating material. The at least one insulator layer can be in alternating sequence with at least one electrode layer comprising an electrical conducting metal. A first via structure can be etched to form segmented portions of one or more layers. The first via structure can be situated between a first segmented portion of the at least one electrode layer and a second segmented portion of the at least one electrode layer. The first via structure can comprise a resistive switching layer and a second electrode layer that differs from the at least one electrode layer. A second via structure can be etched and situated between the second segmented portion and a third segmented portion of the least one electrode layer. The second via structure can comprise another resistive switching layer and another second electrode layer that differs from the at least one electrode layer.

A memory cell can be situated at an intersection of the at least one electrode layer and the first via structure or the second via structure. The memory cell can comprise the resistive switching layer or the other resistive switching layer situated between a first electrode (e.g., bottom electrode) that corresponds to the at least one electrode layer and a second electrode (e.g., top electrode) that corresponds to the second electrode layer.

In still other embodiments, there is provided a method of fabricating a memory cell with a segmented interconnect. The method can comprise forming a stack of layers comprising a set of insulator layers comprising an electrical insulating material and a set of electrode layers comprising an electrical conducting metal. The set of insulator layers can be situated in alternating sequence or pattern with the set of electrode layers. The method can further comprise etching a via in the stack of layers comprising removing a portion of at least one electrode layer of the set of electrode layers. The via can segment or divide the at least one electrode layer into a first portion and a second portion, exposing to the via a first surface of the first portion and a second surface of the second portion. The method can further include forming, within the via, a second electrode layer differing from the set of electrode layers and comprising another electrical conducting metal. The method can further comprise forming a switching layer between the second electrode layer and the first surface and between the second electrode layer and the second surface.

The following description and the drawings set forth certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

BRIEF DESCRIPTION OF THE DRAWINGS

Numerous aspects, embodiments, objects and advantages of the present invention will be apparent upon consideration of the following detailed description, taken in conjunction with the accompanying drawings, in which like reference characters refer to like parts throughout. In this specification, numerous specific details are set forth in order to provide a thorough understanding of this disclosure. It should be understood, however, that certain aspects of the subject disclosure may be practiced without these specific details, or with other methods, components, materials, etc. In other instances, well-known structures and devices are shown in block diagram form to facilitate describing the subject disclosure;

FIGS. 4 and 4A illustrate example two-terminal memory cells having enhanced electric field characteristics, in some embodiments.

DETAILED DESCRIPTION

Figure 1:
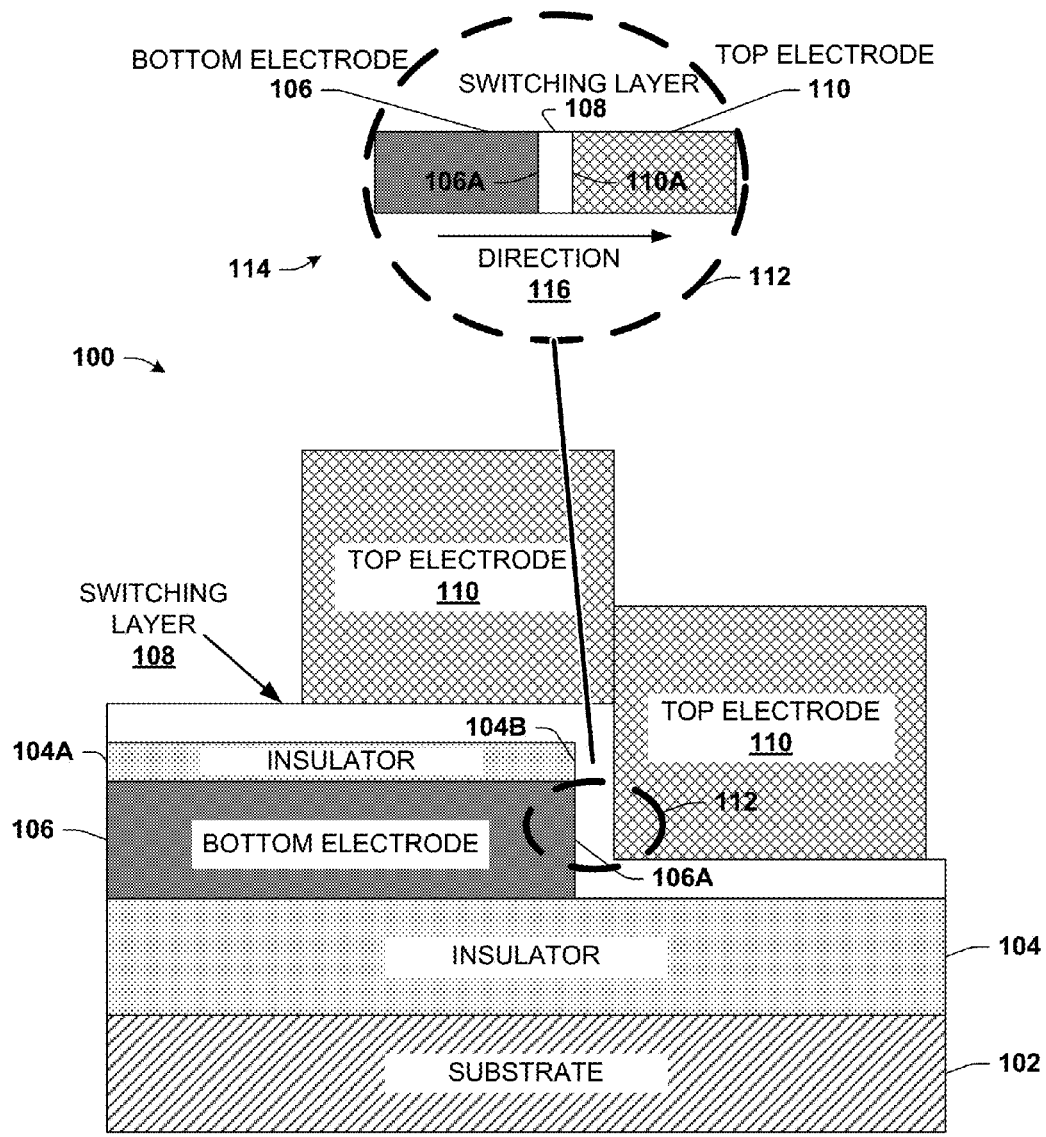
FIG. 1 depicts a block diagram of an example two-terminal memory cell according to various embodiments of this disclosure.

This disclosure relates to two-terminal memory cells employed for digital information storage. In some embodiments, the two-terminal memory cells can include a resistive technology, such as a resistive-switching two-terminal memory cells. Resistive-switching two-terminal memory cells (also referred to as resistive-switching memory cells or resistive-switching memory), as utilized herein, comprise circuit components having two conductive contacts (also referred to herein as electrodes or terminals) with an active region (also referred to as a switching layer or switching medium) between the two conductive contacts. The active region of the two-terminal memory device, in the context of resistive-switching memory, exhibits a plurality of stable or semi-stable resistive states, each resistive state having a distinct electrical resistance. Moreover, respective ones of the plurality of states can be formed or activated in response to a suitable electrical signal applied at the two conductive contacts. The suitable electrical signal can be a voltage value, a current value, a pulse width, a pulse height or current polarity, or the like, or a suitable combination thereof. An example of a resistive switching two-terminal memory device, though not exhaustive, can include a resistive random access memory (RRAM) currently being developed by the present assignee of the present patent application.

Embodiments of the subject disclosure can provide a filamentary-based memory cell. One example of a filamentary-based memory cell can comprise: a p-type or n-type silicon (Si) bearing layer (e.g., p-type or n-type polysilicon, p-type or n-type SiGe, etc.), a resistive switching layer (RSL) and an active metal layer for providing filament forming ions to the RSL. The p-type or n-type Si bearing layer can include a p-type or n-type polysilicon, p-type or n-type SiGe, or the like. The RSL (which can also be referred to in the art as a resistive switching media (RSM)) can comprise, e.g., an amorphous Si layer, a Si sub-oxide (e.g., SiOx wherein x has a value between 0.1 and 2), a silicon nitride, a silicon oxynitride (e.g. SiOxNy wherein x and y have a value between 0.1 and 1) and so forth. Examples of the active metal layer can include, among others: silver (Ag), gold (Au), titanium (Ti), titanium-nitride (TiN) or other suitable compounds of titanium, nickel (Ni), copper (Cu), aluminum (Al), chromium (Cr), tantalum (Ta), iron (Fe), manganese (Mn), tungsten (W), vanadium (V), cobalt (Co), platinum (Pt), and palladium (Pd). Other suitable conductive materials, as well as compounds or combinations of the foregoing or similar materials can be employed for the active metal layer in some aspects of the subject disclosure. Some details pertaining to embodiments of the subject disclosure similar to the foregoing example can be found in the following U.S. patent applications that are licensed to the assignee of the present application for patent: application Ser. No. 11/875,541 filed Oct. 19, 2007 and application Ser. No. 12/575,921 filed Oct. 8, 2009, each of which are incorporated by reference herein in their respective entireties and for all purposes.

It should be appreciated that various embodiments herein may utilize a variety of memory cell technologies, having different physical properties. For instance, different resistive-switching memory cell technologies can have different discrete programmable resistances, different associated program/erase voltages, as well as other differentiating characteristics. For instance, various embodiments of the subject disclosure can employ a bipolar switching device that exhibits a first switching response (e.g., programming to one of a set of program states) to an electrical signal of a first polarity and a second switching response (e.g., erasing to an erase state) to the electrical signal having a second polarity. The bipolar switching device is contrasted, for instance, with a unipolar device that exhibits both the first switching response (e.g., programming) and the second switching response (e.g., erasing) in response to electrical signals having the same polarity and different magnitudes.

Various embodiments of the present invention are "bipolar" devices, where a programming voltage and an erase voltage are of opposite polarity. Such embodiments are believed by the inventors to have an advantage over "unipolar" devices, where programming voltages and erase voltages are of the same polarity. With unipolar devices, conduction (e.g. programming) of a layer occurs at a high voltage with limited current flow, and a disruptive heating process (e.g. erasing) of a layer occurs at a lower voltage but with much higher current. Some disadvantage to unipolar devices may include that erasing of memories using such Joule heating may greatly limit the memory integration with other devices and greatly limit memory density. Additionally, some embodiments of the present invention have a relatively low programming voltage. In some cases the programming voltage is between about 0.5 volts to about 1.5 volts; between about 0 volts to about 2 volts; between about 0.5 volts to about 5 volts, or the like.

Where no specific memory cell technology or program/ erase voltage is specified for the various aspects and embodiments herein, it is intended that such aspects and embodiments incorporate any suitable memory cell technology and be operated by program/erase voltages appropriate to that technology, as would be known by one of ordinary skill in the art or made known to one of ordinary skill by way of the context provided herein. It should be appreciated further that where substituting a different memory cell technology would require circuit modifications that would be known to one of ordinary skill in the art, or changes to operating signal levels that would be known to one of such skill, embodiments comprising the substituted memory cell technology(ies) or signal level changes are considered within the scope of the subject disclosure.

In various embodiments of the present disclosure, upon fabrication of a memory device, as described herein, and before functionally performing programming and erase operations, some embodiments can be conditioned. Conditioning can be implemented via an initial forming signal (e.g., forming voltage, forming current, forming field, etc.) causing a memory cell to become programmed for a first instance following fabrication. In particular, in some embodiments, an initial forming signal can be applied between a top electrode of the memory cell and a bottom electrode of the memory cell to facilitate subsequent formation of a conductive filament within the memory cell, for instance. In initial experiments conducted by the inventors, the initial forming signal required a higher magnitude than an associated programming signal following conditioning of the memory cell. As an example, if a program voltage associated with a two-terminal memory cell were about 3 volts, conditioning the memory cell may have involved an initial forming voltage of about 5 volts. A disadvantage to a memory device having such characteristics is that two different types of driving voltage circuits might be required to drive the memory cell, one circuit for providing the initial forming voltage (which might never be used again, wasting chip space), and a second circuit for providing the programming voltage. Various embodiments of the present disclosure, however, can have an initial forming voltage that is greatly reduced compared to early experiments of two-terminal memory cells conducted by the inventors. In such embodiments, the initial forming voltage can be within a range of about the same voltage to about 1 volt higher than the associated programming voltage. In other embodiments, the initial forming voltage can be within a range of about the same as the associated programming voltage to about 0.5 volts greater than the associated programming voltage. Advantages to various embodiments include that circuitry providing the forming signal can be greatly simplified, reduced in circuit area, or folded into the programming voltage circuitry thereby avoiding additional circuitry dedicated to the initial forming signal.

The inventors of the present application are of the opinion that two-terminal memory devices, such as resistive-switching memory devices, have various advantages in the field of electronic memory. For example, resistive-switching technology can generally be small, consuming silicon area on the order of 4 $F^2$ per resistive-switching device where F stands for the minimum feature size of a technology node (e.g., a memory cell comprising two resistive-switching devices would therefore be approximately 8 $F^2$ if constructed in adjacent silicon space). Non-adjacent resistive-switching devices, e.g., stacked above or below each other, can consume as little as 4 $F^2$ for a set of multiple non-adjacent devices. Moreover, multi-bit devices having two, three or more bits per memory cell can result in even greater densities in terms of bits per silicon area consumed. These advantages can lead to great semiconductor component density and memory density, and low manufacturing costs for a given number of digital storage bits. The inventors also believe that resistive-switching memory can exhibit fast programming speed and low programming current, and smaller cell sizes enabling greater component densities. Other benefits include non-volatility, having the capacity to store data without continuous application of power, and capacity to be built between metal interconnect layers, enabling resistive-switching based devices to be usable for two-dimension as well as three-dimension semiconductor architectures.

The inventors of the subject application are familiar with additional non-volatile, two-terminal memory structures. For example, ferroelectric random access memory (RAM) is one example. Some others include magneto-resistive RAM, organic RAM, phase change RAM and conductive bridging RAM, and so on. Two-terminal memory technologies have differing advantages and disadvantages, and trade-offs between advantages and disadvantages are common. For instance, various subsets of these devices can have relatively fast switching times, good durability, high memory density, low cost fabrication, long life, or the like, or combinations thereof. Meanwhile, the various subsets can also be difficult to fabricate, have compatibility problems with many common CMOS fabrication processes, poor read performance, small on/off resistance ratios (e.g., leading to small sensing margin) or poor thermal stability, as well as other problems. Though resistive-switching memory technology is considered by the inventors to be one of the best technologies having the most benefits and least detriments, other two-terminal memory technologies can be utilized for some of the disclosed embodiments, where suitable to one of ordinary skill in the art.

To program a filamentary-based resistive-switching memory cell, a suitable program voltage can be applied across the memory cell causing a conductive filament to form through a relatively high electrical resistance portion of the memory cell. This causes the memory cell to change from a relatively high resistive state, to a relatively low resistive state. In some resistive-switching devices, an erase process can be implemented to deform the conductive filament, at least in part, causing the memory cell to return to the high resistive state from the low resistive state. This change of state, in the context of memory, can be associated with respective states of a binary bit. For an array of multiple memory cells, a word(s), byte(s), page(s), block(s), etc., of memory cells can be programmed or erased to represent respective zeroes or ones of binary information, and by retaining those states over time in effect storing the binary information.

Viewed broadly, embodiments of the present disclosure have the potential to replace other types of memory existing in the marketplace due to the numerous advantages over competing technologies. However, the inventors of the subject disclosure believe that what is sometimes referred to as the sneak path problem is an obstacle for resistive switching memory cells to be used in high density data storage applications. A sneak path (also referred to as "leak path") can be characterized by undesired current flowing through neighboring memory cells of a memory cell to be accessed, which can be particularly evident in large passive memory crossbar arrays, particularly in connection with cells in an "on" state (relatively low resistance state).

In more detail, sneak path current can result from a voltage difference across adjacent or nearby bitlines of a memory array. For instance, a memory cell positioned between metal inter-connects (e.g., bitlines and wordlines) of a crossbar array may not be a true electrical insulator, and thus a small amount of current can flow in response to the aforementioned voltage differences. Further, these small amounts of current can add together, particularly when caused by multiple voltage differences observed across multiple metal inter-connects. During a memory operation, sneak path current(s) can co-exist with an operating signal (e.g., program signal, erase signal, read signal, etc.) and reduce operational margin, for example, the current and/or voltage margin between reading a programmed cell (associated with a first physical state) and an erased cell (associated with a second physical state). For instance, in conjunction with a read operation on a selected memory cell, sneak path current sharing a read path with the selected memory cell can add to a sensing current, reducing sensing margin of read circuitry. In addition to increased power consumption and joule heating, and the detriments related thereto, sneak path currents can lead to memory cell errors—a problem that can undermine reliability in the memory itself. Some of the disclosed embodiments are configured to mitigate sneak path currents in adjacent memory cells, or memory cells sharing a bitline, wordline, or the like.

Various embodiments of the present disclosure provide for a two-terminal memory device comprised of a layered stack of materials oriented at an angle to a substrate surface upon which the two-terminal memory device is constructed. In various embodiments, the layered stack of materials can comprise at least a switching layer positioned between a bottom electrode and top electrode of the two-terminal memory device. In a further embodiment, the stack of layers can additionally comprise a select layer. In another embodiment, the stack of layers can also comprise a conductive layer. In yet other embodiments, the stack of layers can further comprise a switching layer. In at least one embodiment, the stack of layers can further comprise a barrier layer. In still other embodiments, the stack of layers can comprise a suitable combination of the foregoing layers. In alternative or additional embodiments, the layered stack of materials can be orthogonal to the substrate surface; in other aspects the layered stack of materials can be substantially orthogonal to the substrate surface. In one or more embodiments, the layered stack of materials can be constructed to deviate from an orthogonal direction by a positive or negative angle configured to enhance electric current or electric field for an associated memory cell (or a subset thereof). The positive angle can be ten degrees or less, in some embodiments, thirty degrees or less in other embodiments, and forty-five degrees or less in still other embodiments.

In various disclosed embodiments, the substrate can be a complementary metal oxide semiconductor (CMOS) substrate having one or more CMOS-compatible devices. In one or more embodiments, disclosed memory device(s) can be resistive-switching two-terminal memory devices compatible in part or in full with existing CMOS fabrication techniques. Accordingly, some or all of the disclosed memory devices can be fabricated with low fabrication costs, limited retooling, and the like, resulting in high density and high efficiency two-terminal memory that the inventors believe can be fabricated and brought to market with fewer fabrication problems than the inventors believe to exist with other memory devices.

Referring now to the drawings, FIG. 1 illustrates a block diagram of an example memory stack 100 providing a memory device according to various aspects of the subject disclosure. Memory stack 100 can comprise a substrate 102 (diagonal shading) at a first layer of memory stack 100. Substrate 102 can be a CMOS-related substrate compatible with one or more CMOS devices. In some disclosed embodiments, substrate 102 can comprise a plurality of CMOS devices (not depicted) fabricated therein or thereon. Above substrate 102 is an electrical insulator 104. Electrical insulator 104 can provide electrical isolation for one or more active components (e.g., memory cells, bitlines, wordlines, etc.) of memory stack 100. As depicted by FIG. 1, electrical insulator 104 is differentiated by a light shading.

In addition to the foregoing, memory stack 100 can comprise a bottom electrode 106 above electrical insulator 104. Bottom electrode 106 is configured to cover a subset of the top surface of electrical insulator 104. For instance, where substrate 102 and electrical insulator 104 are deployed over a relatively large portion of a semiconductor chip (e.g., a few square centimeters in area), bottom electrode 106 can be within a subset of the semiconductor chip on the order of several square micrometers, or a few hundred square nanometers. As another example, bottom electrode 106 can be on the order of a few multiples of a minimum technology feature size, or less. Thus, bottom electrode 106 can be of an area on the order of a few two-terminal memory cells, or less.

Above bottom electrode 106 is a second electrical insulator 104A. Electrical insulator 104A can have a perpendicular or oblique surface 104B within the same plane or substantially coplanar with a perpendicular or oblique surface 106A of bottom electrode 106 (e.g., see the expanded cutout of a perpendicular or oblique two-terminal memory cell 112), in some embodiments. In further embodiments, a switching layer 108 is provided that extends along the perpendicular or oblique surface 106A of bottom electrode 106. In one optional embodiment, switching layer 108 can further extend along perpendicular or oblique surface 104B of electrical insulator 104A. In some embodiments, switching layer 108 can extend further along a top surface of electrical insulator 104 or electrical insulator 104A, or both, as depicted. However, in still other embodiments, switching layer 108 can be confined to a region between bottom electrode 106 and top electrode 110, and extending along perpendicular or oblique surface 106A of bottom electrode 106. Switching layer 108 can be configured to be set to, and retain, one or more distinguishable states. The states can be distinguished (e.g., measured, sensed . . . ) according to values or ranges of values of a physical metric related to a particular two-terminal memory technology employed for memory stack 100. For instance, in the case of resistive-switching memory, respective states can be distinguished according to discrete electrical resistance values (or ranges of values) of switching layer 108.

A cutout 112 of FIG. 1 illustrates a memory cell 114 of memory stack 100. Memory cell 114 is arranged from bottom electrode 106 to top electrode 110 along a direction 116 that forms an angle, e.g. orthogonal, substantially orthogonal, oblique or other angle, relative to a normal direction of a plane comprising the top surface of substrate 102 (e.g., see FIG. 3, infra, substrate normal direction 301). In other disclosed embodiments, direction 116 can be less than orthogonal to the normal direction of the top surface of substrate 102, such as zero to ten degrees less than orthogonal, ten to twenty degrees from orthogonal, ten to thirty degrees from orthogonal, forty-five or fewer degrees from orthogonal, or other suitable angles or ranges thereof.

As depicted by cutout 112, memory cell 114 comprises bottom electrode 106 on a right side thereof, having a perpendicular or oblique surface 106A. Adjacent to bottom electrode 106 and perpendicular or oblique surface 106A, is switching layer 108. Adjacent to switching layer 108 is top electrode 110, having a perpendicular or oblique surface 110A on a left side thereof. As depicted in FIG. 1, the arrangement of bottom electrode 106, switching layer 108, and top electrode 110 is along a direction 116 orthogonal to or substantially orthogonal to the normal direction of the top surface of substrate 102. Said differently, direction 116 is parallel to or oblique to a plane comprising a top surface of substrate 102. This is different from other concepts proposed by the inventors for a monolithic memory cell stack, e.g., in which layers of the stack are arranged along a direction substantially parallel to the normal direction of the top surface of an underlying semiconductor substrate.

The inventors of the present application believe the memory cell embodiments disclosed herein can provide several advantages to existing memory cell technologies. First, memory cell size can be controlled at least in part by electrode thickness. The inventors believe that controlling nanometer scale film thickness is generally easier than controlling a nanometer scale lateral dimension of a film. Accordingly, memory cell density can be increased by reducing film thickness for memory cell film layers in a stacked memory technology. For instance, in at least one embodiment, switching layer 108 can have a thickness within a range of about 1 nm to about 50 nm. This can lead to reduced leakage current, can confine conductive filaments of resistive-switching memory technologies to narrower regions, can improve performance and provide compact, three-dimensional memory cell integration, and the like. In further embodiments described herein, because of the smaller memory cell size, the operation voltage of memory cells can be reduced. Further, operation speed of memory cells can be improved by employing techniques that enhance electric current density or electric field associated with a memory cell such as that depicted by memory cell 114.

Various materials can be selected for bottom electrode 106, switching layer 108 and top electrode 110, according to different embodiments. In some embodiments, bottom electrode 106 can be a patterned bottom electrode formed from a metal such as W, Ti, TiN, TiW, Al, Cu, Ta, TaN, WN, TiAlN and so forth. Additionally, or instead, patterned bottom electrode 10 may include a conductive semiconductor such as a p-type Si, a p-type poly Si, an n-type Si, an n-type poly Si, a SiGe compound, a polycrystalline SiGe compound, a p or n-type SiGe or polycrystalline SiGe, or the like, or a suitable combination thereof.

In some embodiments, switching layer 108 may include an amorphous silicon layer (not intentionally doped), having intrinsic properties. Additionally, or instead, switching layer 108 may include a metal oxide (e.g. TiOx, AlOx, ZnO), $SiO_2$, $SiO_x$, $SiGeO_x$ (where x is a real number greater than 0 and less than 2), a chalcogenide, a metal oxide, a solid electrolyte, silicon nitride, or the like, or a suitable combination thereof.

In various embodiments, top electrode 110 can be a patterned top electrode including materials such as Cu, Ag, Ti, Al, W, Pd, Pt, Ni, Co, or the like, or a suitable combination thereof. These materials are configured to generate metallic ions at approximately the common interface with switching layer 108 upon application of a voltage across bottom electrode 106 and top electrode 110. As described herein, in some embodiments, the formation of metallic filaments within switching layer 108 results from the movement of metallic ions from the common interface between top electrode 110 and switching layer 108 into switching layer 108 upon application of an ionizing voltage. Upon removal of the ionizing voltage, the metallic ions become neutral metal particles that are trapped within crystal defects of switching layer 108. The metallic filament is formed from the trapped metal particles.

In some embodiments, the materials used for bottom electrode 106 and top electrode 110 may be reversed. Accordingly, metallic ions may be formed at approximately the common interface with switching layer 108 upon application of a (ionizing) voltage across bottom electrode 106 and top electrode 110.

Figure 2:
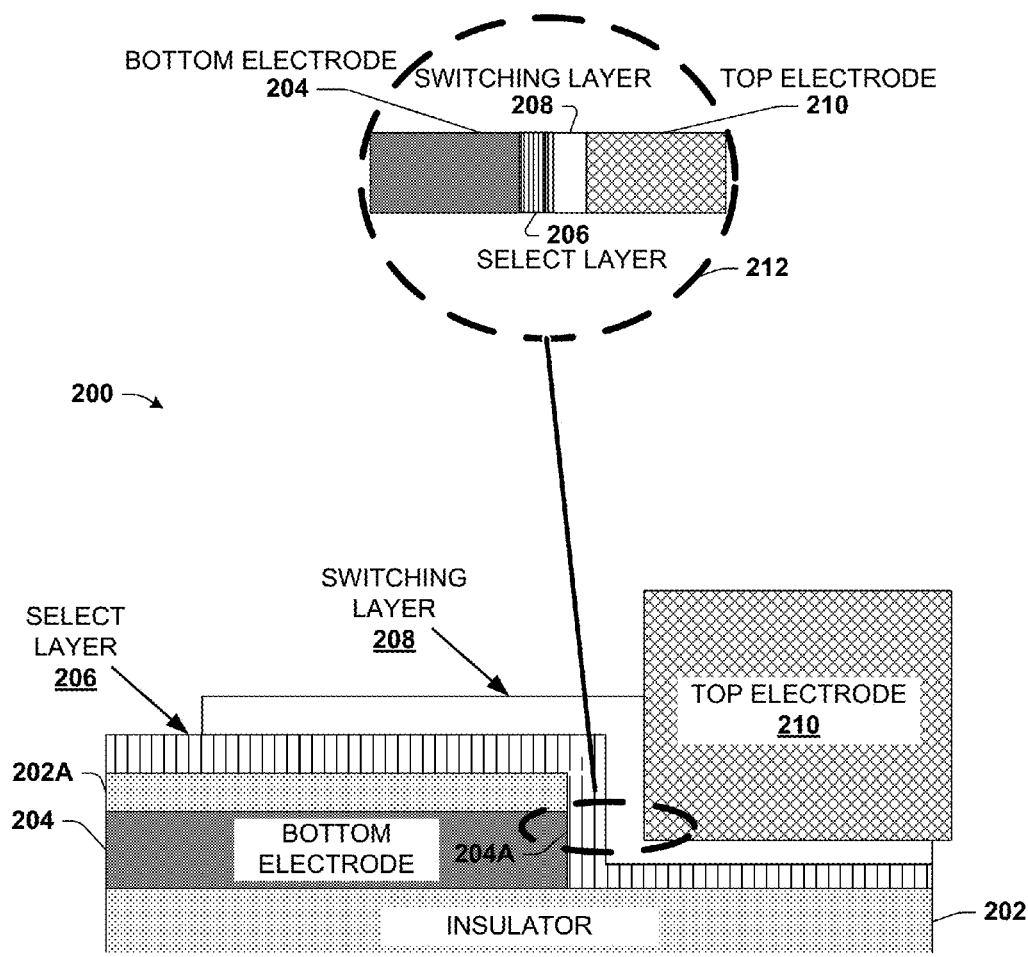
FIG. 2 illustrates a block diagram of another example two-terminal memory cell according to additional disclosed embodiments.

FIG. 2 illustrates a block diagram of an alternative example memory device 200 of the subject disclosure. Memory device 200 can substantially similar to memory stack 100 of FIG. 1, supra, except where described differently below, in one embodiment. In other embodiments, memory device 200 can deviate from memory stack 100 in details other than those explicitly described herein (e.g., in composition(s), dimension(s), etc.). In other embodiments, memory device 200 can be similar in some respects and different in others as compared with memory stack 100.

Memory device 200 can comprise an electrical insulator 202, optionally above a substrate layer (not depicted). Above insulator layer 202 is a bottom electrode 204. Bottom electrode 204 extends laterally over a subset of a top surface of insulator 202. In at least one embodiment, the subset can comprise an area on the order of one or more memory cells (e.g., two memory cells, four memory cells, and so forth), though in other embodiments the subset can be a larger area (e.g., a page(s) of memory cells, a block(s) of memory cells, or other suitable group of memory cells). Bottom electrode 204 has a top surface below a second insulator layer 202A, and a perpendicular or oblique surface 204A on a right side of bottom electrode 204. A select layer 206 is layered above second insulator layer 202A and adjacent to the perpendicular or oblique surface 204A of bottom electrode 204 and second insulator layer 202A. Select layer 206 can extend across a top surface of insulator 202 and second insulator layer 202A, as depicted, or can be approximately confined in the perpendicular or oblique surface regions (e.g., confined to being approximately adjacent with perpendicular or oblique surface 204A of bottom electrode 204), described above. Additionally, a switching layer 208 is positioned above select layer 206, and adjacent to the perpendicular or oblique portion of select layer 206. Switching layer 208 can extend across a top surface of select layer 206 above the top surface of insulator 202 or above the top surface of insulator 202A. A top electrode 210 is positioned adjacent to switching layer 208. In other embodiments, switching layer 208 and select layer 206 can be constrained primarily within a region between top electrode 210 and bottom electrode 204 (e.g., perpendicular or oblique to a plane comprising a top surface of the substrate layer of memory device 200), and need not extend to a top surface of insulator 202 or insulator layer 202A.

A cutout region 212 depicts a region of memory device 200 that forms, for example, a perpendicular memory cell, an oblique memory cell, or like nomenclature. Cutout region 212 is expanded as depicted, illustrating the perpendicular/oblique memory cell. Particularly, bottom electrode 204 is at a left side of the perpendicular/oblique memory cell, adjacent to a portion of select layer 206. On a right side of the portion of select layer 206 is a portion of switching layer 208 (e.g., a deposited material layer, an oxidized material layer, etc.), adjacent to top electrode 210. A suitable program signal (e.g., voltage, current, electric field, and the like) applied across top electrode 210 and bottom electrode 204 can program the perpendicular/oblique memory cell to a first memory state (e.g., a first resistance value, a first resistance value from a plurality of resistance values). A suitable erase signal (e.g., voltage, current, electric field, etc.) applied across top electrode 210 and bottom electrode 204 can erase the perpendicular/oblique memory cell to an erase state (e.g., a second resistance value).

In one or more embodiments, top electrode 210 can be configured to be ionized at an interface of switching layer 208 and top electrode 210 in response to the program signal, and switching layer 208 can be configured to be at least in part permeable to ions of top electrode 210. An electric field associated with the program signal can cause ions of top electrode 210 to migrate within switching layer 208, reducing electrical resistance of switching layer 208 to a lower resistance state. In some embodiments, ions migrating within switching layer 208 can form a conductive filament within switching layer 208. The conductive filament can have a length dimension that extends substantially across a thickness of switching layer 208 between top electrode 210 and select layer 206 (and bottom electrode 204). The erase signal can cause ions having migrated within switching layer 208 to at least in part migrate back toward top electrode 210, increasing the electrical resistance of switching layer 208 to a high resistance state. For instance, the erase signal can cause at least a partial deformation of the conductive filament within switching layer 208.

Examples of suitable materials for select layer 206 can comprise a metal oxide, Ti, $TiO_2$, TiOx, $Al_2O_3$, AlOx, $HfO_2$, HfOx, oxide, $SiO_2$, SiOx, $WO_3$, WOx, poly Si, poly SiGe, poly Si, poly SiGe, a non-linear element, a diode, or the like, or a suitable combination thereof. In further embodiments, select layer 206 can have a thickness within a range of about 1 nanometers (nm) to about 50 nm. In some embodiments, resistive switching layer 208 can have a thickness within a range of about 2 nm to about 50 nm.

Figure 3:
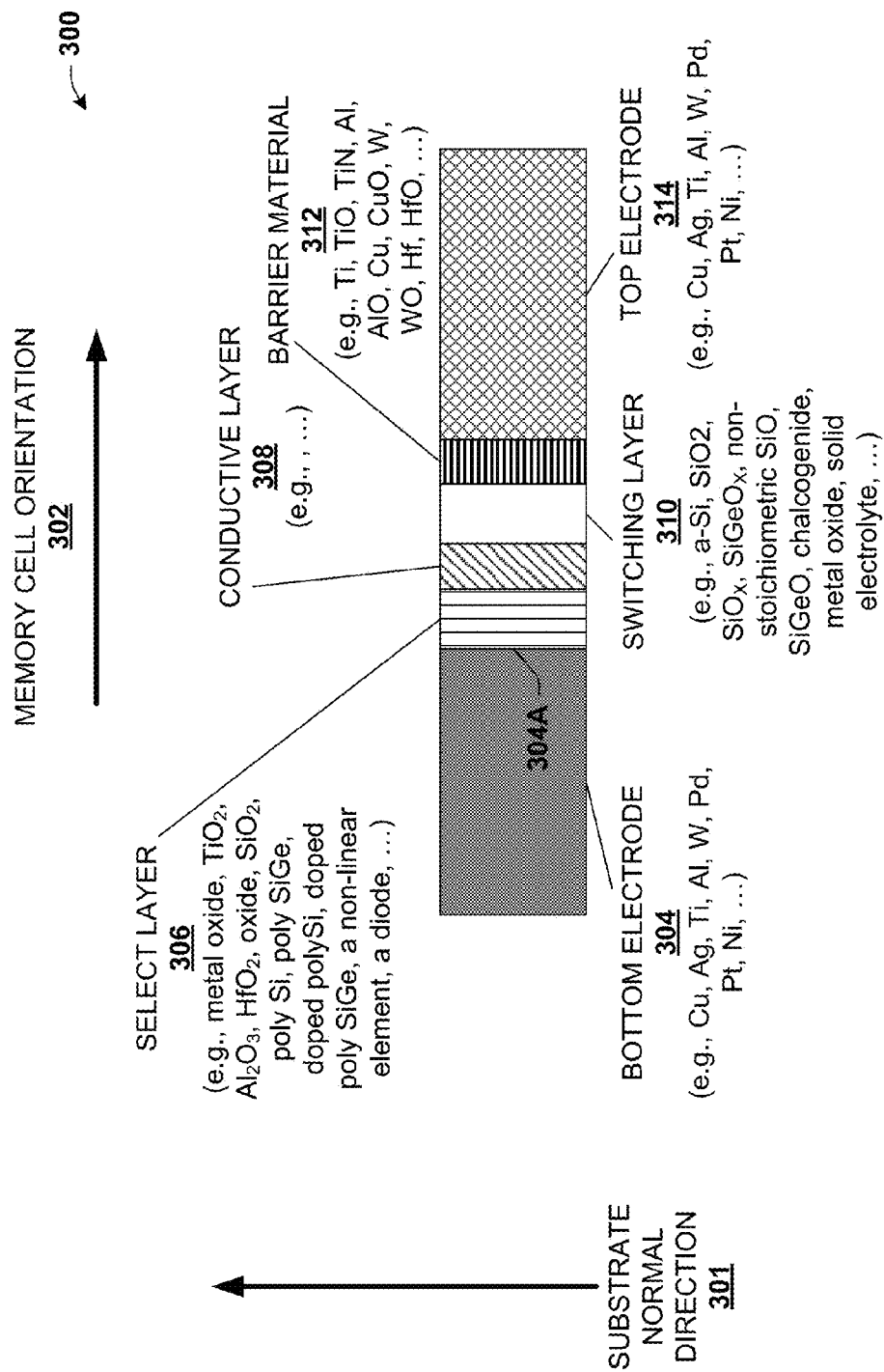
FIG. 3 depicts a block diagram of yet another example two-terminal memory cell, according to further embodiments.

FIG. 3 depicts a block diagram of a sample memory cell 300 according to alternative or additional embodiments of the subject disclosure. Memory cell 300 can be a two-terminal memory cell, in various embodiments. In at least one embodiment, memory cell 300 can be a resistive-switching two-terminal memory technology. Additionally, memory cell 300 can be fabricated in part or in whole in conjunction with a CMOS substrate (not depicted) utilizing one or more CMOS-compatible fabrication processes.

In various embodiments, memory cell 300 can comprise a sequence of adjacent materials arranged along a direction 302 that is non-parallel with a normal direction 301 of a top surface of a CMOS substrate. The direction 302 can form an orthogonal angle or a substantially orthogonal angle to normal direction 301, in some embodiments. Although memory cell 300 is arranged in a direction 302 (e.g., horizontally from left to right) that is orthogonal to normal direction 301 in the embodiment(s) depicted by FIG. 3, in other embodiments, the direction 302 can form a different angle to normal direction 301. For instance, the angle can be between about forty five degrees and about ninety degrees to the normal direction in various embodiments (e.g., forty five degrees, fifty degrees, sixty degrees, seventy five degrees, eighty degrees, eighty five degrees, or some other suitable angle).

Memory cell 300 can comprise a first patterned electrode that serves as a bottom electrode 304 for memory cell 300 (dark shaded block, on the left side of memory cell 300). Bottom electrode can be comprised of Cu, Ag, Ti, Al, W, WN, Pd, Pt, Ni, TiN, TiW, Ta, TaN or an electrically similar material, or a suitable combination thereof. Bottom electrode 304 has a bottom a perpendicular or oblique surface 304A (e.g., right side surface) serving as a first electrical contact for memory cell 300. In other embodiments, memory cell 300 can be oriented in an opposite fashion as depicted by FIG. 3; for instance, bottom electrode can be on a right side of memory cell 300 in some embodiments, such that a different perpendicular or oblique surface (e.g., left side surface) serves as the first electrical contact (e.g., see FIG. 4A, infra).

Adjacent to perpendicular or oblique surface 304A of bottom electrode 304, memory cell 300 can comprise a select layer 306 (vertical shaded block on a right side of bottom electrode 304). Select layer 306 can be formed of a suitable metal oxide, $TiO_2$, TiOx, $Al_2O_3$, AlOx, $HfO_2$, HfOx, a suitable oxide, $SiO_2$, SiOx, $WO_3$, WOx, poly Si, poly SiGe, doped poly Si, doped poly SiGe, a non-linear element, a diode, or the like, or a suitable combination thereof. Select layer 306 can serve to activate or deactivate memory cell 300 for a memory operation, in one or more embodiments. For instance, by controlling a signal applied to select layer 306 in a first manner (e.g., a first bias, a first current, a first electric field, and so forth) memory cell 300, as well as other memory cells (not depicted) connected to select layer 306 can be activated for a memory operation (e.g., program, erase, write, and the like). By controlling the signal applied to select layer 306 in a second manner (e.g., a second bias, a second current, a second electric field, etc.) memory cell 300 (and other memory cells connected to select layer 304) can be deactivated from memory operations, or current flow through the device can be controlled. In various embodiments, select layer 304 can have a thickness between about 1 nm and about 50 nm.

In at least one disclosed embodiment, memory cell 300 can include a (optional) conductive layer 308 (horizontally shaded block on a right side of select layer 306). Conductive layer 308 can be adjacent to select layer 306, as depicted. Additionally, conductive layer 308 can be comprised of an electrically conductive material (relative to, for instance, a switching layer 310). Examples of a suitable electrically conductive material for conductive layer 308 can include a suitable metal, a suitable doped silicon, doped silicon germanium, or the like.

In addition to the foregoing, memory cell 300 can comprise a switching layer 310 (non-shaded block on a right side of conductive layer 308). Switching layer 310 can be comprised of a suitable material that is electrically resistive (compared, for example, to conductive layer 308, or bottom electrode 304). In addition, the suitable material can be at least in part permeable to ions associated with memory cell 300 (e.g., ions of a top electrode 314, see below). In some embodiments, the suitable material can comprise metal oxide, amorphous Si, $SiO_2$, $SiO_x$ (where x is a number greater than 0 and less than 2), $SiGeO_x$, a chalcogenide, a metal oxide, a solid electrolyte, or another suitable electrically resistive or ion-permeable material, or a suitable combination thereof. In various embodiments of the subject disclosure, switching layer 310 can have a thickness between about 2 nm to about 50 nm. In at least one embodiment, the lower range limit for the thickness of switching layer 310 can be as small as about 1 nm.

In alternative or additional embodiments of the subject disclosure, memory cell 300 can comprise a (optional) barrier material 312 (horizontal shaded block on a right side of switching layer 310) configured, for example, to limit excessive injection of metal ions from the top electrode 314 into switching layer 310, or configured to reduce diffusion of the top electrode 314 into the switching layer 310 during fabrication of memory cell 300, or configured as an oxygen diffusion barrier layer, or the like. Control over limiting excess injection of metal ions or reducing diffusion of top electrode 314 can be based on material(s) selected for barrier material 312, thickness of barrier material 312, or the like, or a suitable combination thereof. Barrier material 312 can be an electrical conductor or semiconductor, in one or more disclosed aspects. Examples of suitable materials for barrier material 312 can include Ti, TiOx, TiN, Al, AlOx, Cu, CuOx, W, WOx, Hf, HfOx, TaN, W—Ti or the like, or a suitable combination thereof.

Memory cell 300 can comprise a top electrode 314 (cross-hatch shaded block on a right side of barrier material 312). Top electrode 314 can be configured to be ionized (e.g., at a boundary of top electrode 314 and switching layer 310, or a boundary of top electrode 314 and barrier material 312, or a boundary of barrier material 312 and switching layer 310, etc.) in response to a suitable bias applied to memory cell 300. Ions of top electrode 314 can respond to the suitable bias by migrating within switching layer 310. These ions can form a conductive filament within switching layer 310 that can set memory cell 300 into a first resistance state having a relatively low electrical resistance. In response to a second suitable bias (e.g., a reverse bias as compared with the suitable bias, or a bias of same polarity but different magnitude as the suitable voltage), the conductive filament can at least in part be deformed within switching layer 310, causing memory cell 300 to have a second resistance state, with relatively high electrical resistance. Examples of suitable materials for top electrode 314 can include suitable electrical conductors. For instance, examples of a suitable electrical conductor can comprise Cu, Ag, Ti, Al, W, Pd, Pt, Co or Ni, or a similar electrical conductor capable of being ionized in response to an applied bias, or a suitable combination thereof.

According to various embodiments, memory cell 300 can comprise one or more of the following features. In one example, a feature size of memory device 300 can be larger than a thickness of switching layer 310. In another example, a conductive filament formed within switching layer 310 in response to a suitable program bias can extend along a similar direction as the direction along which the sequence of adjacent materials of memory cell 300 are arranged (e.g., along or substantially along direction 302), as discussed above. The similar direction can be orthogonal or substantially orthogonal to a normal direction 301 of a top surface of a CMOS substrate associated with memory cell 300, in some embodiments. In other examples, the similar direction can form an angle to the normal direction between about forty five degrees and about ninety degrees, or another suitable angle. In some embodiments, the perpendicular or oblique surface 304A of bottom electrode 304, and the respective perpendicular/oblique surface(s) of select layer 306, conductive layer 308, switching layer 310, barrier material 312 or top electrode 314 can be non-perpendicular to a bottom surface of bottom electrode 304 or top electrode 314, deviating from a perpendicular direction by an angle. This angle can enhance electric current or electric field of memory cell 300, facilitating operation of memory cell 300 with relatively low bias, low current, etc.

Figure 4:
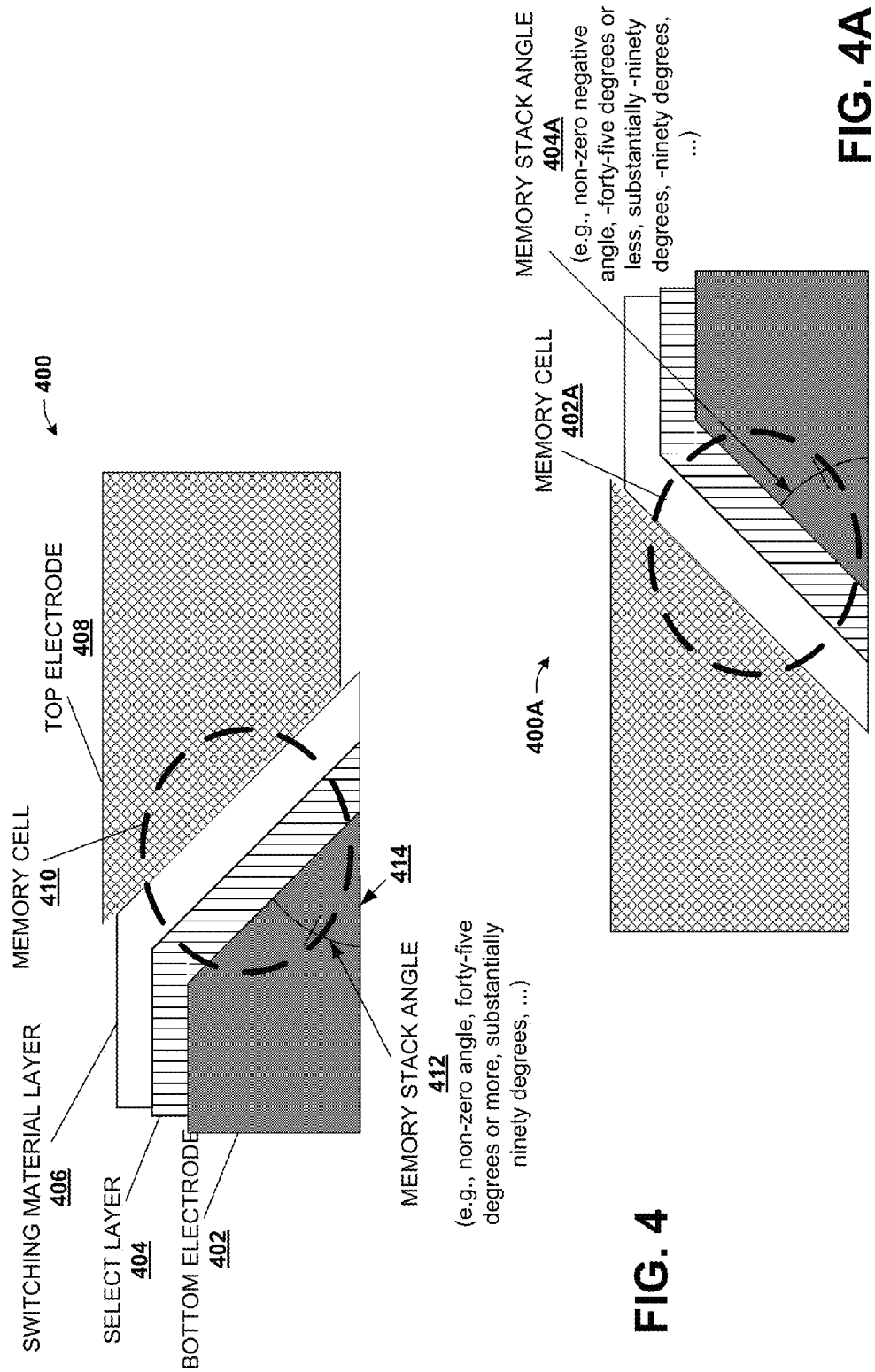

FIGS. 4 and 4A illustrate block diagrams of example oblique memory devices 400 and 400A, respectively, according to alternative or additional embodiments of the subject disclosure. Referring first to FIG. 4, memory device 400 can comprise a bottom electrode 402 (dark shading), a select layer 404, switching material layer 406 and a top electrode 408. A memory cell 410 of oblique memory device 400 is delineated by the dashed oval. As depicted, bottom electrode 402 has an oblique surface on a right side of bottom electrode 402 having a memory stack angle 412 with respect to a bottom surface 414 of bottom electrode 402. Memory stack angle 412 can serve to enhance an electric field or electric current observed by memory device 400 at a bottom right corner of bottom electrode 402 in response to an applied bias across bottom electrode 402 and top electrode 408. This enhanced electric field can provide improved switching performance (e.g., reduced operation voltage, improved program times, erase times, write times, uniform voltage and current distribution within a wafer or between wafers, etc.) for memory device 400, among other benefits. Memory stack angle 412 can be a non-zero angle in at least one embodiment, a forty-five degree or greater angle in other embodiments, a substantially ninety degree angle in still other embodiments, or another suitable angle.

Oblique memory device 400A illustrates an alternative arrangement for a memory cell according to the subject disclosure. As depicted, oblique memory device 400A has a bottom electrode and top electrode reversed in horizontal orientation with respect to oblique memory device 400, supra. Likewise, a select layer and switching layer are reversed in horizontal orientation with respect to oblique memory device 400. An oblique memory cell 402A is depicted by the dashed oval cutout. Oblique memory cell 402A forms a memory stack angle 404A to a bottom surface of the bottom electrode of oblique memory device 400A, in a similar fashion as described above for oblique memory device 400, supra.

Figure 5:
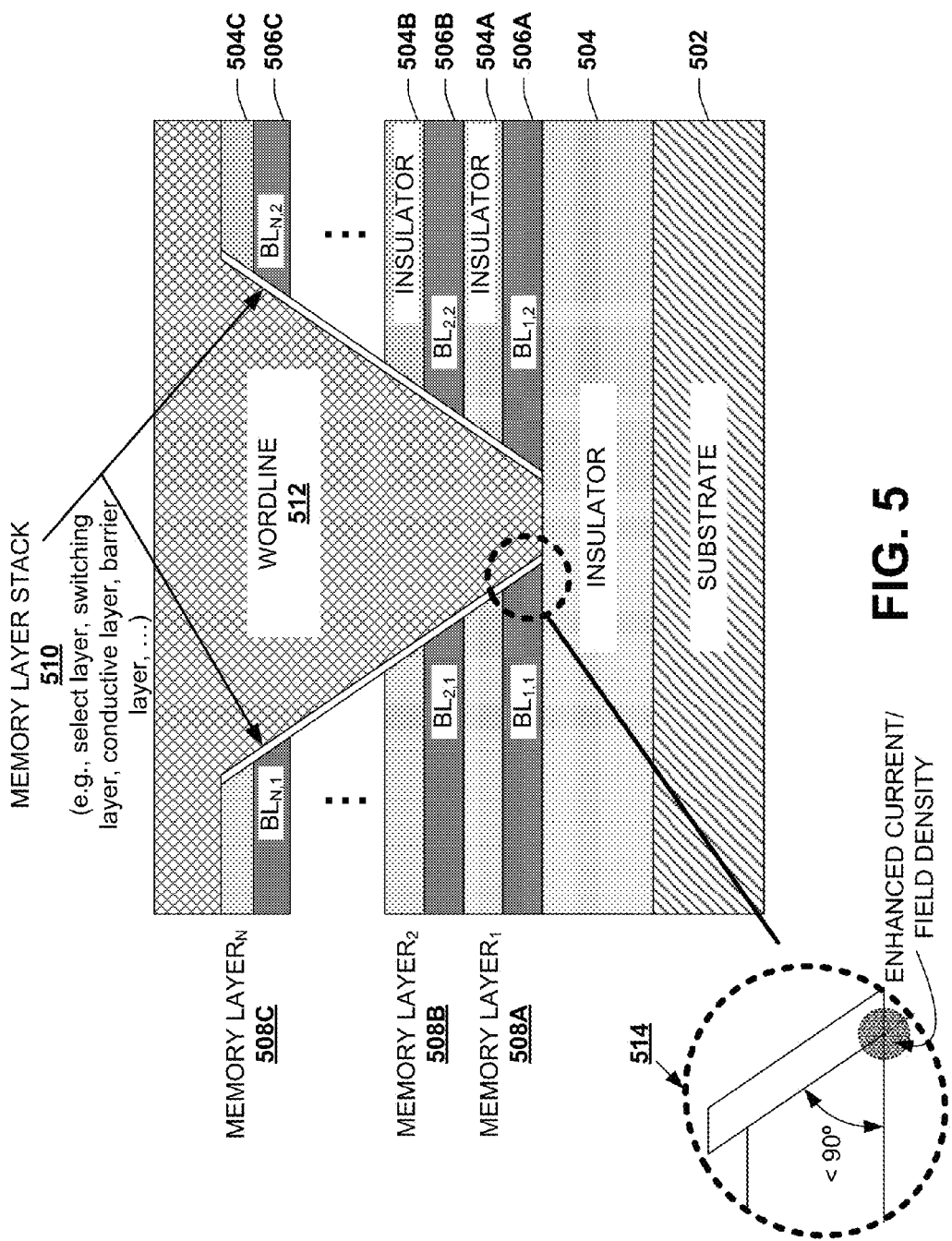
FIG. 5 depicts a block diagram of an example of multiple two-terminal memory cells with enhanced electric fields stacked in a third dimension, in an aspect(s).

FIG. 5 illustrates a block diagram of an example oblique memory device 500 according to additional aspects of the subject disclosure. Oblique memory device 500 can be constructed at least in part with CMOS-related fabrication techniques. In addition, multiple memory cells can be fabricated as part of oblique memory device 500 in a three-dimensional array format, having multiple memory cells arranged in a two-dimensional plane, and including multiple two-dimensional arrangements of memory cells stacked in a third dimension.

Oblique memory device 500 can comprise a CMOS substrate 502 having multiple CMOS devices. A first insulator layer 504 is positioned between substrate 502 and memory cell layers of oblique memory device 500. The memory cell layers can comprise alternating pairs of bitline and insulator layers. Thus, a first memory layer$_1$ 508A can comprise a first bitline layer 506A and second insulator layer 504A. Additional memory layers of oblique memory device 500 can include second memory layer$_2$ 508B comprising second bitline layer 506B and third insulator layer 504B, through memory layer$_N$ 508C comprising N$^{th}$ bitline layer 506C and N+1$^{th}$ insulator layer 504C, wherein N is a suitable integer greater than 1.

Upon formation of memory cell layer$_1$ 508A through memory cell layer$_N$ 508C (referred to hereinafter collectively as memory cell layers 508A-508C) of oblique memory device 500, a via, channel, opening, etc., can be formed in a region of the memory cell layers (central region depicted with cross-hatch shading and thin, non-shaded regions at oblique angles with respect to surfaces of the opening). Vias can be formed with suitable etching techniques, grooving techniques, or like techniques for removing material of stacked semiconductor films or layers. The via can result in exposed oblique portions of respective ones of bitline layers 506A, 506B, 506C (referred to hereinafter collectively as bitline layers 506A-506C). Note that the via depicted by FIG. 5 exposes at least two oblique portions in each of bitline layers 506A-506C, a right oblique surface for a left side set of bitlines, $BL_{1,1}$, $BL_{2,1}$, . . . $BL_{N,1}$ and a similar left oblique surface for a right side set of bitlines $BL_{1,2}$, $BL_{2,2}$, . . . , $BL_{N,2}$. Respective memory layer stacks 510 can be formed adjacent to the respective oblique surface portions at the lateral edges of the via, providing programmable switching components for memory cells as described herein. Memory layer stack 510 can comprise a select layer, a switching layer, a barrier layer, a conductive layer, or the like, or a suitable combination thereof.

A wordline 512 can be formed within a remaining portion of oblique memory device 500, and can dip into the gap or opening within material of memory layers 508A-508C removed to form the via(s), described above. Thus, wordline 512 can fill the cross-hatched region of FIG. 5 and labeled "wordline 512". In operation, wordline 512 can serve as a top electrode for memory cells of oblique memory device 500, depicted by a cutout 514 (dotted circle at lower left of FIG. 5. A combination of a perpendicular/oblique portion (left or right) of a segment of bitline layers 506A-506C (that can serve as a bottom electrode) and an adjacent portion of memory layer stack 510 and adjacent segment of wordline 512 can form respective ones of the memory cells of cutout 512. Thus, each of bitline layers 506A-506C can comprise two memory cells at respective intersections to wordline 512, a first memory cell at a corresponding perpendicular/oblique portion of one of left side set of bitlines $BL_{1,1}$, $BL_{2,1}$ and $BL_{N,1}$ and a second memory cell at a corresponding perpendicular/oblique portion of one of right side set of bitlines $BL_{1,2}$, $BL_{2,2}$, and $BL_{N,2}$. Thus, the embodiment of oblique memory device 500 depicted by FIG. 5 can provide 2×N memory cells per intersection of a stacked set of N bitlines, and a wordline. Where oblique memory device 500 extends for multiple wordlines 512 (e.g., left and right on the page—not depicted) and additional stacked sets of N bitlines (e.g., in and out of the page—not depicted), a three-dimensional array forming many memory cells can be provided.

As depicted by cutout 514, respective memory cells can observe enhanced electric current or electric field intensity at an interface between a perpendicular/oblique portion of an associated bitline, and an associated one of memory stack layers 510. An angle less than ninety degrees (e.g., shaded circle region in a lower right portion of cutout 514)—formed between a bottom of an associated bitline, and a partial vertical extent of a perpendicular/oblique portion of the associated wordline and associated one of memory stack layers 510—can provide the enhanced electric current density or electric field intensity. This can facilitate memory operations for respective ones of the memory cells with reduces field or bias magnitudes, leading to faster response times, and overall improved memory performance.

Figure 6:
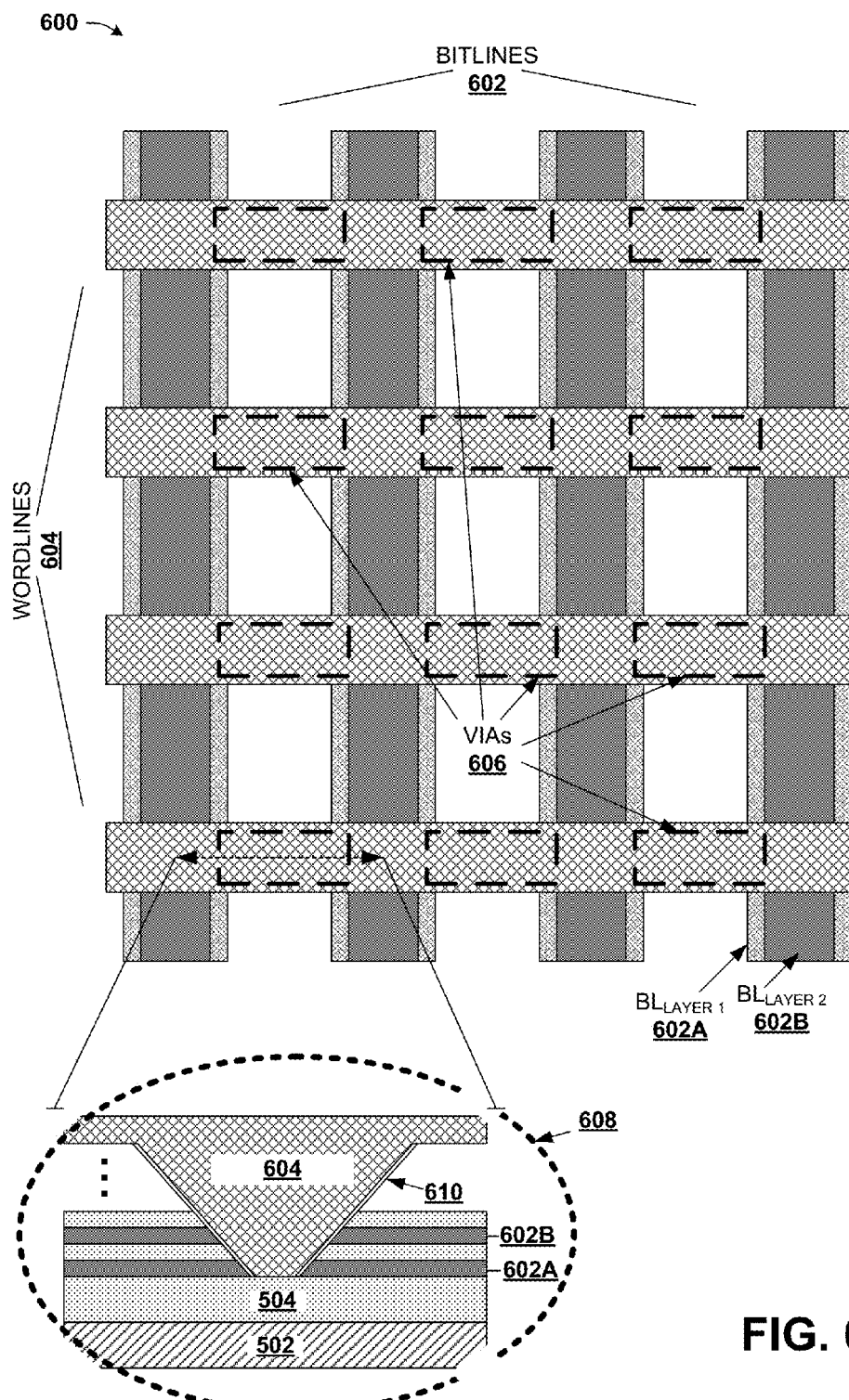
FIG. 6 illustrates a block diagram of a sample array of memory cells having enhanced electric field characteristics, in various embodiments.

FIG. 6 depicts a block diagram of a sample memory array 600 according to alternative or additional aspects of the subject disclosure. Memory array 600 can comprise a set of bitlines 602 along a first direction, formed beneath a corresponding set of wordlines 604 that extend in a second direction which can be orthogonal to or substantially orthogonal to the first direction. Bitlines 602 can respectively comprise a set of bitline layers, including bitline layer₁ 602A (light shaded rectangle) and bitline layer₂ 602B (dark shaded rectangle overlaid above bitline layer₁ 602A), which can be stacked in a third dimension (in and out of the page). Although two bitlines layers are depicted for memory array 600, it should be appreciated that additional bitline layers can be stacked above the depicted bitline layers 602A, 602B.

The set of bitline layers 602A, 602B can be formed above a suitable substrate (e.g., a CMOS substrate) with interspersed insulating layers (e.g., see oblique memory device 500 of FIG. 5, supra). Wordlines 604 can be formed above bitline layers 602A, 602B, along a direction that intersects respective ones of at least a subset of bitlines 602. Material between the respective bitline layers 602A, 602B can be removed (e.g., etched away, cut away, dissolved, and so forth) to form an opening(s) or gap(s) between bitlines 602. In a region of memory array 600 that is in between sets of intersecting bitlines 602 and wordlines 604, the gaps can be filled with insulating material, as one example. In a region of memory array 600 where a wordline 604 intersects a gap between bitlines 602, the gap/opening can be filled with wordline material (e.g., a metal), forming a via 606 comprising one or more memory cells.

A set of vias 606 formed within memory array 600 are depicted by the dotted rectangles along respective wordlines 604, over gaps between bitlines 602. Although memory array 600 illustrates a via 606 positioned within each such position, other embodiments of the subject disclosure can form vias 606 in a subset of such positions instead (e.g., see FIG. 7, infra). As depicted, vias 606 can be formed along wordlines 604, at a junction with a gap between adjacent bitlines 602 of memory array 600. Forming a via 606 can comprise extending a wordline 604 into a gap between bitlines 602 (e.g., an opening etc., from which bitline material is removed; e.g., see cutout section 608, below). Therefore, vias 606 can be formed to fill respective gaps in bitline layers of memory array 600 that intersect one of wordlines 604.

A perpendicular view of a via 606 is depicted at cutout section 608 (dotted oval). As is apparent from the perpendicular view, respective vias 606 are formed having a left portion forming an oblique contact with one of the adjacent pairs of bitlines 602, and a right portion that forms an oblique contact with a second of the adjacent pairs of bitlines 602. Vias 606 can therefore comprise respective memory devices substantially similar to oblique memory device 500 of FIG. 5, supra, in some disclosed embodiments. In other embodiments, a different construction can be provided (e.g., having more or fewer bitline layers, one or more fewer or additional switching layers, and so forth).

As depicted, the memory device of cutout section 608 comprises a portion of a wordline 604 (cross-hatch shading) that extends downward to form oblique contacts with bitline layers 602A, 602B (dark shaded rectangles intersected by wordline 604), which are formed between insulating layers 504 and above a CMOS substrate 502, which can be substantially the same as described with respect to FIG. 5, supra. In the embodiment of FIG. 6, wordline 604 forms two oblique contacts with each of bitline layers 602A, 602B. In between wordline 604 and bitline layers 602A, 602B at the oblique contacts is a memory stack layer 610, comprising a switching layer, and optionally including a barrier layer, a select layer or a conductive layer, or a suitable combination thereof. A memory cell can be formed between oblique contact of wordline 604 and bitline layers 602A, 602B having the interspersed memory stack layer 610, as described herein. Thus, at least four memory cells are formed within the cutout section 608 (or more memory cells for additional bitline layers above bitline layer$_2$ 602B).

By forming vias 606 between each pair of bitlines 602, respective vias 606 can have two oblique contacts with a pair of bitlines 602. This provides memory array 600 with a relatively high memory density. In other embodiments, a memory array can have vias 606 formed at a subset of each pair of bitlines 602, such that a subset of vias 606 form two oblique contacts with pairs of bitlines 602. This can reduce current leakage for a memory array, improving sensing margin rather than maximizing memory density.

Figure 7:
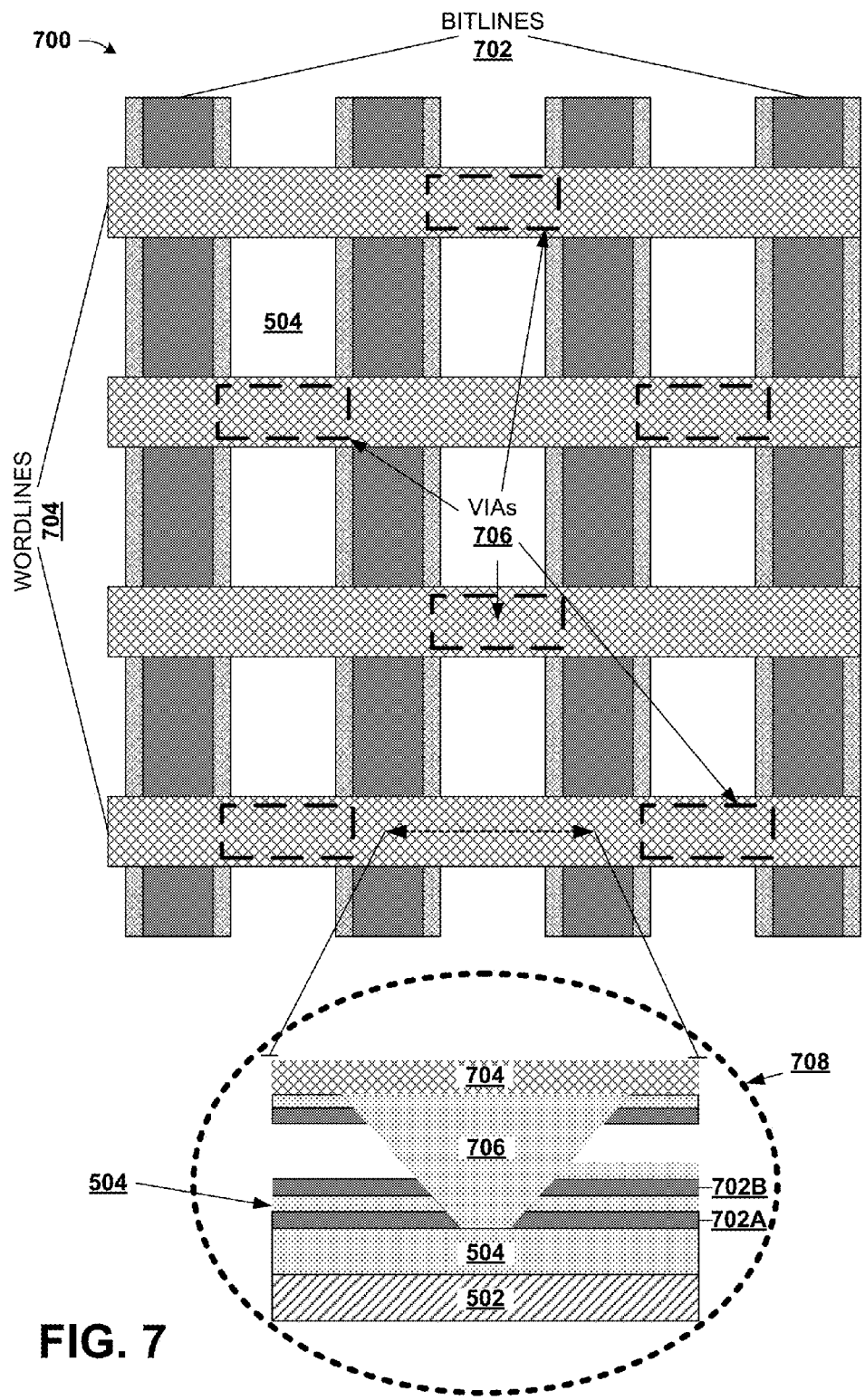
FIG. 7 illustrates a block diagram of an example array of memory cells according to an alternative embodiment.

FIG. 7 depicts a block diagram of a top-down view of an example memory array 700 according to one or more additional disclosed embodiments. Memory array 700 can comprise a set of bitlines 702 formed over a CMOS substrate, and beneath a set of wordlines 704. In memory array 700, bitlines 702 extend along a first direction that is substantially orthogonal to or orthogonal to a second direction along which wordlines 704 extend. In other disclosed embodiments, an angle between the first direction and second direction can be one or more degrees from orthogonal (e.g., two degrees, five degrees, ten degrees, or another suitable angle). For instance, this angle can be selected to provide improved current density or electric field intensity for memory cells of memory array 700, as measured within a plane parallel to the top-down view of FIG. 7 (e.g., see FIG. 9, infra). This angle of deviation for memory layers can be instead of or in addition to a second angle of deviation from orthogonal for the memory layers, the second angle being measured in a plane that is perpendicular to the top-down view of FIG. 7 (e.g., as depicted by cutout 512 of FIG. 5, supra).

Memory array 700 comprises a set of vias 706 along respective wordlines 704. Vias 706 are positioned at selected gaps between pairs of bitlines 702, beneath one of wordlines 704. In the embodiment of memory array 700, gaps are selected for vias 706 such that respective segments of each bitline 702 (where a bitline segment comprises respective unbroken widths of bitline layers 702A, 702B along a horizontal direction of memory array 700) form an oblique contact with only a single via 706 for each of wordlines 704. This configuration can significantly reduce leakage current that might occur, for instance, where each bitline 702 intersects with vias 706, as provided in the example memory array of FIG. 6, supra. In an alternative embodiment, memory array 700 can include additional vias 706 such that at least one bitline 702 intersects with two of vias 706, to increase memory density beyond that depicted by memory array 700. Increasing or decreasing vias 706 can provide a trade-off between memory density and leakage current, depending on needs of a particular memory application.

Cutout section 708 illustrates a perpendicular view (e.g., looking within a plane of the page from bottom to top) of an example gap between pairs of bitlines 702 in which a via 706 is not located. As is depicted, memory array 700 is formed above a CMOS substrate 502 and insulator layer 504, which can be substantially similar to that described in FIG. 5, supra. A bitline layer(s) 702A, 702B is formed above a first insulating layer 504, with additional insulating layers there between. A wordline 704 transverses cutout section 706 at a top portion thereof, and in a gap between the pairs of bitlines 702 depicted in the perpendicular view of cutout section 708, is insulating material 705 that extends below wordline 704 and between bitline layer(s) 702A, 702B. Thus, the left side of bitline layer(s) 702A, 702B can form an oblique contact with a via 706 to the left of the region illustrated by cutout section 708, but will not form an oblique contact within cutout section 708.

Figure 8:
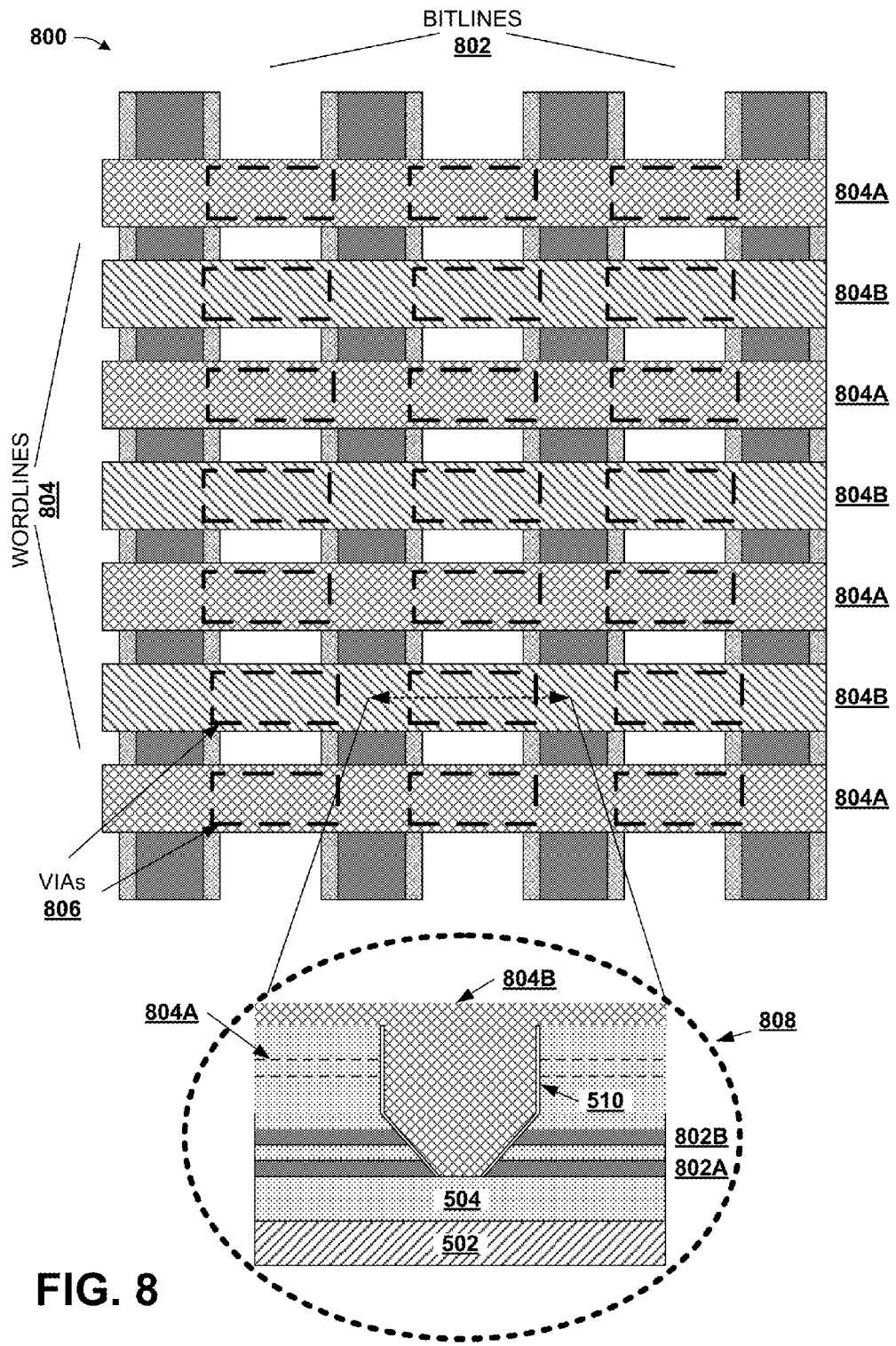
FIG. 8 depicts a block diagram of a sample array of memory cells according to yet another alternative embodiment.

FIG. 8 illustrates a block diagram of an example memory array 800 according to still other embodiments of the subject disclosure. Memory array 800 can comprise a set of bitlines 802 that extend transverse to a set of wordlines 804. Moreover, wordlines 800 can comprise two groups, a first group of wordlines 804A (wordlines 804A) and a second group of wordlines 804B (wordlines 804B). As depicted, respective ones of wordlines 804A are interspersed between respective ones of wordlines 804B. In addition, wordlines 804A can be formed at a first depth (in a direction in and out of the page) of memory array 800, whereas wordlines 804B can be formed at a second depth of memory array 800. In the example memory array 800 of FIG. 8, wordlines 804B are formed at a higher depth (e.g., above) wordlines 804A, though other arrangements may be employed as alternative embodiments.

A set of vias 806 are depicted by dashed rectangles, respective wordlines 804. Similar to memory array 600, each via 806 is located along one of wordlines 804 between respective pairs of bitlines 802. In some embodiments, a via 806 can be placed at each such location—as depicted by memory array 800. In other embodiments, vias 806 can be selectively located at a subset of such locations instead (e.g., where respective bitline segments intersect a via 806 at only one respective end thereof, similar to that depicted in FIG. 7, supra, or another suitable arrangement in which a subset of bitline segments form a single intersection and another subset intersects a pair of vias 806).

A cutout section 808 (dotted oval) illustrates a perpendicular view of one of vias 806. Note that cutout section 808 represents a via 806 on one of wordlines 804B formed at the second depth of memory array 800, mentioned above. Via 806 depicted by cutout section 808 shows memory array 800 being formed above a CMOS substrate 502 and insulator layer 504, which can be substantially similar to that described at FIG. 5, supra. Additionally, one or more bitline layers 802A, 802B can be formed above insulating layer 504, with additional insulating layers interspersed there between. A channel, opening, gap, etc., between bitline layer(s) 802A, 802B comprises an extension of a wordline 804B formed at the second depth (e.g., higher than wordlines 804A) of memory array 800. Deeper within the cutout section 808 a wordline 804A is depicted at a first depth (e.g., lower than wordlines 804B) by dashed horizontal rectangle below wordline 804B, and above bitline layer(s) 802A, 802B.

By employing alternating wordlines at different depths of memory array 800, a spacing between wordlines 804 can be reduced (e.g., as compared with a spacing between wordlines of memory array 6 or memory array 7, supra). Generally, spacing between adjacent wordlines at the same depth (or on the same plane) of a memory device can be limited by a minimum feature size of a lithography tool utilized to form the memory array. However, layer to layer alignment accuracy can often be provided with greater accuracy and finer resolution than the minimum feature size of the lithography tool. Thus, where adjacent wordlines are formed at different depths of a memory array, (e.g., such that their cross-sections do not intersect, as depicted by wordline 804B and wordline 804A in cutout section 808), more compact arrays can be formed. In some disclosed embodiments, two wordline layers 804A, 804B are provided for a memory array 800, at two respective depths thereof. However, other embodiments comprising three or more wordline layers can be provided at three or more depths of a memory array.

Figure 9:
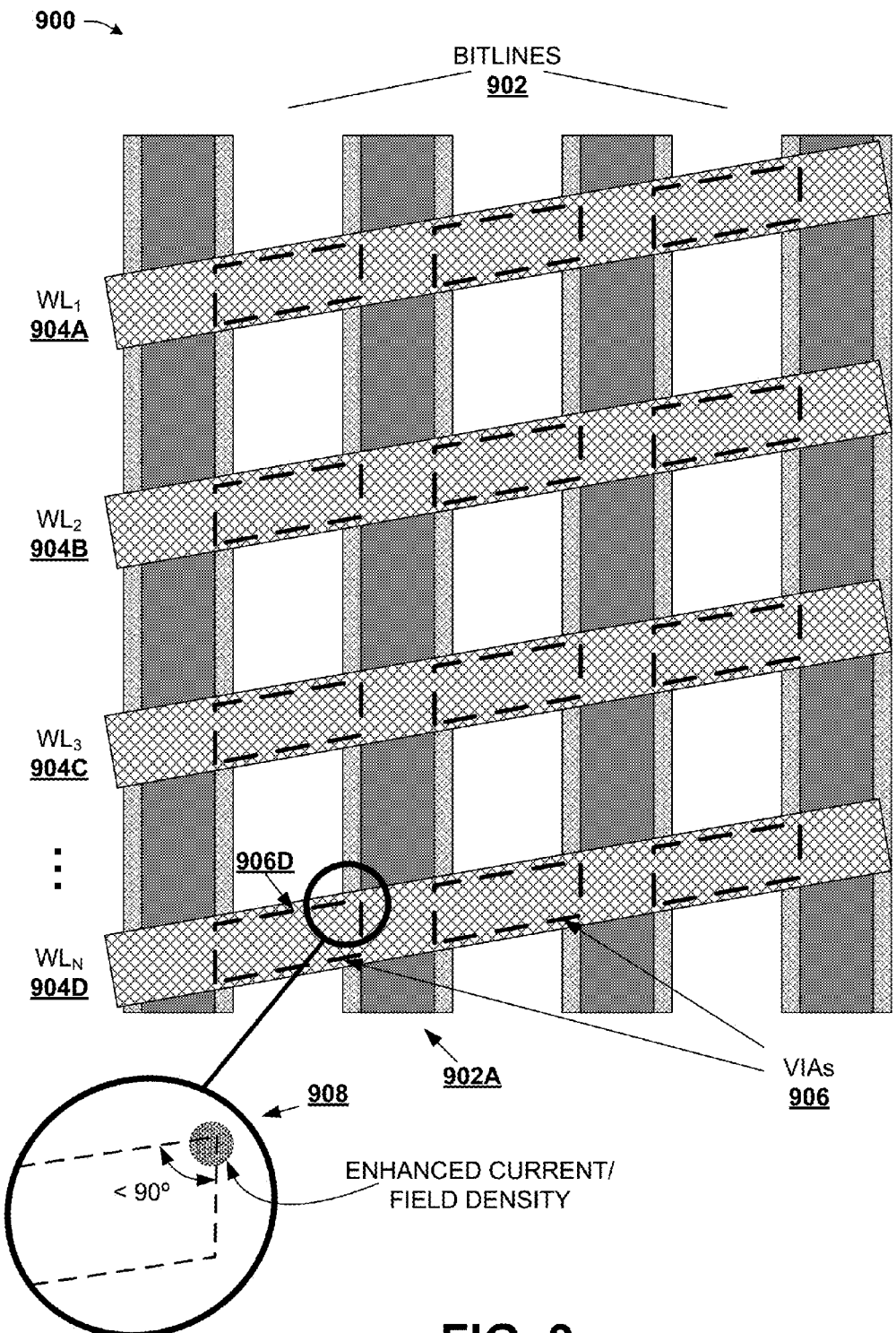
FIG. 9 illustrates a block diagram of a sample array of memory cells having further enhanced electric field characteristics, in another embodiment(s).

FIG. 9 illustrates a block diagram of an example memory array 900 providing enhanced electric field intensity or electric current density according to still other disclosed embodiments. Memory array 900 can comprise a set of bitlines 902 and a set of wordlines 904, including wordlines $WL_1$ 904A, $WL_2$ 904B, $WL_3$ 904C, through $WL_N$ 904D (referred to collectively as wordlines 904A-904D), wherein N is a suitable positive integer greater than 1. According to memory array 900, wordlines 904A-904D can extend along a direction that is non-orthogonal to a corresponding direction along which bitlines 902 extend. In addition, wordlines 904A-904D can have one or more vias 906 (dashed parallelograms) formed along their lengths, and at respective spaces between pairs of bitlines 902 (or at selected subsets of the spaces between pairs of bitlines; see FIG. 7, supra). In at least one embodiment, vias 906 can be substantially parallel to wordlines 904A-904D, their lengths extending parallel to or substantially parallel to the direction along which wordlines 904A-904D extend.

Each of vias 906 forms an oblique contact with at least one of bitlines 902. As depicted by cutout section 908 (solid circle), a via 906D along wordline 904D a bitline 902A of bitlines 902 at a right side of via 906D, forming an oblique contact with bitline 902A (e.g., a bitline segment of bitline 902A that extends, on a left side thereof, to via 906D). At least one corner of via 906D (top-right corner illustrated by a shaded circle with dashed border in cutout section 908) can intersect bitline 902A at less than a right angle (e.g., less than ninety degrees, as illustrated in cutout section 908). This sub-ninety degree angle can provide enhanced current density or enhanced electric field intensity for a memory cell positioned at this intersection of via 906D and bitline 902A. It should be appreciated that the memory cell can comprise one or more other angles at the intersection of via 906D and bitline 902A that also are less than right angles (e.g., where oblique edges of via 904D extend into a depth of memory array 900 at a non-right angle, providing a second non-orthogonal angle as measured within a plane perpendicular to the page of FIG. 9; see, e.g., FIG. 5 and cutout section 512 thereof, supra). These sub-ninety degree angles at intersection of 906D and bitline 902A can provide additional enhancement of electric field intensity or electric current density of associated memory cells.

Figure 10:
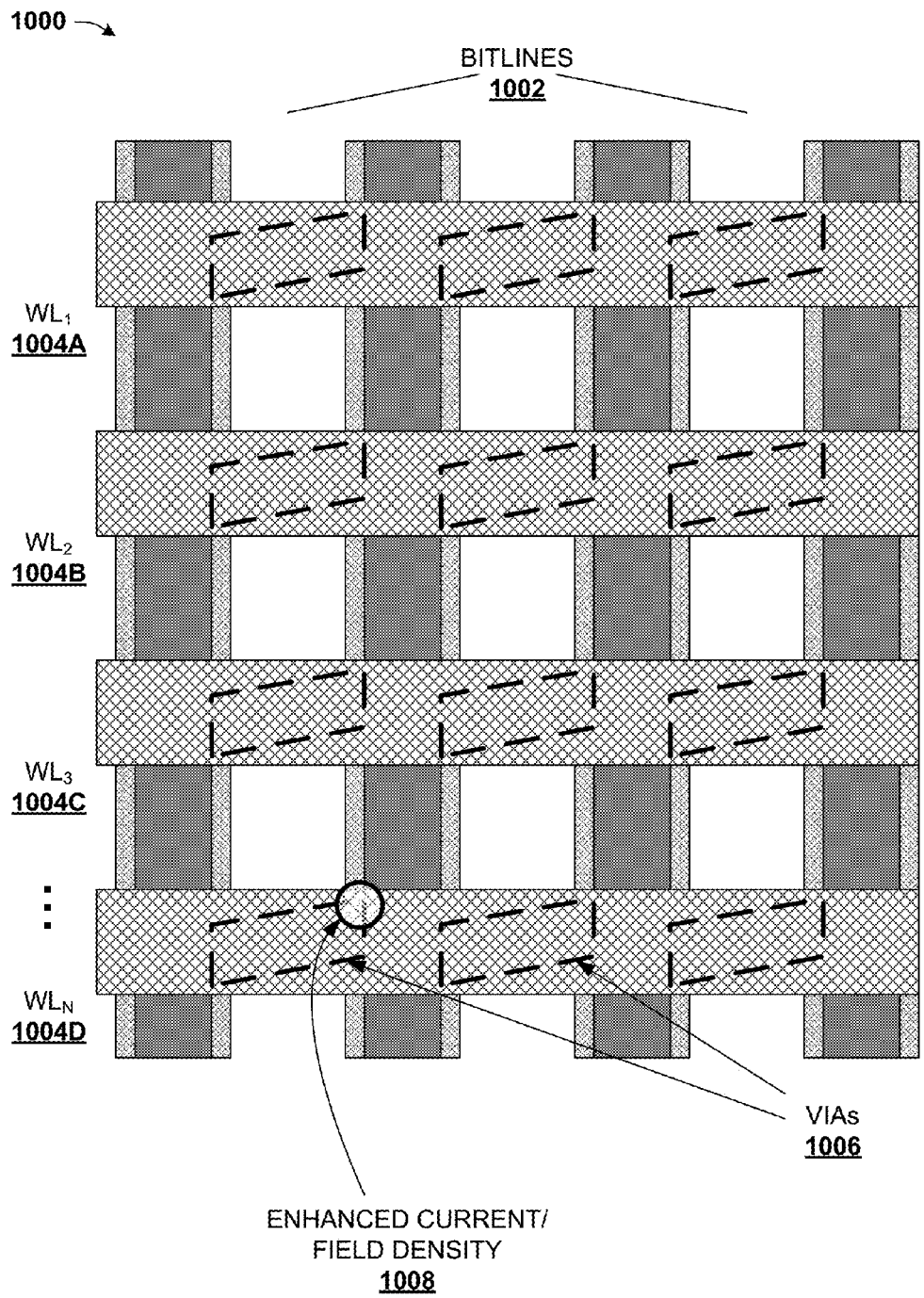
FIG. 10 depicts a block diagram of a sample array of memory cells having further enhanced electric field characteristics in an additional embodiment(s).

FIG. 10 depicts a block diagram of an example memory array 1000 according to one or more additional aspects of the subject disclosure. Memory array 1000 can comprise a set of bitlines 1002 and a set of wordlines 1004, including wordlines $WL_1$ 1004A, $WL_2$ 1004B, $WL_3$ 1004C, through, $WL_4$ 1004D (referred to collectively as wordlines 1004A-1004D), as depicted. Wordlines 1004A-1004D are overlaid orthogonally or substantially orthogonally with respect to bitlines 1002. Bitlines 1002 can comprise multiple bitline layers in some embodiments, as described herein.

A set of vias 1006 can be formed along wordlines 1004A-1004D. Vias 1006 can be formed along a direction that is non-parallel with a length of wordlines 1004A-1004D. This non-parallel angle can result in vias 1006 forming a sub-ninety degree angle at an interface to one of bitlines 1002. This can result in enhanced electric current density or electric field intensity at the region 1008 indicated by the circle at the lower left via 1006 of memory array 1000. In at least one embodiment, vias 1006 can form a different angle (e.g., oriented downward with respect to a length of wordlines 1004A-1004D) as depicted by memory array 1000. In at least one embodiment, respective ones of vias 1006 can be formed to intersect bitlines 1002 at different angles from other intersections of other vias 1006 and bitlines 1002.

The aforementioned diagrams have been described with respect to interaction between several components (e.g., layers, etc.) of a memory cell, or memory architectures comprised of such memory cells. It should be appreciated that in some suitable alternative aspects of the subject disclosure, such diagrams can include those components and layers specified therein, some of the specified components/layers, or additional components/layers. Sub-components can also be implemented as electrically connected to other sub-components rather than included within a parent component/layer. Additionally, it is noted that one or more disclosed processes can be combined into a single process providing aggregate functionality. For instance, a program process can comprise a read process, or vice versa, to facilitate programming and reading a memory cell by way of a single process. Components of the disclosed architectures can also interact with one or more other components not specifically described herein but known by those of skill in the art.

Segmented Wordlines and/or Bitlines

Figure 11A:
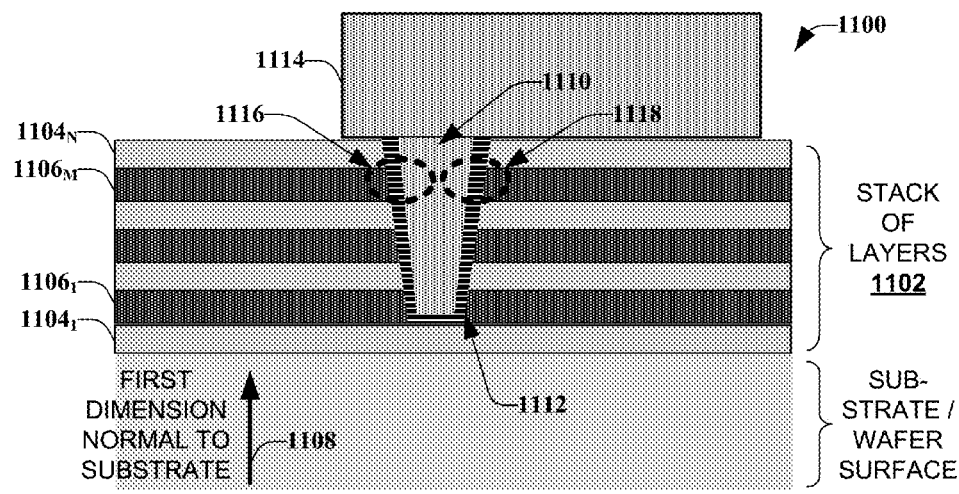
FIG. 11A illustrates a block diagram of an example via structure that segments one or more metal interconnects according to some embodiments.

With reference now to FIG. 11A, memory device 1100 illustrates an example via structure or shape that segments one or more metal interconnects of the memory device. Memory device 1100 can include a stack of layers 1102. The stack of layers 1102 can comprise at least one insulator layer(s) $1104_1$-$1104_N$, and at least one electrode layer $1106_1$-$1106_M$, wherein N and M can be substantially any positive integer. The at least one insulator layer $1104_1$-$1104_N$, and the at least one electrode layer $1106_1$-$1106_M$ are referred to herein either collectively or individually as insulator layer(s) 1104 and electrode layer(s) 1106, respectively, with appropriate subscripts generally employed only when instructive or convenient to highlight various distinctions or to better impart the disclosed concepts. Insulator layer(s) 1104 can comprise an electrical insulating material such as that detailed herein (e.g., insulator 104 of FIG. 1) and can be ordered in stack of layers 1102 in an alternating sequence with electrode layer(s) 1106. Electrode layer(s) 1106 can comprise an electrical conducting metal as described herein (e.g., bottom electrode 106 or top electrode 110 of FIG. 1) and can represent metal interconnects of memory device 1100 such as bitlines in some embodiments and wordlines in other embodiments. As depicted, stack of layers 1102 can be arranged substantially along a first dimension 1108 that is normal to a surface of a substrate and or a surface of a semiconductor wafer.

The memory device 1100 can comprise a via structure 1110 that can be formed by etching one or more of the stack of layers 1102. Such etching can divide or segment one or more electrode layer(s) 1106 and potentially one or more insulator layer(s) 1104. As depicted in this example, via structure 1110 segments all electrode layers $1106_1$-$1106_M$ and insulator layers $1104_2$-$1104_N$, but it is understood that via structure 1110 may segment, in whole or partially, more or fewer of stack of layer 1102. Appreciably, via structure 1110 segments an electrode layer 1106 such that a first portion of a given electrode layer 1106 is on one side of via structure 1110 (e.g., the left side) and a second portion of the given electrode layer 1106 is on the other side (e.g., the right side). Said differently, via structure 1110 can be situated between a first segmented portion of an electrode layer 1106 and a second segmented portion of the electrode layer 1106.

Via structure 1110 can comprise a resistive switching layer 1112 as described herein (e.g., switching layer 108 of FIG. 1) and a second electrode layer 1114 that differs from electrode layer(s) 1106. For example, electrode layer(s) 1106 may be suitable for one terminal of a two-terminal memory cell (e.g., bottom terminal) while one or more second electrode layer(s) 1114 can be suitable as the other terminal of the two-terminal memory cell (e.g., top terminal). It is understood that all or a portion of via structure 1110 established by removing and/or etching portions of stack of layers 1102 can be filled with switching layer 1112 and second electrode layer 1114.

Memory device 1100 can further comprise a memory cell 1116 formed and/or situated at an intersection of one or more electrode layer(s) 1106 and via structure 1110. Memory cell 1116 can comprise a first electrode that corresponds to a given one of the electrode layers 1106, the resistive switching layer 1112, and a second electrode that corresponds to the second electrode layer 1114. In some embodiments, memory cell 1116 (and/or the described via intersection) can be disposed at the first segmented portion (e.g., left side) of a given electrode layer 1106, while another memory cell 1118 can be disposed at a second intersection between the second segmented portion (e.g., right side) of the given electrode layer 1106 and the via structure 1110. The other memory cell 1118 can be similar to memory cell 1116 or different depending on other architecture further detailed herein. For instance, memory cell 1116 can be a non-volatile two-terminal memory cell, whereas the other memory cell 1118 can be the same, similar, or different such as including or being coupled to a volatile memory element.

It is understood that because via structure 1110 segments three electrode layers 1106 in this example, six intersections can exist and six memory cells 1116 and/or 1118 can be formed, two of which are depicted with broken ovals, one on the left side of the via structure 1110 and one on the right side. It is further understood that at the various intersections, one or more memory cells 1116 can exist that can be substantially similar to or different than similar cells depicted at cutouts associated with FIGS. 1-3. In some embodiments, layers of the memory cell 1116 can be arranged in sequence along a direction that forms a forty-five degree or larger angle to first dimension 1108 at least near the intersection(s) detailed supra. Additional detail can be found, e.g., at FIGS. 4 and 4A.

In some embodiments, electrode layer(s) 1106 can represent bitline(s) of memory device 1100 and second electrode layer 1114 can represent a wordline of memory device 1100. Such an architecture is similar to that described in connection with previous drawings. In other embodiments, electrode layer(s) 1106 can represent wordline(s) of memory device 1100 and second electrode layer 1114 can represent a bitline of memory device 1100.

In some embodiments, memory cell 1116 and/or the other memory cell 1118 can further comprise a select layer (not shown, but see element 306 of FIG. 3). The select layer can be comprised of a metal oxide, $TiO_2$, TiOx, $Al_2O_3$, AlOx, $WO_3$, WOx, $HfO_2$, HfOx, oxide, $SiO_2$, SiOx, poly Si, poly SiGe, doped polysilicon, doped poly SiGe, amorphous-poly Si, amorphous-poly SiGe, a non-linear element, or a diode. The select layer can be disposed between the resistive switching layer 1112 and a given one of electrode layer(s) 1106 and can have a thickness within a range of about 1 nanometers (nm) to about 50 nm.

In some embodiments, memory cell(s) 1116, 1118 can further comprise an electrical conductive layer (e.g., element 308 of FIG. 3) disposed between the resistive switching layer 1112 and the select layer. In some embodiments, memory cell(s) 1116, 1118 can further comprise barrier layer comprising a barrier material (e.g., element 312 of FIG. 3) disposed between the resistive switching layer 1112 and second electrode layer 1114. In some embodiments, memory device 1100 can further comprise a substrate disposed beneath the stack of layers 1102, comprising a plurality of complementary metal oxide semiconductor (CMOS) devices.

Figure 11B:
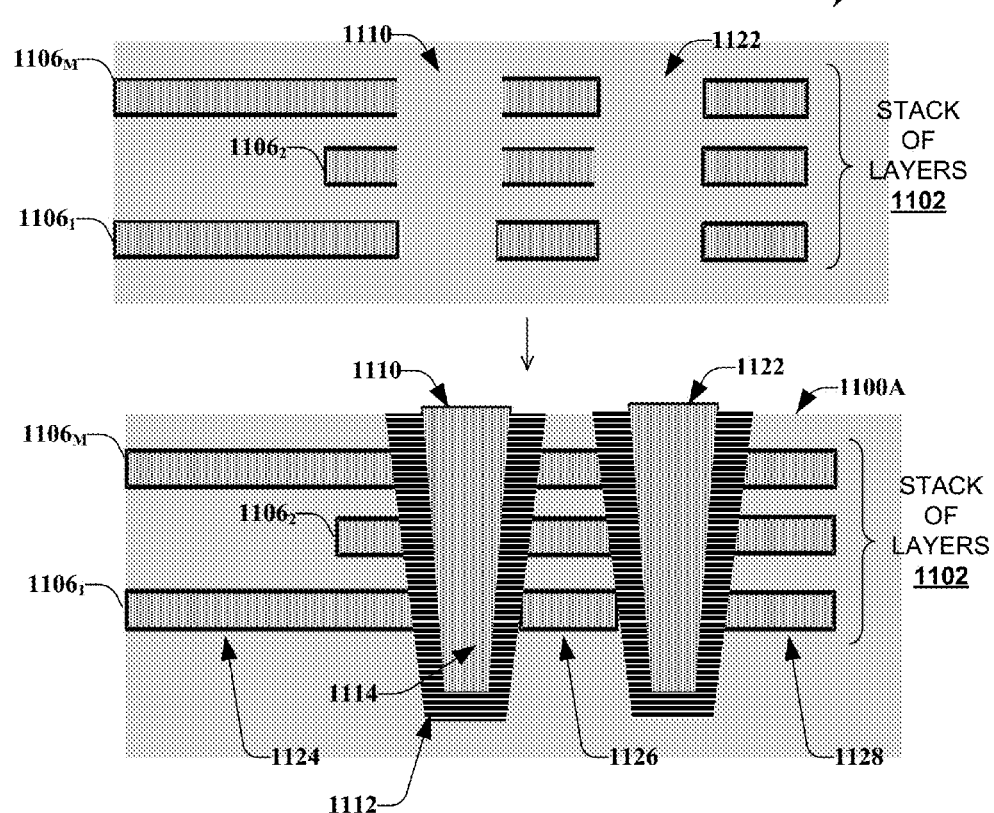
FIG. 11B illustrates a block diagram of an example of multiple via structures that segment one or more metal interconnects producing a floating interconnect according to some embodiments.

Turning now to FIG. 11B, diagram 1120 depicts an example of multiple via structures that segment one or more metal interconnects producing a floating interconnect. The upper portion of diagram 1120 provides an example of multiple via structures 1110 and 1122 after having been etched, but prior to filling. Multiple layers of the stack of layers 1102 of via structures 1110 and 1122 can be etched at a time, as depicted, to form via structure 1110 or 1122, or each layer in stack of layers 1102 can be etched individually to form via structure 1110 or 1122, which is further detailed in connection with FIG. 13. Via structures 1110 or 1122 can be rectangular in shape as substantially illustrated in the upper portion or trapezoidal, as substantially illustrated in the lower portion or in FIG. 11A.

The lower portion of diagram 1120 depicts the multiple via structures 1110, 1122 after having been filled as detailed herein, and can be a portion of a memory device 1100A. In more detail, memory device 1100A can include stack of layers 1102 comprising at least one insulator layer 1104 in an alternating sequence with at least one electrode layer 1106. Stack of layers 1102 can be arranged substantially along the first dimension 1108 that is normal to a surface plane of a substrate.

Memory device 1100A can further include a first via structure 1110 situated between a first segmented portion 1124 of a given electrode layer 1106 (e.g., 1106₁) and a second segmented portion 1126 of the electrode layer 1106. First via structure 1110 can comprise the resistive switching layer 1112 and the second electrode layer 1114. Memory device 1100A can further include a second via structure 1122 situated between the second segmented portion 1126 of the electrode layer 1106 and a third segmented portion 1128 of the electrode layer 1106. Second via structure 1122 can comprise the resistive switching layer 1112 and the second electrode layer 1114.

Memory device 1100A can also comprise one or more memory cells formed and/or disposed at intersection(s) of the electrode layer(s) 1106 and the via structures 1110, 1122. The memory cell(s) can comprise the resistive switching layer 1112 situated between a first electrode that corresponds to a salient portion of the associated electrode layer 1106 and a second electrode that corresponds to a salient portion of the second electrode layer 1114. Elements detailed in connection with memory device 1100 or elsewhere herein can apply for memory device 1100A.

Additionally or alternatively, in some embodiments, of memory device 1100A, first segmented portion 1124 (for all or a portion of electrode layer(s) 1106) can be coupled to an electrical source for memory device 1100A. Likewise, in some embodiments, of memory device 1100A, third segmented portion 1128 (for all or a portion of electrode layer(s) 1106) can be coupled to the electrical source. On the other hand, second segmented portion 1126 can operate as a floating electrode in some embodiments.

Figure 12:
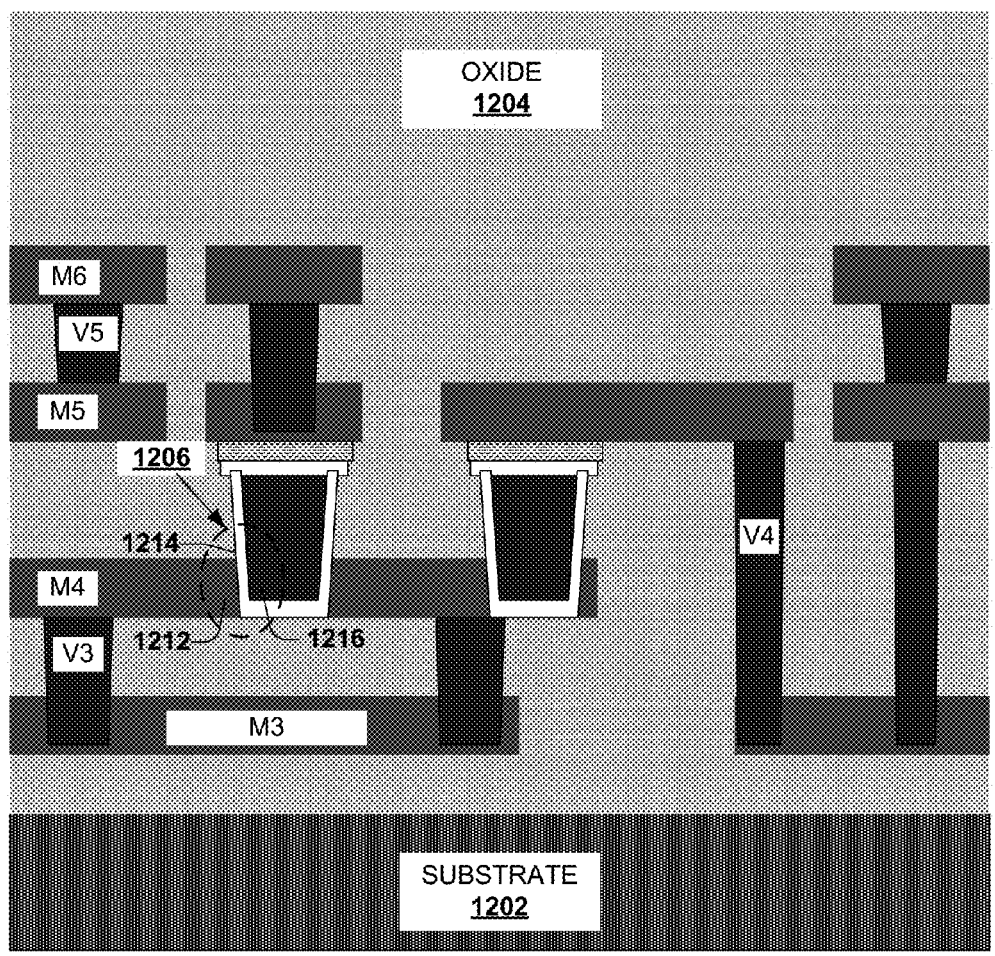
FIG. 12 illustrates a block diagram of an example memory device architecture that illustrates various via structures according to some embodiments.

Referring to FIG. 12, example memory device architecture 1200 is provided. Example memory architecture 1200 can comprise a substrate 1202. In some disclosed embodiments, substrate 1202 can comprise control logic, including a passive component(s) or active component(s) of an electronic device. In at least one embodiment, substrate 1202 and control logic can be fabricated at least in part with a front-end-of-line process(es).

An electrical insulator such as an oxide 1204 or the like, can be provided over substrate 1202. Additionally, one or more metal layers, including metal layer levels M3, M4, M5, M6 (up to an $X^{th}$ metal layer $M_X$, where X is a suitable integer, in some embodiments), can be formed within oxide 1204. In some embodiments, the metal layers can be formed interspersed between multiple layers of oxide 1204. Further, one or more conductive via layers can be formed between subsets of respective metal layers. The via layers can form one or more conductive vias, including via levels V3, V4, and V5.

In addition to the foregoing, a memory device 1206 can be formed between pairs of metal layers, in an embodiment. For instance, memory device 1206 can be formed between metal layers M3 and M4. However, in other embodiments, memory device 1206 can be formed between metal layers M2 and M3, between metal layers M5 and M6, or between other pairs of metal layers (e.g., M3 and M5, etc.).

Memory device 1206 can comprise a bottom electrode 1212, having a bottom surface in electrical contact with a subset of metal layer M4, and can have a top surface with at least one discontinuity. For instance, the top surface of bottom electrode 1212 can be in contact with a switching layer 1214, with an oxide material within a perimeter of the top surface also in contact with switching layer 1214. A surface area of the top surface of bottom electrode 1212 can be selected to provide a target current density, resistance, or other electrical parameter for memory device 1206. In at least one embodiment, a top electrode 1216 can be formed in contact with switching layer 1214 and a subset of metal layer M5. In an alternative embodiment, memory device can be formed without top electrode 1216, and with switching layer 1214 in contact with the subset of metal layer M5. In various embodiments, metal layers M3, M4, M5, M6, vias V3, V4, V5 or memory device 1206 can be formed in part or in total with back-end-of-line fabrication processes.

Example memory architecture 1200 serves to illustrate that vias for a given memory device can be of a variety of shapes and sizes. Etching via structures therefore may be more efficient or effective as individual layers are formed during fabrication of the memory device. For example, referring back to FIG. 11A, individual layers (e.g., insulator layers 1104, electrode layers 1106) can be formed in succession to construct stack of layers 1102. A recently formed layer of stack of layers 1102 can be etched in the appropriate via shape at that layer prior to forming the next layer, as described in connection with FIG. 13.

Figure 13:
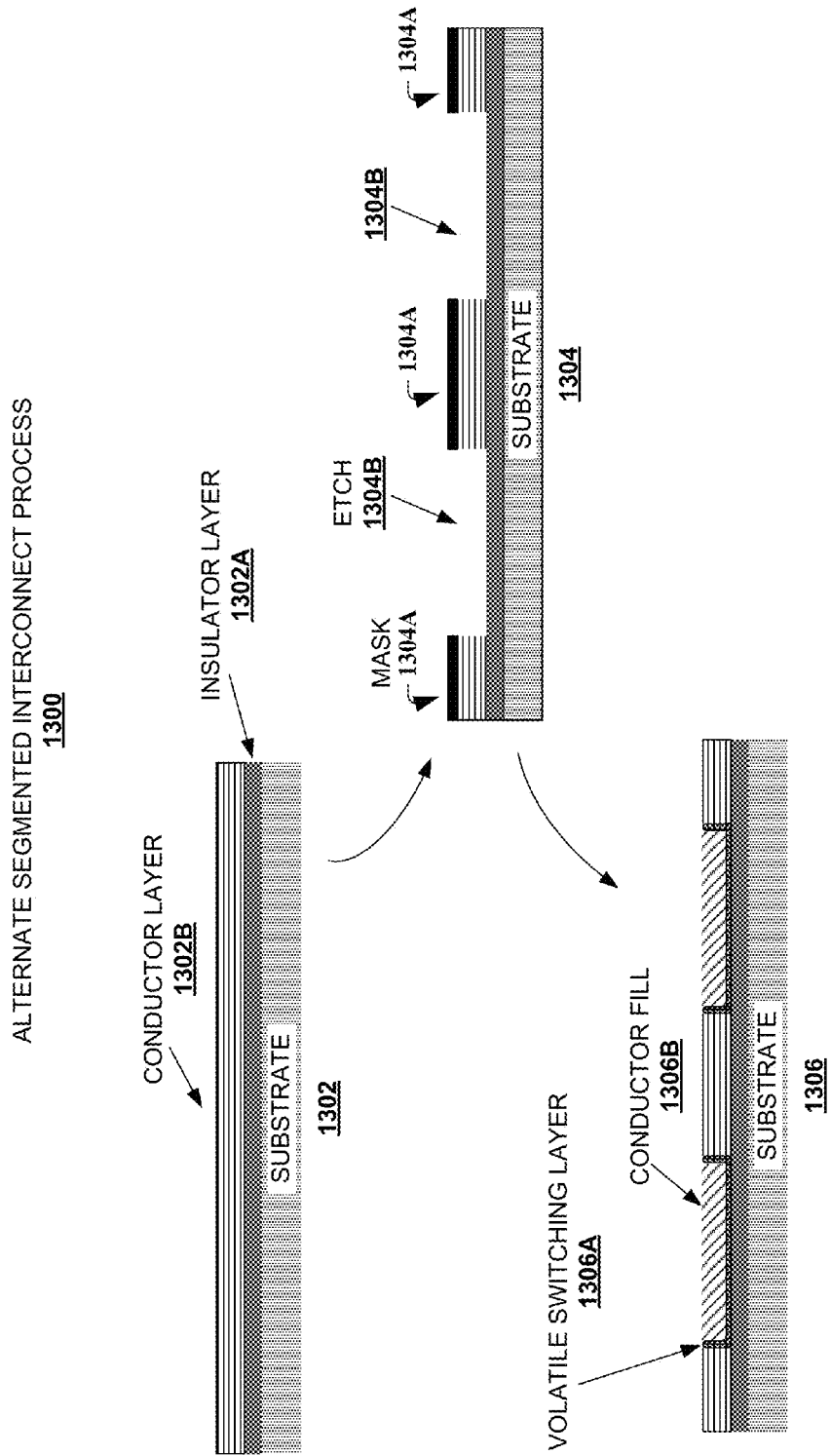
FIG. 13 illustrates a block diagram of an example illustration of an alternate segmented wordline process for fabricating a memory device according to some embodiments.

While still referring to FIGS. 11A-B, but turning as well to FIG. 13, illustrated is an alternate segmented wordline process 1300 for fabricating a memory device, according to further embodiments of the present disclosure. Alternate segmented wordline process 1300 can comprise a pattern and etch process of a conductor layer(s) and potentially insulator layer(s). The pattern and etch process, repeated for a stack of alternating conductor and insulator layers, can provide a memory device having patterned interconnects (e.g., broken, or segmented wordlines or bitlines).

At 1302, a substrate is provided, and an insulator layer 1302A formed over the substrate, and conductor layer 1302B formed over the insulator layer 1302A. At 1304, one or more masks 1304A can be provided over regions of conductor layer 1302B to be retained for interconnect (e.g., bitline/wordline) patterns. An etch 1304B can be performed to remove conductor material at least to insulator layer 1302A. In some embodiments, etch 1304B can remove at least a portion of insulator layer 1302A, whereas in other embodiments etch 1304B can stop at insulator layer 1302A, leaving insulator layer 1302A intact. At 1306, a volatile switching layer 1306A can be deposited over the surfaces exposed by etch 1304B, and a conductor fill 1306B can fill remaining space removed by etch 1304B.

Steps 1302, 1304 and 1306 can be repeated for additional insulator/conductor layers, to achieve a stack of alternating insulator layers and patterned conductor layers (e.g., stack of layers 1102). A pattern and etch step can form an etch through the stack of insulator and patterned conductor layers. A non-volatile switching layer (e.g., switching layer 1112) can be deposited over surfaces of the stack of insulator and patterned conductor layers exposed by the etch. Additionally, an etch of an interconnect (e.g., electrode layer 1106) can be performed to form distinct and electrically isolated interconnect segments, which can serve as a first terminal of a memory cell.

An active metal (e.g., second electrode layer 1114) can fill remaining space opened by the etch. The active metal can form another interconnect or a subset of the interconnect, serving as a second electrode of the memory device. In an alternate embodiment, the active metal layer can be deposited over non-volatile switching layer 1112. A fill can be performed within the remaining spaced opened by the etch over the active metal layer and the fill comprising second electrode layer 1114.

Alternate segmented interconnect process 1300 can provide a memory device having segmented or broken wordlines/bitlines formed by mask and pattern as an alternative to a single via etch performed after stack of layers 1102 has been formed. Multiple patterned wordlines/bitlines can be created to form a vertical stack of patterned layers and memory cell layers. A final pattern and etch can be utilized to provide a non-volatile memory layer and second contact or bitline/wordline for respective memory cells.

The aforementioned diagrams have been described with respect to interaction between several components (e.g., layers) of a memory cell, components thereof (e.g., memory component, selector component, etc.), or a memory architecture comprised of such memory cell or components. It should be appreciated that in some suitable alternative aspects of the subject disclosure, such diagrams can include those components and layers specified therein, some of the specified components/layers, or additional components/layers. Sub-components can also be implemented as electrically connected to other sub-components rather than included within a parent component/layer. For example, an intermediary layer(s) can be instituted adjacent to one or more of the disclosed layers. As one example, a suitable barrier layer that mitigates or controls unintended oxidation can be positioned between one or more disclosed layers. As another example, a particle or ion mitigation layer can be positioned to mitigate migration of particles of one layer entering an adjacent layer. As yet another example, a passivation layer can be positioned between one or more disclosed layers, to mitigate chemical bonding of particles of respective layers. In yet other embodiments, a disclosed memory stack or set of film layers can have fewer layers than depicted. For instance, a switching layer can electrically contact a conductive wire directly, rather than having an electrode layer there between. Additionally, it is noted that one or more disclosed processes can be combined into a single process providing aggregate functionality. Components of the disclosed architectures can also interact with one or more other components not specifically described herein but known by those of skill in the art.

Figure 14:
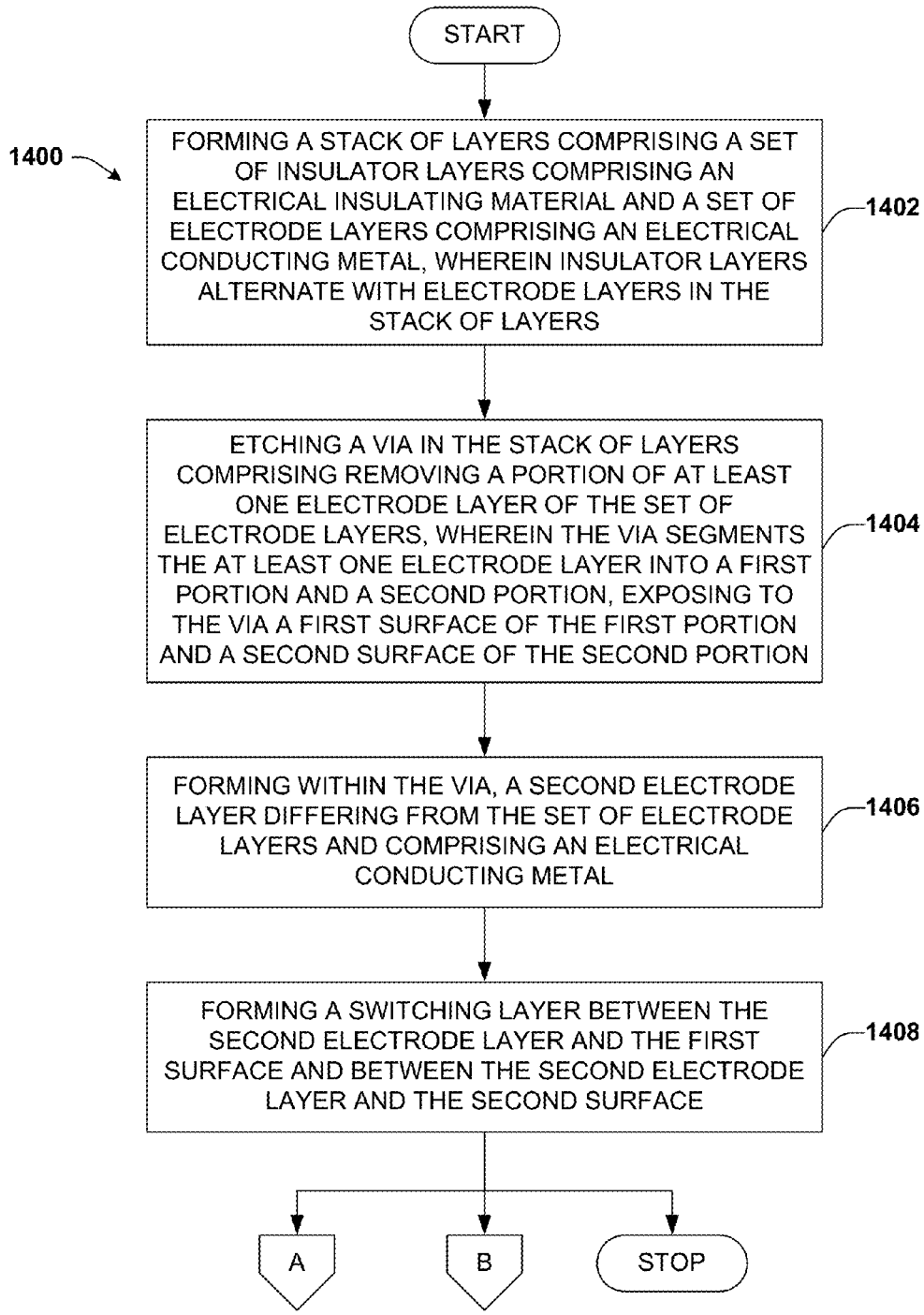
FIG. 14 illustrates a flowchart of an example method for fabricating a memory device with segmented interconnects according to additional embodiments.
Figure 15:
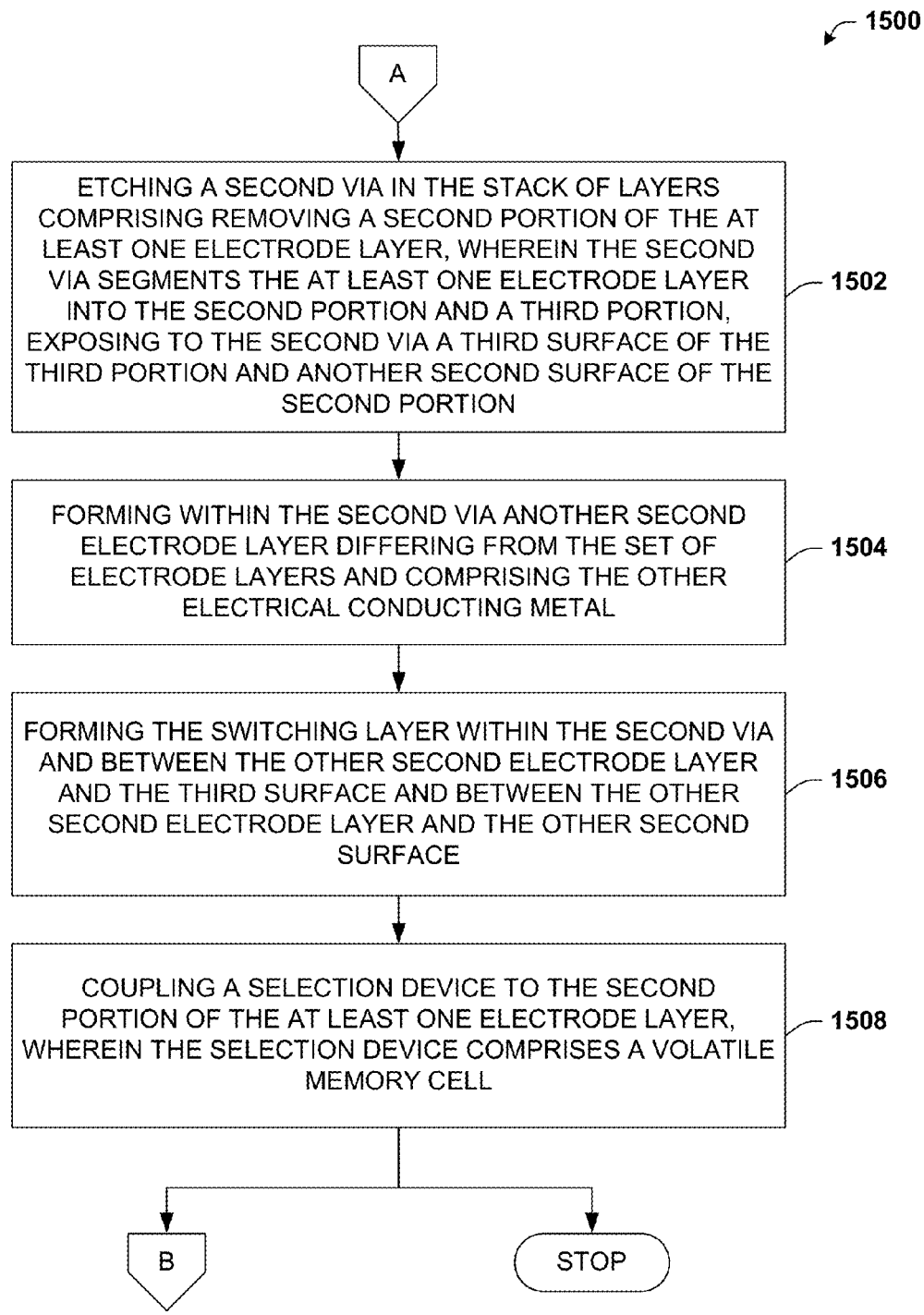
FIG. 15 illustrates a flowchart of an example method that can provide for fabricating a memory device with segmented interconnects and multiple vias according to additional embodiments.
Figure 16:
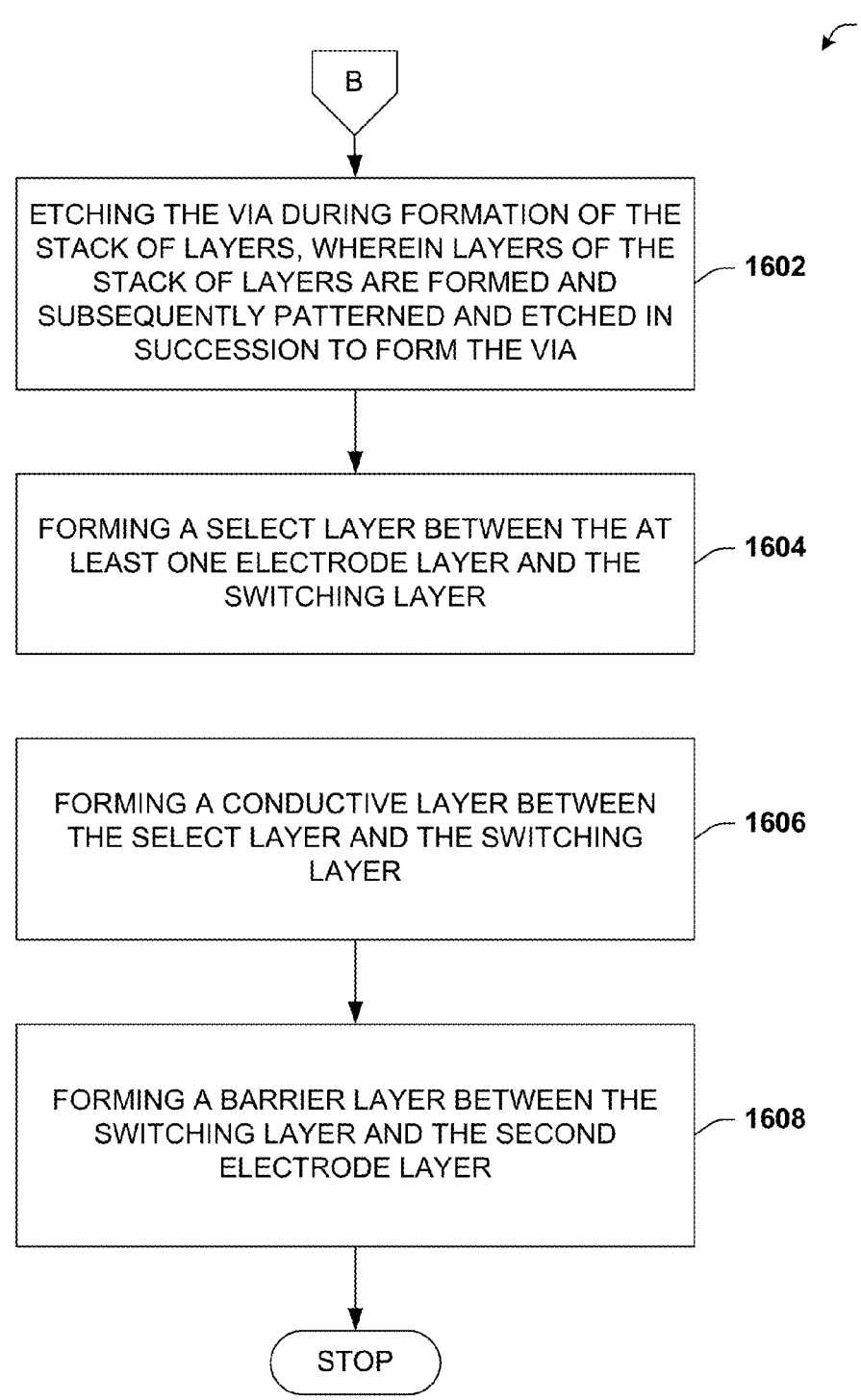
FIG. 16 illustrates a flowchart of an example method that can provide for additional aspects or elements in connection with fabricating a memory device with segmented interconnects according to additional embodiments.

In view of the exemplary diagrams described supra, process methods that can be implemented in accordance with the disclosed subject matter will be better appreciated with reference to the flow chart of FIGS. 14-16. While for purposes of simplicity of explanation, the method of FIGS. 14-16 are shown and described as a series of blocks, it is to be understood and appreciated that the claimed subject matter is not limited by the order of the blocks, as some blocks may occur in different orders or concurrently with other blocks from what is depicted and described herein. Moreover, not all illustrated blocks are necessarily required to implement the methods described herein. Additionally, it should be further appreciated that the methods disclosed throughout this specification are capable of being stored on an article of manufacture to facilitate transporting and transferring such methodologies to an electronic device. The term article of manufacture, as used, is intended to encompass a computer program accessible from any computer-readable device, device in conjunction with a carrier, or storage medium.

Example Methods for Fabricating Memory with Segmented Interconnects

FIG. 14 illustrates a flowchart of an example method 1400 for fabricating a memory device with segmented interconnects, according to alternative or additional aspects of the subject disclosure. At reference numeral 1402, a stack of layers can be formed. The stack of layers can comprise a set of insulator layers comprising an electrical insulating material and a set of electrode layers comprising an electrical conducting metal. Insulator layers can alternate with electrode layers in the stack of layers. For example, a first layer in the stack of layers can be an insulator layer, a second layer an electrode layer, a third layer an insulator layer, a fourth layer an electrode layer, and so on.

At reference numeral 1404, method 1400 can comprise etching a via (e.g., a recess or shape) in the stack of layers comprising removing a portion of at least one electrode layer of the set of electrode layers. In some embodiments, the etching can remove a portion of at least one insulator layer (2) as well. Due to the etching and/or creation of the via, the via segments the at least one electrode layer into a first portion and a second portion, exposing to the via a first surface (e.g., a "sidewall" of an electrode layer) of the first portion and a second surface (e.g., another "sidewall") of the second portion.

At 1406, method 1400 can comprise forming within the via a second electrode layer differing from the set of electrode layers and comprising an electrical conducting metal. The second electrode layer can be composed of a same or a different metal than the set of electrode layers. Typically, either the second electrode layer or the set of electrode layers will be an active metal. One can represent a terminal coupled to a wordline for the memory device while the other can represent a terminal coupled to a bitline for the memory device At 1408, method 1400 can comprise forming a switching layer between the second electrode layer and the first surface (e.g., the "sidewall" of the first portion of a given electrode layer). The switching layer can also be formed between the second electrode layer and the second surface. For example, the switching layer can be formed at the boundaries of a via, in contact with both portions of the segmented electrode layer. In some embodiments, the switching layer can comprise, e.g., an amorphous silicon layer, a metal oxide (e.g. ZnO), amorphous Si, $SiO_2$, $SiO_x$, $SiGeO_x$ (where x is a real number greater than zerio and less than two, and typically a non-integer), a chalcogenide, a metal oxide, a solid electrolyte, or the like, or a suitable combination thereof. Method 1400 can proceed to insert A detailed in connection with FIG. 15, insert B, described with reference to FIG. 16, or terminate.

Turning now to FIG. 15, method 1500 is described. Method 1500 can provide for fabricating a memory device with segmented interconnects and multiple vias according to an aspect of this disclosure. At reference numeral 1502, a second via can be etched in the stack of layers. As with the via etched at reference numeral 1404 of FIG. 14, etching the second via can comprise removing a second portion of the at least one electrode layer, wherein the second via segments the at least one electrode layer into the second portion and a third portion, exposing to the second via a third surface of the third portion and another second surface of the second portion.

At reference numeral 1504, the method 1500 can comprise forming within the second via another second electrode layer differing from the set of electrode layers and comprising the other electrical conducting metal. At reference numeral 1506, method 1500 can comprise forming the switching layer within the second via and between the other second electrode layer and the third surface and between the other second electrode layer and the other second surface.

An example memory device fabricated according to method 1500 can be described by turning back to FIG. 11B. With reference to electrode layer $1106_k$, vias 1110 and 1122 segment the layer into three portions. First portion 1124 can be coupled to a first terminal of a non-volatile two-terminal memory cell, while a second terminal is coupled to the second electrode layer 1114, both of which can be adjacent to and in contact with switching layer 1112. In some embodiments, other layers can exist between the two terminals. A similar structure can exist for second portion 1126 and third portion 1128. First portion 1124 and third portion 1128 can thus be coupled to one memory cell each, while second portion 1126 can be coupled to two memory cells. In some embodiments, first portion 1124 and third portion 1128 can be coupled to an electrical source, whereas second portion 1126 can be a floating electrode that, in some embodiments, can operate to reduce leak current.

For example, at reference numeral 1508, a selection device can be coupled to the second portion of the at least one electrode layer. The selection device can comprise a volatile memory cell. Method 1500 can proceed to insert B described in connection with FIG. 16 or end.

With reference to FIG. 16, method 1600 is depicted. Method 1600 can provide for additional aspects or elements in connection with fabricating a memory device with segmented interconnects. For instance, at reference numeral 1602, the etching of the via detailed in connection with reference numeral 1404 of FIG. 4 can be performed during formation of the stack of layers. For example, layers of the stack of layers can be formed and subsequently patterned and etched in succession to form the via or portions of the via.

At reference numeral 1604, a select layer can be formed between the at least one electrode layer and the switching layer. In some embodiments, the select layer can comprise a metal oxide, Ti, $TiO_2$, TiOx, $Al_2O_3$, AlOx, $HfO_2$, HfOx, oxide, $SiO_2$, SiOx, $WO_3$, WOx, poly Si, poly SiGe, poly Si, poly SiGe, a non-linear element, a diode, or the like, or a suitable combination thereof. At reference numeral 1606, a conductive layer can be formed between the select layer and the switching layer. At reference numeral 1608, a barrier layer can be formed between the switching layer and the second electrode layer. In some embodiments, the barrier layer can comprise Ti, $TiO_x$, TiN, Al, $AlO_x$, Cu, $CuO_x$, W, Hf, $HfO_x$, Ta, $TaO_x$ where x is greater than 0 and less than 2, or $WO_z$, where z is greater than 0 and less than 3.

Example Operating Environments

Figure 17:
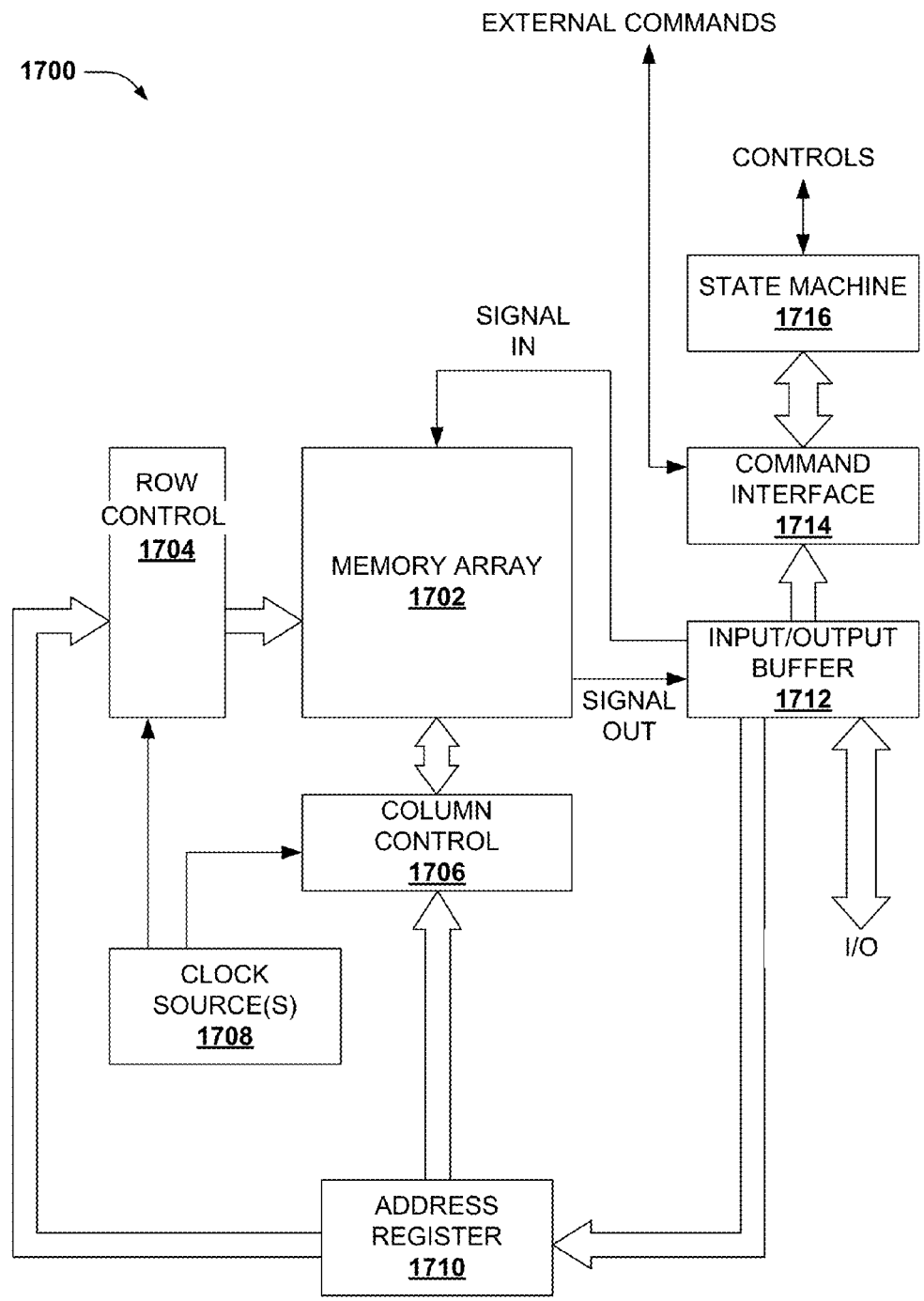
FIG. 17 depicts a block diagram of a sample operating environment for facilitating implementation of one or more disclosed embodiments.

In order to provide a context for the various aspects of the disclosed subject matter, FIG. 17, as well as the following discussion, is intended to provide a brief, general description of a suitable environment in which various aspects of the disclosed subject matter can be implemented or processed. While the subject matter has been described above in the general context of semiconductor architectures and process methodologies for fabricating and operating such architectures, those skilled in the art will recognize that the subject disclosure also can be implemented in combination with other architectures or process methodologies. Moreover, those skilled in the art will appreciate that the disclosed processes can be practiced with a processing system or a computer processor, either alone or in conjunction with a host computer (e.g., computer 1702 of FIG. 13, infra), which can include single-processor or multiprocessor computer systems, mini-computing devices, mainframe computers, as well as personal computers, hand-held computing devices (e.g., PDA, smart phone, watch), microprocessor-based or programmable consumer or industrial electronics, and the like. The illustrated aspects may also be practiced in distributed computing environments where tasks are performed by remote processing devices that are linked through a communications network. However, some, if not all aspects of the claimed innovation can be practiced on stand-alone electronic devices, such as a memory card, Flash memory module, removable memory, or the like. In a distributed computing environment, program modules can be located in both local and remote memory storage modules or devices.

FIG. 17 illustrates a block diagram of an example operating and control environment 1700 for a memory cell array 1702 according to aspects of the subject disclosure. In at least one aspect of the subject disclosure, memory cell array 1702 can comprise a variety of memory cell memory cell technology. Particularly, memory cell array can comprise resistive switching memory cells having rectifier characteristics, as described herein.

A column controller 1706 can be formed adjacent to memory cell array 1702. Moreover, column controller 1706 can be electrically coupled with bit lines of memory cell array 1702. Column controller 1706 can control respective bitlines, applying suitable program, erase or read voltages to selected bitlines.

In addition, operating and control environment 1700 can comprise a row controller 1704. Row controller 1704 can be formed adjacent to column controller 1706, and electrically connected with word lines of memory cell array 1702. Row controller 1704 can select particular rows of memory cells with a suitable selection voltage. Moreover, row controller 1704 can facilitate program, erase or read operations by applying suitable voltages at selected word lines.

A clock source(s) 1708 can provide respective clock pulses to facilitate timing for read, write, and program operations of row control 1704 and column control 1706. Clock source(s) 1708 can further facilitate selection of word lines or bit lines in response to external or internal commands received by operating and control environment 1700. An input/output buffer 1712 can be connected to an external host apparatus, such as a computer or other processing device (not depicted, but see e.g., computer 1702 of FIG. 17, infra) by way of an I/O buffer or other I/O communication interface. Input/output buffer 1712 can be configured to receive write data, receive an erase instruction, output readout data, and receive address data and command data, as well as address data for respective instructions. Address data can be transferred to row controller 1704 and column controller 1706 by an address register 1710. In addition, input data is transmitted to memory cell array 1702 via signal input lines, and output data is received from memory cell array 1702 via signal output lines. Input data can be received from the host apparatus, and output data can be delivered to the host apparatus via the I/O buffer.

Commands received from the host apparatus can be provided to a command interface 1714. Command interface 1714 can be configured to receive external control signals from the host apparatus, and determine whether data input to the input/output buffer 1712 is write data, a command, or an address. Input commands can be transferred to a state machine 1716.

State machine 1716 can be configured to manage programming and reprogramming of memory cell array 1702. State machine 1716 receives commands from the host apparatus via input/output interface 1712 and command interface 1714, and manages read, write, erase, data input, data output, and like functionality associated with memory cell array 1702. In some aspects, state machine 1716 can send and receive acknowledgments and negative acknowledgments regarding successful receipt or execution of various commands.

To implement read, write, erase, input, output, etc., functionality, state machine 1716 can control clock source(s) 1708. Control of clock source(s) 1708 can cause output pulses configured to facilitate row controller 1704 and column controller 1706 implementing the particular functionality. Output pulses can be transferred to selected bit lines by column controller 1706, for instance, or word lines by row controller 1704, for instance.

In connection with FIG. 18, the systems and processes described below can be embodied within hardware, such as a single integrated circuit (IC) chip, multiple ICs, an application specific integrated circuit (ASIC), or the like. Further, the order in which some or all of the process blocks appear in each process should not be deemed limiting. Rather, it should be understood that some of the process blocks can be executed in a variety of orders, not all of which may be explicitly illustrated herein.

Figure 18:
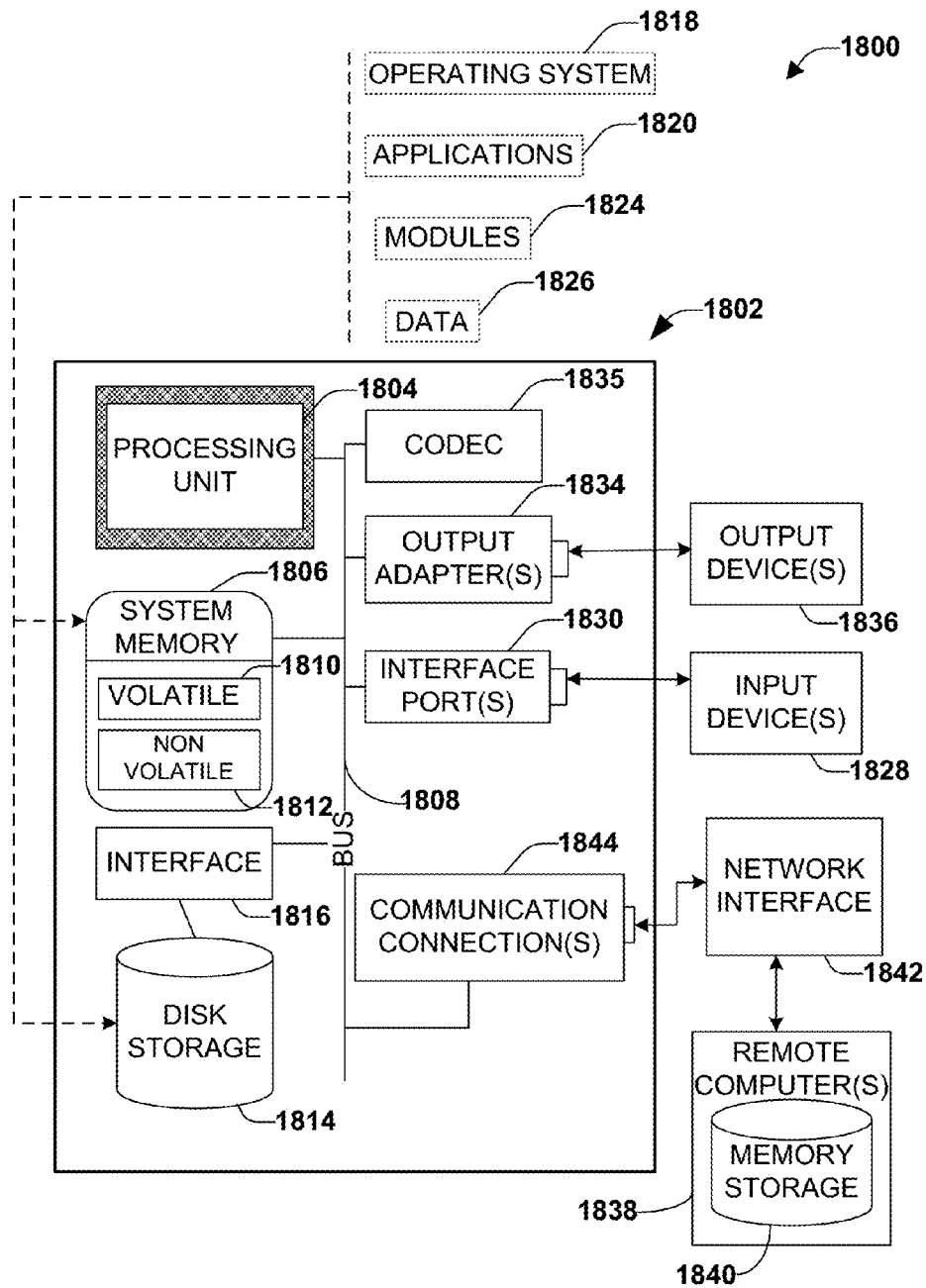
FIG. 18 illustrates a block diagram of an example computing environment that can be implemented in conjunction with various embodiments.

With reference to FIG. 18, a suitable environment 1800 for implementing various aspects of the claimed subject matter includes a computer 1802. The computer 1802 includes a processing unit 1804, a system memory 1806, a codec 1835, and a system bus 1808. The system bus 1808 couples system components including, but not limited to, the system memory 1806 to the processing unit 1804. The processing unit 1804 can be any of various available processors. Dual microprocessors and other multiprocessor architectures also can be employed as the processing unit 1804.

The system bus 1808 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

The system memory 1806 includes volatile memory 1810 and non-volatile memory 1812, which can employ one or more of the disclosed memory architectures, in various embodiments. The basic input/output system (BIOS), containing the basic routines to transfer information between elements within the computer 1802, such as during start-up, is stored in non-volatile memory 1812. In addition, according to present innovations, codec 1835 may include at least one of an encoder or decoder, wherein the at least one of an encoder or decoder may consist of hardware, software, or a combination of hardware and software. Although, codec 1835 is depicted as a separate component, codec 1835 may be contained within non-volatile memory 1812. By way of illustration, and not limitation, non-volatile memory 1812 can include read only memory (ROM), programmable ROM (PROM), electrically programmable ROM (EPROM), electrically erasable programmable ROM (EEPROM), or Flash memory. Non-volatile memory 1812 can employ one or more of the disclosed memory architectures, in at least some disclosed embodiments. Moreover, non-volatile memory 1812 can be computer memory (e.g., physically integrated with computer 1802 or a mainboard thereof), or removable memory. Examples of suitable removable memory with which disclosed embodiments can be implemented can include a secure digital (SD) card, a compact Flash (CF) card, a universal serial bust (USB) memory stick, smart card, SIM, or the like. Volatile memory 1810 includes cache memory, or random access memory (RAM), which acts as external cache memory, and can also employ one or more disclosed memory architectures in various embodiments. According to present aspects, the volatile memory may store the write operation retry logic (not shown in FIG. 18) and the like. By way of illustration and not limitation, RAM is available in many forms such as static RAM (SRAM), dynamic RAM (DRAM), synchronous DRAM (SDRAM), double data rate SDRAM (DDR SDRAM), and enhanced SDRAM (ESDRAM), and so forth.

Computer 1802 may also include removable/non-removable, volatile/non-volatile computer storage medium. FIG. 18 illustrates, for example, disk storage 1814. Disk storage 1814 includes, but is not limited to, devices like a magnetic disk drive, solid state disk (SSD) floppy disk drive, tape drive, Jaz drive, Zip drive, LS-100 drive, flash memory card, or memory stick. In addition, disk storage 1814 can include storage medium separately or in combination with other storage medium including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1814 to the system bus 1808, a removable or non-removable interface is typically used, such as interface 1816. It is appreciated that storage devices 1814 can store information related to a user. Such information might be stored at or provided to a server or to an application running on a user device. In one embodiment, the user can be notified (e.g., by way of output device(s) 1836) of the types of information that are stored to disk storage 1814 and/or transmitted to the server or application. The user can be provided the opportunity to opt-in or opt-out of having such information collected and/or shared with the server or application (e.g., by way of input from input device(s) 1828).

It is to be appreciated that FIG. 18 describes software that acts as an intermediary between users and the basic computer resources described in the suitable operating environment 1800. Such software includes an operating system 1818. Operating system 1818, which can be stored on disk storage 1814, acts to control and allocate resources of the computer system 1802. Applications 1820 take advantage of the management of resources by operating system 1818 through program modules 1824, and program data 1826, such as the boot/shutdown transaction table and the like, stored either in system memory 1806 or on disk storage 1814. It is to be appreciated that the claimed subject matter can be implemented with various operating systems or combinations of operating systems.

A user enters commands or information into the computer 1802 through input device(s) 1828. Input devices 1828 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1804 through the system bus 1808 via interface port(s) 1830. Interface port(s) 1830 include, for example, a serial port, a parallel port, a game port, and a universal serial bus (USB). Output device(s) 1836 use some of the same type of ports as input device(s) 1828. Thus, for example, a USB port may be used to provide input to computer 1802 and to output information from computer 1802 to an output device 1836. Output adapter 1834 is provided to illustrate that there are some output devices 1836 like monitors, speakers, and printers, among other output devices 1836, which require special adapters. The output adapters 1834 include, by way of illustration and not limitation, video and sound cards that provide a means of connection between the output device 1836 and the system bus 1808. It should be noted that other devices and/or systems of devices provide both input and output capabilities such as remote computer(s) 1838.

Computer 1802 can operate in a networked environment using logical connections to one or more remote computers, such as remote computer(s) 1838. The remote computer(s) 1838 can be a personal computer, a server, a router, a network PC, a workstation, a microprocessor based appliance, a peer device, a smart phone, a tablet, or other network node, and typically includes many of the elements described relative to computer 1802. For purposes of brevity, only a memory storage device 1840 is illustrated with remote computer(s) 1838. Remote computer(s) 1838 is logically connected to computer 1802 through a network interface 1842 and then connected via communication connection(s) 1844. Network interface 1842 encompasses wire and/or wireless communication networks such as local-area networks (LAN) and wide-area networks (WAN) and cellular networks. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 1844 refers to the hardware/software employed to connect the network interface 1842 to the bus 1808. While communication connection 1844 is shown for illustrative clarity inside computer 1802, it can also be external to computer 1802. The hardware/software necessary for connection to the network interface 1842 includes, for exemplary purposes only, internal and external technologies such as, modems including regular telephone grade modems, cable modems and DSL modems, ISDN adapters, and wired and wireless Ethernet cards, hubs, and routers.

The illustrated aspects of the disclosure may also be practiced in distributed computing environments where certain tasks are performed by remote processing devices that are linked through a communications network. In a distributed computing environment, program modules or stored information, instructions, or the like can be located in local or remote memory storage devices.

Moreover, it is to be appreciated that various components described herein can include electrical circuit(s) that can include components and circuitry elements of suitable value in order to implement the embodiments of the subject disclosure. Furthermore, it can be appreciated that many of the various components can be implemented on one or more IC chips. For example, in one embodiment, a set of components can be implemented in a single IC chip. In other embodiments, one or more of respective components are fabricated or implemented on separate IC chips.

As utilized herein, terms "component," "system," "architecture" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, replicating, mimicking, determining, or transmitting, and the like, refer to the action and processes of processing systems, and/or similar consumer or industrial electronic devices or machines, that manipulate or transform data or signals represented as physical (electrical or electronic) quantities within the circuits, registers or memories of the electronic device(s), into other data or signals similarly represented as physical quantities within the machine or computer system memories or registers or other such information storage, transmission and/or display devices.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:

1. A semiconductor device, comprising:
a first insulating layer formed above a complementary metal oxide semiconductor (CMOS) substrate that comprises a plurality of CMOS devices;
a bottom electrode disposed above the first insulating layer, wherein the bottom electrode comprises a top surface and a bottom surface that are substantially orthogonal to a normal direction of the CMOS substrate, wherein the bottom electrode comprises a third surface coupled to the first surface and the second surface, and wherein the third surface is oblique relative to the normal direction of the CMOS substrate;
a second insulating layer disposed at least in part over the bottom electrode having a via formed therein, wherein at least the third surface of the bottom electrode is exposed by the via;
a switching memory structure disposed within the via and on top of the third surface; and
a top electrode disposed within the via and on top of the switching memory structure, wherein an electrode material of the top electrode is configured to be ionized and form ions in response to an applied bias across the bottom electrode and the top electrode;
wherein the switching memory structure comprises a switching material, wherein the switching material is permeable to the ions of the top electrode, and wherein the switching material facilitates formation of a conductive path from the ions of the top electrode from the top electrode towards the bottom electrode along a direction that is oblique to the normal direction of the CMOS substrate;
wherein the top electrode, the switching memory structure and the bottom electrode form a memory device;
wherein the bottom electrode layer forms a bitline of the memory device; and
wherein the top electrode layer forms a wordline of the memory device.

2. The semiconductor device of claim 1, wherein the switching material is selected from a group consisting of: an amorphous insulating film, an amorphous silicon, an undoped silicon material.

3. The semiconductor device of claim 1, wherein the switching material is selected from a group consisting of: SiOx, and a silicon nitride.

4. The semiconductor device of claim 1, wherein the electrode material is selected from a group consisting of: nickel, aluminum, chromium, tungsten, titanium, titanium-nitride.

5. The semiconductor device of claim 1, wherein the switching memory structure comprises the switching material, a conductive layer and a selection layer.

6. The semiconductor device of claim 5, wherein the selection layer is selected from a group consisting of: TiOx, AlOx, WOx, HfOx, and SiOx.

7. The semiconductor device of claim 1, further comprising:
another bottom electrode disposed above the second insulating layer, wherein the other bottom electrode comprises another top surface and another bottom surface that are substantially orthogonal to the normal direction of the CMOS substrate, wherein the other bottom electrode comprises another third surface coupled to the other first surface and the other second surface, and wherein the other third surface is oblique relative to the normal direction of the CMOS substrate;
a third insulating layer disposed at least in part over the other bottom electrode having another via formed therein, wherein at least the other third surface of the other bottom electrode is exposed by the other via;
wherein the switching memory structure is also disposed within the other via and on top of the other third surface;
wherein the top electrode is also disposed within the other via and on top of the other switching memory structure;
wherein the top electrode, the other switching memory structure and the other bottom electrode form another memory device;
wherein the other bottom electrode layer forms another bitline of the other memory device; and
wherein the top electrode layer forms a wordline of the other memory device.

8. The semiconductor device of claim 1,
wherein the bitline extends in a first direction relative to the CMOS substrate; and
wherein the word line extends in a second direction relative to the CMOS substrate, wherein the first direction and the second direction are approximately orthogonal.

9. The semiconductor device of claim 8, wherein the via comprises a cross-sectional shape relative to the CMOS substrate, wherein the cross-sectional shape is selected from a group consisting of: approximately a rectangle, approximately a parallelogram, and approximately a quadrilateral.

10. The semiconductor device of claim 1,
wherein the bitline extends in a first direction relative to the CMOS substrate; and
wherein the word line extends in a second direction relative to the CMOS substrate, wherein the first direction and the second direction are non-orthogonal; and
wherein the via comprises a cross-sectional shape relative to the CMOS substrate, wherein the cross-sectional shape is selected from a group consisting of: approximately a parallelogram, and approximately a quadrilateral.

11. A method for fabricating a semiconductor device, comprising:
   receiving a complementary metal oxide semiconductor (CMOS) substrate having a plurality of CMOS devices formed therein;
   forming a first insulating layer above the CMOS substrate;
   forming a bottom electrode above the first insulating layer, wherein the bottom electrode comprises a top surface and a bottom surface that are substantially orthogonal to a normal direction of the CMOS substrate;
   forming a second insulating layer above the bottom electrode;
   forming a via within the second insulating layer and within the bottom electrode, wherein a third surface of the bottom electrode is exposed, wherein third surface is coupled to the first surface and the second surface, and wherein the third surface is oblique relative to the normal direction of the CMOS substrate;
   forming a switching memory structure within the via, wherein at least a portion the switching memory structure is in contact with the third surface; and
   forming a top electrode within the via, wherein at least a portion of the top electrode is in contact with the portion of the switching memory structure, wherein an electrode material of the top electrode is configured to be ionized and form ions in response to an applied bias across the bottom electrode and the top electrode;
   wherein the switching memory structure comprises a switching material, wherein the switching material is permeable to the ions of the top electrode, and wherein the switching material facilitates formation of a conductive path from the ions of the top electrode from the top electrode towards the bottom electrode along a direction that is oblique to the normal direction of the CMOS substrate;
   wherein the top electrode, the switching memory structure and the bottom electrode form a memory device;
   wherein the bottom electrode layer forms a bitline of the memory device; and
   wherein the top electrode layer forms a wordline of the memory device.

12. The method of claim 11, wherein the forming the switching memory structure comprises depositing a switching material, wherein the switching material is selected from a group consisting of: an amorphous insulating film, an amorphous silicon, an undoped silicon material.

13. The method of claim 11 wherein the forming the switching memory structure comprises depositing the switching material, wherein the switching material is selected from a group consisting of: SiOx, and a silicon nitride.

14. The method of claim 11, wherein forming the top electrode comprises depositing the electrode material, wherein the electrode material is selected from a group consisting of: nickel, aluminum, chromium, tungsten, titanium, titanium-nitride.

15. The method of claim 11, wherein forming the switching memory structure comprises:
   forming a selection layer within the via, wherein at least a portion of the selection layer is in contact with the third surface; and
   forming the switching material within the via, wherein at least a portion of the switching material is in contact with the portion of the selection layer.

16. The method of claim 15, wherein the forming the selection layer comprises forming a selection material, wherein the selection material is selected from a group consisting of: TiOx, AlOx, WOx, HfOx, and SiOx.

17. The method of claim 11, further comprising:
   forming another bottom electrode above the second insulating layer, wherein the other bottom electrode comprises another top surface and another bottom surface that are substantially orthogonal to the normal direction of the CMOS substrate;
   forming a third insulating layer above other bottom electrode;
   wherein forming the via further comprises forming the via within the third insulating layer and within the other bottom electrode, wherein another third surface of the other bottom electrode is exposed, wherein other third surface is coupled to the other first surface and the other second surface, and wherein the other third surface is oblique relative to the normal direction of the CMOS substrate;
   wherein at least another portion the switching memory structure is in contact with the other third surface; and
   wherein at least another portion of the top electrode is in contact with the other portion of the switching memory structure, wherein the electrode material of the top electrode is configured to be ionized and form ions in response to an applied bias across the other bottom electrode and the top electrode;
   wherein the other switching memory structure comprises the switching material, wherein the switching material is permeable to the ions of the top electrode, and wherein the switching material facilitates formation of another conductive path from the ions of the top electrode from the top electrode towards the other bottom electrode along a direction that is oblique to the normal direction of the CMOS substrate;
   wherein the top electrode, the switching memory structure and the other bottom electrode form another memory device;
   wherein the other bottom electrode layer forms a bitline of the other memory device; and
   wherein the top electrode layer forms a wordline of the other memory device.

18. The method of claim 11,
   wherein the forming the bottom electrode above the first insulating layer comprises forming the bitline in a first direction relative to the CMOS substrate; and
   wherein the forming the top electrode comprises forming the word line in a second direction relative to the CMOS substrate, wherein the first direction and the second direction are approximately orthogonal.

19. The method of claim 18, wherein the forming the via within the second insulating layer comprises forming the via with a cross-sectional shape relative to the CMOS substrate, wherein the cross-sectional shape is selected from a group consisting of: approximately a rectangle, approximately a parallelogram, and approximately a quadrilateral.

20. The method of claim 11,
   wherein the forming the bottom electrode above the first insulating layer comprises forming the bitline in a first direction relative to the CMOS substrate; and
   wherein the forming the top electrode comprises forming the word line in a second direction relative to the CMOS substrate, wherein the first direction and the second direction are non-orthogonal; and wherein the forming the via comprises forming the via with a cross-sectional shape relative to the CMOS substrate, wherein the cross-sectional shape is selected from a group consisting of: approximately a parallelogram, and approximately a quadrilateral.

\* \* \* \* \*